United States Patent [19]
Jeffries et al.

[11] Patent Number: 5,313,585
[45] Date of Patent: May 17, 1994

[54] DISK DRIVE ARRAY WITH REQUEST FRAGMENTATION

[76] Inventors: Kenneth L. Jeffries, 15807 Booth Cir., Leander, Tex. 78641; Craig S. Jones, 12015 Scribe Dr., Austin, Tex. 78759

[21] Appl. No.: 810,790

[22] Filed: Dec. 17, 1991

[51] Int. Cl.⁵ .............................................. G06F 13/00
[52] U.S. Cl. ..................................... 395/275; 395/425
[58] Field of Search .................. 364/DIG. 1, DIG. 2; 395/275, 425, 650

[56] References Cited
U.S. PATENT DOCUMENTS
5,202,988  4/1993  Spix et al. ............................ 395/650

Primary Examiner—Robert L. Richardson
Attorney, Agent, or Firm—James W. Hoffman; Jeffrey C. Hood

[57] ABSTRACT

A disk controller which fragments host requests into atomic requests or one cycle operations prior to execution. The disk controller is coupled to a disk array and receives requests from a host CPU. Host requests are fragmented down to atomic operations. This is highly advantageous for error handling because the controller is not required to determine which phase of an operation is being requested, since every operation is single phase. The present invention includes use of fence markers or execution-control markers to "fence" of mark a block of tasks and ensure that the atomic operations are executed in sequence, if necessary. These markers ensure that related sequences of atomic operations are kept together without, for example, possibly disruptive intervening writes.

23 Claims, 11 Drawing Sheets

DISK DRIVE ARRAY WITH REQUEST FRAGMENTATION

TABLE OF CONTENTS

Background and Summary of the Inventions
  Mass Storage
    Disk Drives (3)
    Risk of Failure (4)
    Disk Arrays ("RAID") (4)
    Queuing Access Requests (5)
  Innovative Disk Array System
    Dynamic Sector Remapping
    Fork/Join/Remain for Request Synchronization
    Dual-Queue/Semaphore Global Resource Protection
    Dual Defect Lists
    Dynamic RMW Read Minimization
    Request Decomposition to Allow Error Handling Fragmentation to Atomic Operations (9)
    Delay Strategy for Improved Responsiveness of Background Restores:
    Emulation of a Software Interface (INT13) in Hardware
    Self-Assignment of Handles
    Scatter/Scatter Read/Write Requests
    Firmware Patching
    Read-Ahead to Accommodate Multi-Thread Host Processor
    Periodic Activation of Physical Drives
    Majority Voting to Select Among Valid Records
    Physical Mode
      Synchronization of Physical Mode (PM) Commands with Logical (CDD) Commands (17)
      Rudimentary PM Command Set (19)
      Primitive PM Command Set (19)
      Interface Co-Residence (20)
Brief Description of the Drawings
    FIG. 1; FIG. 2; FIGS. 3-4; FIG. 5; FIG. 6; FIGS. 7-9; FIGS. 10-11; FIGS. 12-13
Description of the Preferred Embodiments
  Generic Embodiment
    FIG. 1; FIG. 3; FIG. 4
    Overview of Controller Operation
      FIG. 2
    Data Striping
      Small Writes (25)
      FIG. 5
    Data Guarding
    Mirroring
    Rebuilding
      FIG. 6
    Dual Defect Lists
    Periodic Activation of Drives
    Drive Data Restoration
    Bad Block Remapping
      Non-redundant Remapping Options (35)
  Second Embodiment
    FIG. 3; FIG. 4
    Local Processor (36)
    EISA Interface (BMIC Chip) (36)
    AHA Emulation (37)
    IDE Interface (37)
      FIG. 3
    Bibliography (38)
    Features (38)
    Cables (39)
  Modes of Operation
    EISA Configuration Utility
  Firmware
    Firmware Overview
      FIG. 7; FIG. 8; FIG. 9
    Specific Data Structures
      FIGS. 10 and 11; FIGS. 10-11
      Additional Data Structures (54)
    Resource Limitations
      FIG. 10; FIG. 11
    Performance-Enhancement Optimizations
      FIGS. 3-4; Multiple I/O Threads; Disk Cache; Readahead; Scheduling; Posted Writes; Read and Write Combining; Read Promotion; Seek Swallowing
    Firmware Patching
  DDA Fragmentation Mechanism
    Defect Management, Request Fragmentation, and Queue Management
      FIG. 2
    Description of Terms
      Request Type (66)
        ORIGINAL; FRAGMENT; FRAG-ORIG; COMBINATION; COMB-ORIG; FRAG-COMB
      Command Type (67)
        READ; WRITE; WRITEVERF; VERIFY; VERIFY-NR; RESET; RAWRESET; SETMULT; SETPARMS; SETBUFF; MAPTHIS; RMW-READ; RMW-WRITE; MAP-READ; MAP-WRITE; READ-ALL; READ-SAME; WRITE-SAME; WRITE-RMAP; WRITE-DFL; WRITE-STAT
    Fundamental Operations
      Error Isolation (71)
      Sector Remapping (73)
        Dynamic Sector Remapping; Manual Sector Remapping; Runtime Remapping
      Write Physical Defects (83)
      Read/Write Combining (86)
      Guarded Write Processing (88)
      Write+Verify Operation (95)
      Host Reset Processing (96)
      Drive Status Update (97)
      Scatter/Scatter (107)
        FIG. 12; FIG. 13; FIG. 8
      Guarded Optimization (109)
        FIG. 6
  Hardware Architecture
    80960KA Side Global Memory I/O Map
      ROM map (112)
      Static RAM map (112)
      Dynamic RAM Map (113)
      Dual Port RAM Map (113)
    AHA-1542 Mode:
    IDE Drive Map
      BMIC Map: (116)
      8254 Map: (116)
      local I/O Ports (117)
      INTF-CNTL Interface Control Register: (117)
        ROM; INTL; AHA ; DMA17; NDRESET
      INTF-STAT-Interface Status Register: (118)
        Reg Addr: DF; CDF; DHGT-PRES
      INT-STAT-Interrupt Status Register: (118)
        TEOP_; DEOP_; DGHT_INT; ; H5INT; H4INT; H3INT; H2INT; H1INT IDE-RESET—IDE Reset Control Register: (119)
  CLRINT1; SETMINT; CCDF; SDF; NO_REG; DRQA; DRQen; RE2; RE1; RE0
EISA Side I/O Map: (120)
Interrupts
  AHA Mode: AHA-1540 Register Set Emulation (121)
  Status Register (121)
    STST; DIAGF; INIT; IDLE; CDF; DF; INVDCMD
  Control Register (122)
    HRST; SRST; IRST; SCRST
  Interrupt Flags Register (123)
    Any; SCRD; HACC; MBOA; MBIF
Software Interface
Native Mode:
BMIC interface:
Physical Mode
  FIG. 4
  Synchronization of Physical Mode (PM) Commands with Logical (CDD) Commands (127)
  Rudimentary PM Command Set (129)
  Primitive PM Command Set (129)
Physical Commands
  Physical Command Bytes (133)
  Physical Status Bytes (134)
  Physical Error Bytes (135)
Logical Commands:
Starting Sector Specification
Host Address Specification
Logical Command Handles
  Miscellaneous Logical Commands (139)
  Logical Command Byte (140)
  Logical Status Byte (141)
  Logical Identify Command (141)
Extended Commands
    NTV-GETVERSION
  Native SetParm Command (152)
  Supported SCSI Commands (153)
Error Logging
Configuration Options
  Adaptec 1540 Emulation Mode (mode AHA) (155)
  Native mode: (156)
  Option ROM address (156)
  Other options: (157)
    Posted-writes; Cache; DMA burst size; Maximum read-ahead size
Further Modifications and Variations
Claims PARTIAL WAIVER OF COPYRIGHT pursuant to 1077 O.G. 22 Mar. 20, 1987

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the U.S. Patent and Trademark Office patent file or records, but otherwise reserves all copyright and maskwork rights whatsoever.

CROSS-REFERENCE TO OTHER APPLICATIONS

The following applications of common assignee contain at least some drawings in common with the present application, and are believed to have effective filing dates identical with that of the present application, and are all hereby incorporated by reference:

Ser. No. 07/809,452, filed Dec. 17, 1991, entitled "Disk Controller with Dynamic Sector Remapping";

Ser. No. 07/808,330, filed Dec. 17, 1991, entitled "Disk Drive Array with Dual Defect Lists";

Ser. No. 07/810,278, filed Dec. 17, 1991, entitled "Disk Drive Array with Dynamic Read Minimization";

Ser. No. 07/808,841, filed Dec. 17, 1991, entitled "Disk Drive Array with Efficient Background Rebuilding";

Ser. No. 07/808,716, filed Dec. 17, 1991, entitled "Disk Controller with Scatter/Scatter Transfer Operations";

Ser. No. 07/808,801, filed Dec. 17, 1991, entitled "Disk Drive Array with Physical Mode";

Ser. No. 07/810,277, filed Dec. 17, 1991, entitled "Disk Controller with Improved Read-Ahead Strategy"; and Ser. No. 07/810,276, filed Dec. 17, 1991, entitled "Disk Drive Array with Periodic Activation of Physical Drives";

all of which are hereby incorporated by reference. In particular, application Ser. No. 809,452 includes a very large appendix of source code, which provides even further detail on the contemplated best mode, and this appendix is expressly incorporated herein by reference.

BACKGROUND AND SUMMARY OF THE INVENTIONS

The present invention relates to electronic devices, and, more particularly, to disk drive memories for computers.

Mass Storage

In defining computer architectures, one of the basic trade-offs is memory speed versus cost: faster memory technologies cost more. Thus computer architectures usually include at least two levels of memory: a slow but large secondary memory, and a faster but smaller primary memory. The primary memory usually consists of volatile semiconductor random access memory (typically dynamic RAM or DRAM), and the secondary memory is usually nonvolatile (usually magnetic disk drives, hard and floppy, sometimes combined with optical disk drives, magnetic tape, etc.) Semiconductor RAM has access times on the order of 10-200 nanoseconds, with more expensive static RAM chips (SRAMs) faster than cheaper dynamic RAM chips (DRAMs); in contrast, magnetic hard disk drives (like other secondary memories) have much longer access times, due to the need for mechanical movement (the read/write head radial movement and the platter spin relative to the read/write head).

Disk Drives

In a typical small hard disk drive, with a platter spinning at 3600 rpm, the latency time for a particular spot on the spinning platter to reach the read/write head after the head is positioned over the track containing the spot will vary between 0 and 16.7 milliseconds; and the seek time for the head to move to the correct track may vary from 1 to 30 milliseconds for small disk drives. Consequently, accessing a particular byte stored in a hard disk drive will take on the order of 20 milliseconds which is roughly five to six orders of magnitude greater than access time for semiconductor RAM. However, contiguous bytes in a track may be accessed in much less average time, because the head need not move (spin latency is 0); thus a disk drive may obtain read/write rates in the order of 10 million bits per second (e.g., 1 MBps) for contiguous bytes. Hence, for efficiency the central processor in a computer does not directly access secondary memory; but rather information in chunks is transferred between secondary and primary memory, and the central processor only deals with primary memory. In fact, in a virtual memory system pages of information are transferred between primary and secondary memory as the need arises to keep all physical addresses accessed in primary memory. This requires high speed transfer of large chunks of information between RAM and hard disk drives.

Risk of Failure

Hard disk drives (and all other mechanically involved secondary memory) have a problem of failure: both local platter defects and complete mechanical breakdown of the drive. Even with a mean time between failures of 100,000 or more hours for a disk drive, the failure rate and consequent loss of information may be too high for many computer users. Hence, various disk systems have been proposed to prevent loss of information upon disk drive failure.

Disk Arrays ("RAID")

In the 1980s a new technology was proposed to provide large disk capacity with very high reliability. This technology was originally referred to as a "redundant array of inexpensive disk drives," or "RAID". (The reference to "inexpensive" drives relates to the large high-data-rate drives commonly used in mainframe computers. These drives are much more expensive per byte than the small self-enclosed drives used in personal computers.) This technology is now also referred to generally as "disk drive array" technology.

This approach employs multiple physically separate disk drives, all accessed through a single array controller which makes the separate drives appear as a single composite drive. Typically the separate disk drives will be connected through a synchronization cable, so that the spinning platters of all drives are locked into the same rotational phase relative to each other. In different configurations, this approach can be used to achieve higher reliability, faster maximum data rate, and/or shorter maximum access time.

To achieve higher reliability, the information is stored so that each disk drive holds a check or parity byte for the corresponding bytes in the other disk drives. Thus if one disk drive fails, its information can be reconstructed from the information and parity on the other disk drives.

Information can also be stored in a stripe across the disk drives of a RAID system; this allows parallel read/writes by the disk drives and thereby increases information transfer speed. NCR's booklet "What are Disk Arrays?" (NCR 1990) illustrates various RAID type configurations.[1]

[1] A further option is to store information redundantly in disk sectors at different angular positions; thus, for example, if a sector is repeated at four different positions on four different disks, the maximum rotational latency can be cut to 90 degrees equivalent instead of 360 degrees equivalent.

Queuing Access Requests

It may happen that a CPU central processing unit generates so many disk drive access requests within a small time interval that the requests cannot all be serviced immediately. (This is particularly likely when the CPU is operating in a multiprogramming environment.) In this case the disk drive controller (or CPU) queues these access requests and services them sequentially.

Sophisticated controllers for expensive disk drives may reorder the requests in queue (disk scheduling) to improve access efficiency; for example, the shortest-seek-time-first method would first service the request in the queue which involves the smallest distance of head movement, whereas the circular scan with rotational optimization method basically moves the head across the platter from outside track to inside track servicing requests in order of smallest head movement except for cases where radially-further-away sectors serviced first would lessen rotational latency. In these disk-scheduling controllers the request queue may be kept in an elevator queue (the requests are ordered as a function of sector radial distance) with each request identified by its associated handle. However, for inexpensive disk drives with an Integrated Drive Electronics IDE (At attachment design or ATA) or SCSI (small computer systems interface) interface, as would be used in personal computers, the disk drive includes a controller on its circuit board to take care of hardware details such as motor control for head movement but would not include disk scheduling. An IDE disk drive only communicates with the CPU of a personal computer at a logic level rather than at a device level; this limits the CPU from disk scheduling because the IDE interface may include a mapping of the physical disk drive to appear as a different disk drive. For example, the use of 17 sectors per track was common for disk drives installed in IBM PCs in the early 1980s, but some more recent disk drives have used 40 sectors per track or even varying 35 to 49 sectors per track from spindle edge to outside edge; and these higher density disk drives can logically appear to have 17 sectors with multiple read/write heads. Consequently, IDE type disk drives have a problem of inefficient access, and a RAID with IDE disk drives compounds this problem.

Innovative Disk Array System

The present application discloses an innovative disk drive array system, including an innovative controller, which includes a large number of innovations. The following description summarizes some of the notable features of this system, including not only the claimed invention, but also many other features which are innovative or merely distinctive.

Dynamic Sector Remapping

Many disk/controller subsystems reserve storage to remap defective disk sectors. This remapping is statically or semi-statically defined at initial disk formatting. The system of the presently preferred embodiment (frequently referred to herein as the Dell Drive Array, or "DDA") automatically creates its initial remapping information and has the additional ability to dynamically remap "grown" defects.

Fork/Join/Remain for Request Synchronization

The system of the presently preferred embodiment uses a novel twist on a standard multi-processing software technique to implement multi-thread synchronization without the use of software critical regions or atomic read-modify-write cycles and without prior knowledge of the number of threads being created.

Dual-Queue/Semaphore Global Resource Protection

The system of the presently preferred embodiment uses a dual-queue mechanism to eliminate most software critical regions in the cache manager. This allows better system throughput by allowing the controller to perform the bulk of its lengthy data processing requirements using otherwise idle processor time while minimizing interrupt latency.

Dual Defect Lists

The system of the presently preferred embodiment maintains two independent representations of all drive defects. The first defect list is used to maintain the sector remapping structure when reconstructing redundancy information. This list is called the logical defect list and is stored in the remap data structure. The second list, called the physical defect list, is used to preserve known defect information on a physical disk basis. It allows defects to be maintained across logical configurations and is stored in a special reserved area which is always known even without a logical drive configuration.

Dynamic RMW Read Minimization

When reading data from a redundant array, there are always at least two ways to read the same data. This can be used in two ways: to improve performance and to handle errors. For mirrored arrays, large read requests can be accelerated. For guarded arrays, large read-modify-write (RMW) cycles can be accelerated.

The system of the presently preferred embodiment implements RMW acceleration by dynamically choosing read strategies which result in the smallest amount of data being transferred. The system of the presently preferred embodiment also uses redundancy to implement dynamic sector remapping transparent to host software and to provide traditional disk failure recovery.

Request Decomposition to Allow Error Handling

The internal disk request queue provides a mechanism for associating multiple operations with a single disk request. This mechanism is used for two purposes: to attach internal operations unrelated to actual disk I/O, and to decompose complex requests to simple, fully restartable request sequences for error handling purposes.

Fragmentation to Atomic Operations

For queue management, all operation requests are fragmented down to "atomic," i.e. one-cycle, operations. This is highly advantageous for error handling: we never have to figure which phase of an operation we were in, because every operation is single-phase.

In order to ensure that the atomic relations stay in sequence, and that a sequence stays unbroken if it needs to. The system of the presently preferred embodiment uses "fence" markers in the queue, to fence a block of tasks. These markers are used as limits on the permissible queue-management operations, with rules which ensure that related sequences of atomic operations are kept together. Indeed, the small write discussed in connection with FIG. 5 includes both read and write operations, and permitting an intervening write to the data not to be written by the small write may change the parity and render the parity computed and written inaccurate. Thus fence markers can be used to keep out possibly disruptive intervening writes.

Fragmentation is an iterative list-manipulation process, which is repeated until the whole list is atomic.

In order to recover from an error condition, a computer system must be able to ascertain what went wrong. For example, if a single physical disk drive fails, it must be reset. The fragmentation of queue elements into atomic requests permits accurate recovery from error conditions without resorting to nested error handling routines.

Delay Strategy for Improved Responsiveness of Background Restores

The system of the presently preferred embodiment also implements a special strategy, for performing background data reconstruction, which attempts to minimize disk thrashing and maximize data bandwidth to the user while insuring completion of the reconstruction process.

To obtain high performance in a robust system, it is highly desirable to be able to perform rebuild operations in background. When soft error detection and correction is performed transparently to the user, the effective reliability of the system is increased.

However, a problem in achieving this is that there is likely to be a large seek time in moving the heads over to the rebuild data area (from the area accessed by the system). Thus, if the system begins a rebuild operation, a likely delay is superimposed on the delay time for the next access request from the host. If this conflict is badly managed, the disk's performance can be badly degraded by the large fraction of its time spent unavailable in transit. To avoid this, a disk system should avoid thrashing in and out of rebuild.

The system of the presently preferred embodiment provides two tunable parameters:

1) Amount of idle time before we initiate a rebuild;
2) maximum number of requests which may be processed before a rebuild operation is forced to occur.

A significant advantage of this innovative teaching is that the rebuild is guaranteed to complete within some determined time.

Note that this innovative teaching is not applicable only to drive arrays, but is also applicable (less advantageously) to a simple mirrored disk system.

Emulation of a Software Interface (INT13) in Hardware

In computer systems, it is common to see hardware interfaces simulated in software; however, the system of the presently preferred embodiment also emulates a software interface through its hardware interface. In the presently preferred embodiment, the input to the software interface (BIOS INT 13) is passed intact to the drive array controller, where portions of the BIOS characteristics are emulated by the DDA interface itself. (While this emulation is performed in the controller board's firmware, from the host's perspective it is emulated by the interface.)

Self-Assignment of Handles

Handles are devices that are frequently used across software and hardware interfaces to allow both sides of the interface to refer to common objects. Generally, these handles are created during the process of defining the object. As a result, two operations are usually required in such an interface: (1) creation/definition of the object, and (2) return of the handle to allow later references to the object. The system of the presently preferred embodiment eliminates the second step of this process by requiring the handle to be chosen by the side defining the object. This is an advantage for DDA since it allows the creation of a multi-request interface that imposes no performance penalty on host software (which only uses a single-request interface, but demands maximum performance).

Scatter/Scatter Read/Write Requests

"Scatter" and "gather" refer generally to common techniques in computer architecture: "scatter" is the transfer of a block of information from a contiguous set of locations to a discontiguous set of locations. Gather is the opposite process, i.e. collecting information from a discontiguous set of locations for transfer to a contiguous set of locations.

Scatter and gather operations often arise in connection with a transfer of data across a boundary, e.g. from main memory to a peripheral. DMA controllers have included the capability for gather operations, to transfer a block of data from scattered locations of main memory out over the bus, or vice versa.

It is also suspected, although not known with certainty, that a Conner IDE drive currently in development allows a single I/O request to access discontiguous regions of the disk. It is also suspected, although not known with certainty, that some IBM drives may have included such a scatter capability. It is also not known whether these developments, if in fact they did occur, are prior art to any of the inventions in the present application.

Virtual memory operating systems, such as the UNIX Operating System, commonly result in a significant amount of memory scatter. In addition, the UNIX Operating System typically does not store contiguously on disk.

The system of the presently preferred embodiment provides "scatter/scatter" accesses, in which both the physical locations of data in host memory and the physical locations of data on the disks can be discontiguous. That is, the host can send a single request to launch such a scatter/scatter transfer. Arguments to such a transfer request would include: a pointer to a list of transfer counts and addresses in host memory containing the data to be transferred; the length of that list; and the starting logical address on the disk for transfer.

Note that the host need not know the configuration that the data array will have on the disk.

Skipped blocks in a scatter-scatter request are specified by a data address value of −1. Thus, when a block must be skipped, the controller enqueues a "nop" (no-operation) request. Note that the presently preferred embodiment enqueues these nop requests, if needed, even if the data transferred is in contiguous addresses on the host memory side.

Any disk operation, in the presently preferred embodiment, is limited to a set maximum number of blocks of logical disk address space (currently 256). Thus, no scatter/scatter request can cover more than 254 skipped blocks.

The scatter-handling operations just described are implemented, in the presently preferred embodiment, using the controller's native mode described below.

As noted, virtual memory operating systems commonly result in a significant amount of memory scatter. In addition, the UNIX Operating System typically does not store contiguously on disk. Thus, this innovation is especially useful in UNIX systems.

Firmware Patching

The controller board of the presently preferred embodiment has only 256K of RAM, but has four specialized 128K EPROMs which are hard to change out. In this environment it is not easy to provide firmware flexibility.

In the controller board of the presently preferred embodiment, the firmware is made modular by heavy use of indirect calls. The firmware includes an INIT code section, called at board-reset time, which goes to a defined disk area (the "patch area") to pull up an updated set of address pointers. Changes to these pointers can be used to allow for configuration changes as well as for changes in code functionality.

Read-Ahead to Accommodate Multi-Thread Host Processor

The random-access speed of a disk drive is typically much slower than its serial-access speed, and very much slower than the clock speed of any associated CPU. Therefore, any lookahead strategy which succeeds in prefetching the data for any significant fraction of CPU access requests has the potential to improve performance. Disk drives are typically idle for a high percentage of the time, and this idle time can be used to perform lookahead operations.

However, lookahead reads are not necessarily advantageous: unless a sequential read operation is underway, a lookahead read would simply waste time.

One readahead strategy is simply to read a fixed amount ahead of the last data accessed. (In single disks, this was implemented simply by reading one or more tracks ahead.) This is a "dumb" strategy.

Another readahead strategy is to read ahead an amount dependent on the current read history. (This is an old strategy from mainframe databases.)

The system of the presently preferred embodiment uses a different readahead strategy: the controller keeps track of the last n reads (where n is a programmable parameter). If a new read comes in adjacent to any of the last n, a lookahead read is enqueued (since a sequential read may be in progress). The parameter n is preferably set comparable to or greater than the number of maximum independent activities which may be underway. Thus if any one thread is doing a sequential read the controller will perform readahead; but if all accesses are purely random, the controller will almost never do a lookahead read.

Periodic Activation of Physical Drives

If a disk drive fails in service, the user wants to know about it. However, in a system with composite disk drives, the host system may not detect the failure status unless it happens to request an access which requires access to the failed drive. Even if the monitor software on the host system periodically queries the drive controller (through the normal high-level interface), such a drive failure will not necessarily be detected.

This invention provides an improved way for failure status to be propagated upward.

The DDA controller sends a recount command to the drives every n seconds (where n is a programmable parameter). Thus, physical failure of a drive will be reliably detected by the controller within a certain maximum time period. Thus, if the monitor utility periodically polls the controller every m seconds, failures will almost always be detected within m+n seconds.

Majority Voting to Select Among Valid Records

A very common problem is that a disk may fail, and then come up active at the next power-up. Thus, the controller may see inconsistent data on several drives, each of which claims to be valid.

The system of the presently preferred embodiment adds a time-dependent "whim" number to the configuration data (validation timestamp) in each drive. The drives which have the same generation of data should all have the same whim number. A zombie drive (one which has failed and revived) may report itself good, but it will have a whim number inconsistent with the other drives. Majority voting is used to select among the whim numbers. Thus, even if a zombie drive reports a later timestamp, it will be outvoted by the consensus of the other drives, and can then be excluded (and rebuilt).

Physical Mode

The system of the presently preferred embodiment (the Dell Drive Array, or "DDA") presents to a host operating system disk drive abstractions called Composite Disk Drives. Composite Disk Drives support logical requests that range from "read" and "write" to "scatter read with holes". A Composite Disk Drive (CDD) is physically implemented using (besides the hardware and firmware in the controller) one or more physical disk drives. As an abstraction, the CDD hides many aspects of the physical drives from the host operating system. In particular, the abstraction hides, and hence prevents access to, the actual physical disk drive hardware interface.

For setup, maintenance, and diagnostic purposes, there is a need to get closer to the physical disk drive interface than is allowed through the CDD abstraction. For example, when a physical disk drive (PDD) is "new" and not yet part of a CDD, a means is needed to test the PDD and to write configuration information onto the PDD. Even when a PDD is a part of a CDD, there is a need to test the PDD and perhaps write new configuration information onto the PDD. In addition to these straightforward needs, it turns out that there is a need to access the PDD interface in order to perform drive vendor specific functions. Since these functions are vendor specific and since vendors and these functions change over time, there is strong motivation to accommodate access to these functions without changing DDA firmware.

To meet these needs, DDA has a Physical Mode Programming Interface. This interface is not normally disclosed to DDA owners or users but is used by Dell's DDADIAG program and by the DDA specific portion of the EISA Configuration program.

Synchronization of Physical Mode (PM) Commands with Logical (CDD) Commands

Physical Mode commands may be issued by the host at any time, including periods where the host is also issuing logical CDD commands. PM commands must be able to run without disturbing (other than the obvious requirement to be running only one command per drive at a time) the operation of the CDD. When a PM command is received, PM checks to see if the physical drive specified is part of a CDD. If it is not, the command is run without regard to CDD interference. If the physical disk drive specified is part of a CDD, PM synchronizes the command with the CDD driver by submitting a PHYSICAL logical request to the CDD driver. When the PHYSICAL request reaches the head of the CDD request queue, the CDD driver "executes" it. Execution of the PHYSICAL command consists primarily and simply of calling the request's Return Function, which in this case, happens to be the core PM request driver. In other words, PM gets the CDD driver to run the PM command. Synchronization is obviously ensured.

In addition to the simple single command PM/CDD synchronization above, there is a multi-command synchronization mechanism that is part of and used with the primitive PM command set. When the host wants to run only PM commands on a disk drive for a period of greater than one command or wants to use the other primitive commands, the host will issue the BEGIN_PHYS_MODE_ONLY command. When the host is ready to allow CDD commands to resume, it issues the END_PHYS_MODE_ONLY command.

When PM receives the BEGIN_PHYS_MODE_ONLY command, as with other commands, it checks to see if the physical drive specified is part of a CDD. As with other commands, if the drive specified is not part of a CDD, the command is run directly. It the drive specified is part of a CDD, PM gets the CDD driver to run the command as a PHYSICAL command return function. BPMO increments a phys_mode_only counter associated with the physical drive. It also increments a phys_mode_only counter associated with the CDD. Synchronization is attained by having the CDD driver refuse to run any commands when its phys_mode_only counter is non-zero.

Since the CDD driver will refuse to run any commands when in phys_mode_only mode, a refinement needs to be mentioned here. When PM runs a command, it does so by handing it to the CDD driver only if 1) the specified drive is part of a CDD and 2) the associated CDD is not in phys_mode_only mode.

When PM receives the END_PHYS_MODE_ONLY command, it performs the same CDD checks as with other commands. In normal operation, the associated CDD, if any, will be in phys_mode_only mode and so the EPMO command will be run directly by PM. The EPMO command decrements the phys_mode_only counter associated with the specified physical drive and decrements the phys_mode_only counter associated with the associated CDD, if any. If the EPMO command causes a CDD's phys_mode_only counter to go to zero, the CDD is obviously no longer in phys_mode_only mode. At this point, the CDD driver may have logical CDD commands queued that it has refused to run. To ensure a timely restart of the CDD, PM must issue an innocuous command to the CDD driver but only after it is no longer in phys_mode_only mode. PM does this by issuing a PHYSICAL command to the CDD driver with an innocuous return function. The technical term for this action is "Thump", as in PM "thumps" the CDD driver.

Rudimentary PM Command Set

PM's rudimentary command set consists of a number of AT task file "like" commands that are still abstract like logical CDD commands in that they do not provide for direct access to the physical disk drive interface but are closer to the physical disk drive interface nevertheless. These commands are: READ, READ with no retries, READLONG, READLONG with no retries, IDENTIFY, READBUF, WRITE, WRITE with no retries, WRITELONG, WRITELONG with no retries, FORMAT, WRITEBUF, SETBUF, SEEK, RECAL, VERIFY, VERIFY with no retries, INIT, DIAG, READMULT, WRITEMULT, SETMULT, and RESET.

Primitive PM Command Set

PM's six primitive commands are provided through a rudimentary "EXTENDED" command, although that is an arbitrary implementation detail. The BPMO and EPMO primitive commands have already been discussed. The remaining four primitive commands provide the host almost direct contact with the physical disk drive hardware interface. The ISSUE_CMD command writes host specified values to the physical disk drive's task file registers. The RETURN_STATUS command reads the physical disk drive's task file registers and returns the values to the host. The READ_DATA command reads the indicated amount of data from the disk drive's data register and returns the data to the host. The WRITE_DATA command writes the host provided data to the disk drive's data register.

With these four primitive commands, the host can perform almost all standard task file commands, and can perform any of the vendor unique commands that we are currently aware of. Standard commands that cannot be performed include READLONG and WRITELONG. In addition, access is not provided to the alternate status register, the drive address register or to the device control register and drive interrupts are not reflected to the host. These limitations could be overcome by adding primitive commands and should not be thought of as limiting the scope of this disclosure.

The PM commands are currently used to 1) enable spindle sync on the CONNER 3204F 200Meg drives and 2) to download firmware to the Maxtor LXT series drives.

Interface Co-Residence

When the emulating (AHA) interface is active, the native interface is also active (see FIG. 7). This capability is used to permit the monitor utility (running on the host computer) to use calls to the native mode of the array controller, while routine access requests use the emulated interface.

It should be noted that there are two types of host software used: the device driver does the minimal basic interface; the MONITOR utility is the facility which allows user to see smart info inside array. For example, the disclosed drive array controller may be used with monitor utilities which run on Novell or UNIX (or other) operating systems.

BRIEF DESCRIPTION OF THE DRAWINGS

The present invention will be described with reference to the accompanying drawings, wherein.

DESCRIPTION OF THE PREFERRED EMBODIMENTS

Generic Embodiment

Figure 1:
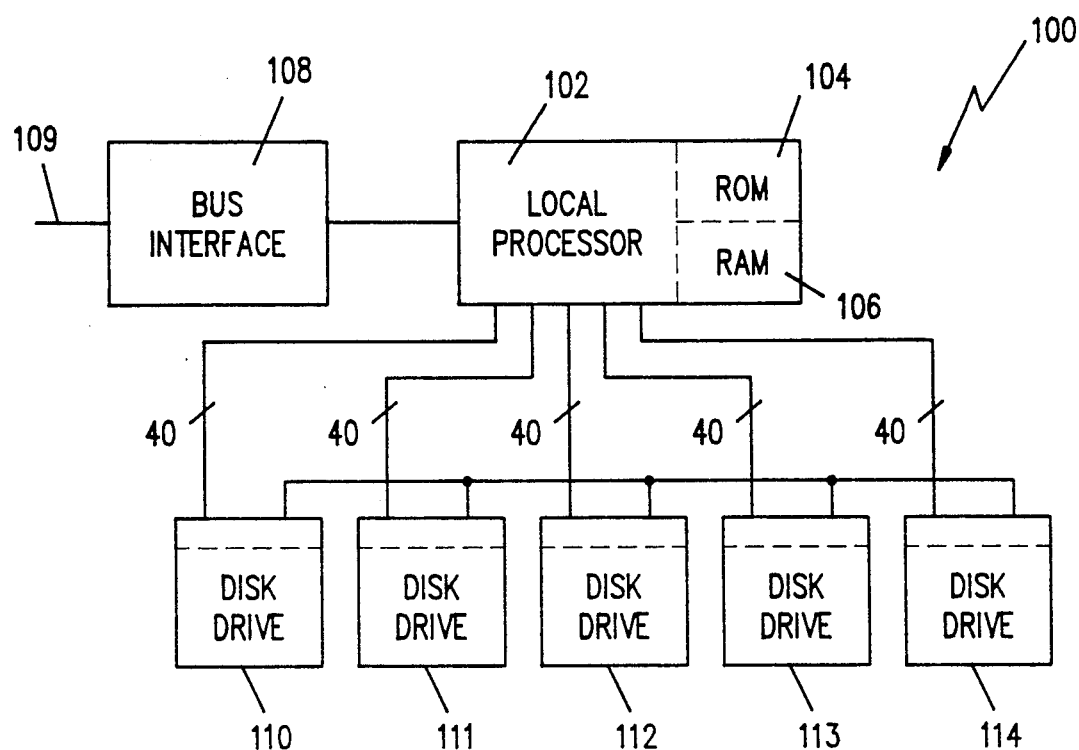
FIG. 1 is a functional/structural block circuit diagram of the first preferred embodiment disk drive array.

FIG. 1 is a functional block circuit diagram of the first preferred embodiment disk drive array controller, generally denoted by reference numeral 100, which includes microcontroller CPU 102 with embedded ROM 104 and RAM 106, bus interface 108, and five connected disk drives 110-114. ROM 104 and RAM 106 may be separate from the CPU, and ROM 104 contains the firmware for controller 100. System bus 109 provides a communication link between controller 100 and a host computer which uses the array of disk drives 110-114 as secondary memory. Controller 100 plus disk drives 110-114 may be physically located within the chassis of the host computer, or the controller and disk drives may have a separately cabinet connected to the system bus. Each of disk drives 110-114 is somewhat intelligent, such as having an IDE (ATA) interface plus an on-board data separator, buffer, and disk controller; and each disk drive may hold 200 MB of formatted data so that the array appears as a single 1,000 MB memory to the host. Communication from controller 100 to each of disk drives 110-114 is a simple 40 line cable with signal assignments mostly analogous to those of an AT I/O channel. With redundant storage across the disk drives, controller 100 plus disk drives 110-114 form a RAID, and the capacity apparent to the host decreases due to the redundancy.

Figure 3:
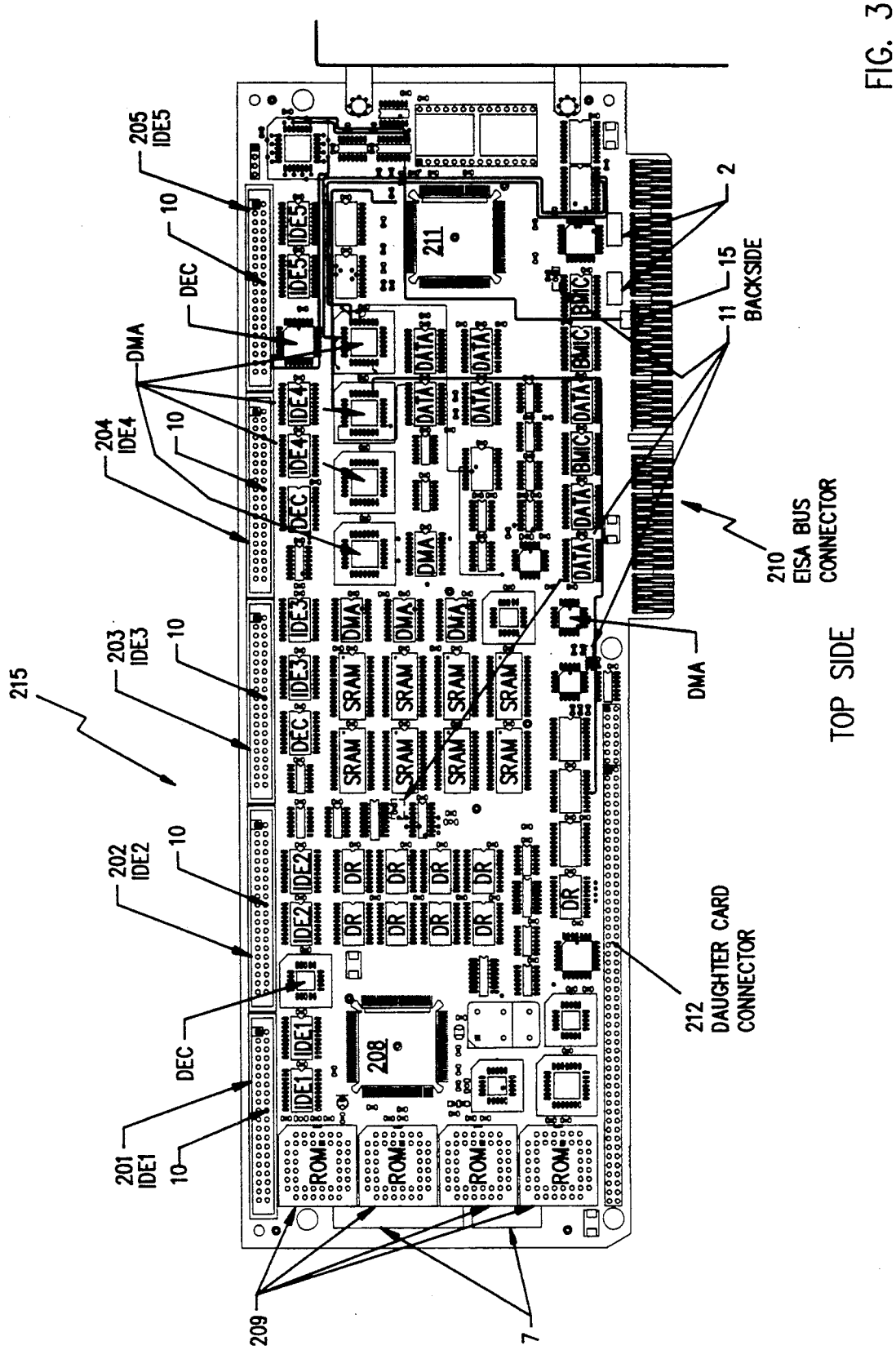
FIGS. 3-4 are layout and schematic diagrams of a second preferred embodiment.
Figure 4:
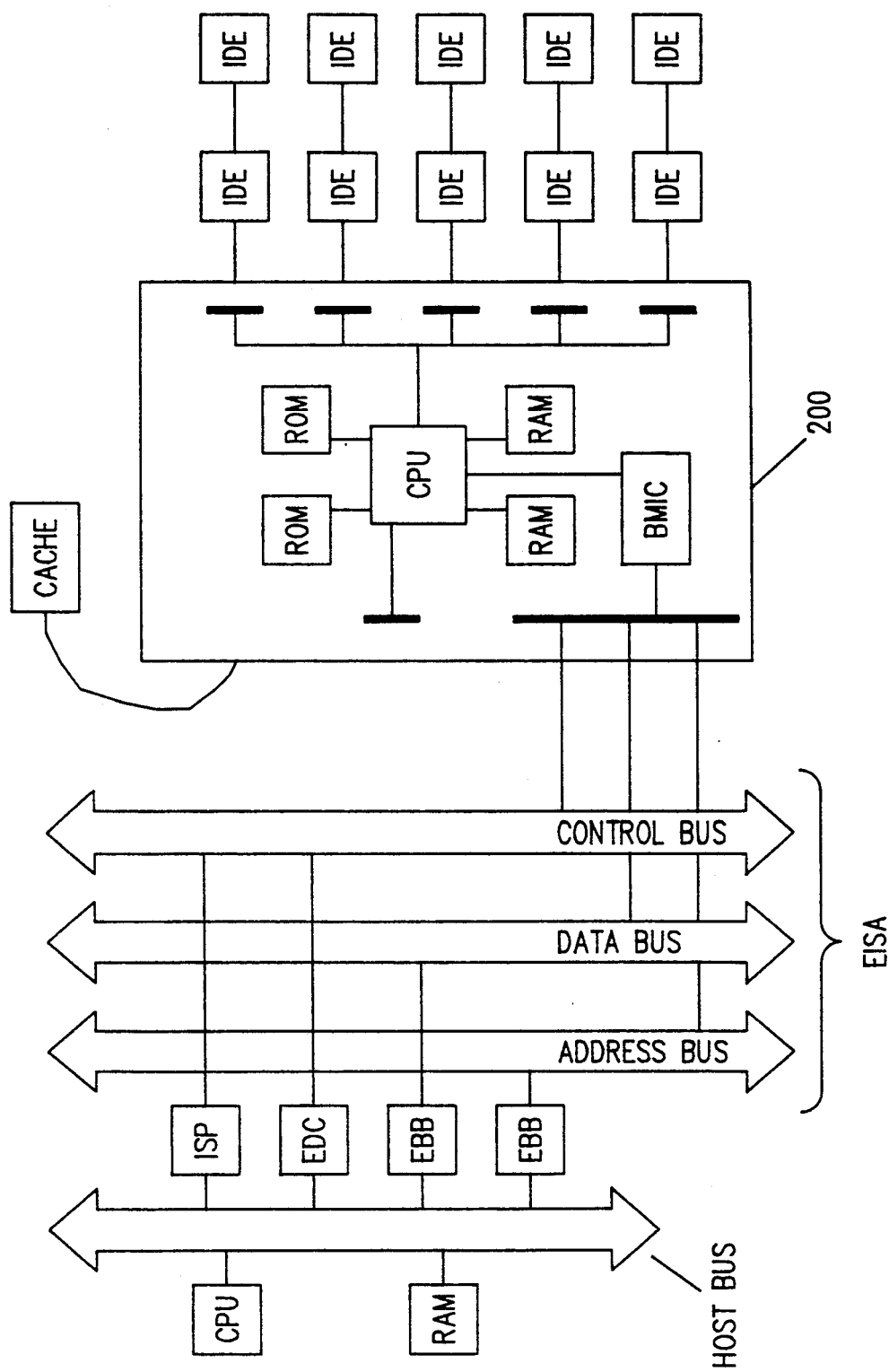

FIG. 3 shows the layout of second preferred embodiment controller 200 for a disk drive array, and FIG. 4 illustrates controller 200 plus an array of disk drives (collectively referred to as DDA) within a computer system. Further details of controller 200 and DDA appear in the following.

Overview of Controller Operation

Figure 2:
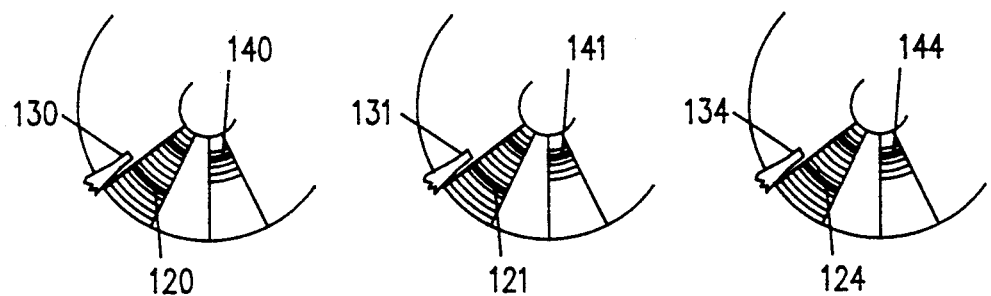
FIG. 2 illustrates disk drive platter synchronization.

Controller 100 operates as follows. First, the disk drives 110-114 have their spinning platters synchronized by communication on cable 116; FIG. 2 schematically illustrates synchronization in that sectors 120-124 on the platters of disk drives 110-114, respectively, will pass their corresponding read/write heads 130-134 simultaneously. Platters typically spin at 3,600 rpm, so one revolution takes about 16.7 milliseconds. Each sector contains 512 bytes (½ KB) of information, and the number of physical sectors forming a single circular track around the platter may be about 40 for each of about 1,000 concentric tracks on the platter. This translates to a read/write rate of about 1 million bytes per second. (Typical disk drives include multiple platters and multiple heads, for increased capacity.)

Disk drives 110-114 each appears as a logical disk drive to controller 100 that simply has a number of cylinders (corresponding track(s) on platter(s) of a single disk drive) with a number of sectors per track, and the disk drive's controller translates the actual physical implementation to such logical appearance. Indeed, if defective sectors were discovered during manufacturer's testing, then these are remapped by the disk drive's on-board controller and not observed by communication through the IDE interface. Contrarily, the host sees the array as a single sequence of sectors numbered serially beginning at sector 0 and continuing through approximately sector 2,000,000 in the 1,000 MB non-redundancy version.

When the host sends a read or write request to the array on bus 109, interface 108 translates the request to controller 100 which generates access requests for each of the individual disk drives 110-114. Controller 100 sends logical commands to a disk drive, and the individual disk drive's controller does the actual generation of pulses to move the read/write head. Data read from or to be written to a platter is held in the disk drive's buffer RAM. The data read or to be written transfers between RAM 106 and buffer RAM in each disk drive; thus the disk drive delay in waiting for the read/write head to seek the correct track and the latency of the appropriate sector to spin around to the read/write head does not affect the data transfer. In fact, the delay averages 20 milliseconds, and multiple further read/write requests could be received by controller 100 during this time interval. Controller 100 maintains a queue of pending requests and may modify the commands to increase efficiency in the disk drive operation as explained in detail below; however, each disk drive 110-114 handles requests serially and completes a request prior to starting the next.

Data Striping

Controller 100 writes data to the disk drives 110-114 with data striping and parity: each 2 KB of data is split into four ½ KB portions which are written to four corresponding sectors on disk drives 110-114 (e.g., four of the five sectors 120-124) and the fifth corresponding sector is written with the exclusive OR (bitwise parity) of the data on the four sectors. Thus if any one of the disk drives 110-114 fails or develops a defect in its one of the sectors 120-124, the data can be reconstructed from the data in the other four sectors by CPU 102; this constitutes the RAID aspect of controller 100 plus disk drives 110-114. The data reconstruction permits continued operation even with a failed disk drive, and once a failed disk drive has been replaced, reconstruction of the data for writing onto the replacement disk drive could be performed in background without any down time. Of course, each sector will have its own CRC (cyclic redundancy code) or ECC (error correction code) bytes to check for errors in the 512 bytes of data in the sector; this error checking is in addition to the redundancy of the parity sector for the stripe of four sectors. Further, contiguous data could be written into stripes using every other sector on a track (2-to-1 interleaving); the time during which an intervening sector passes under the head can be used for loading/unloading the track buffer and for error checking of the data just read from a sector and before the data from the sector following the intervening sector is written or read.

Small Writes

Figure 5:
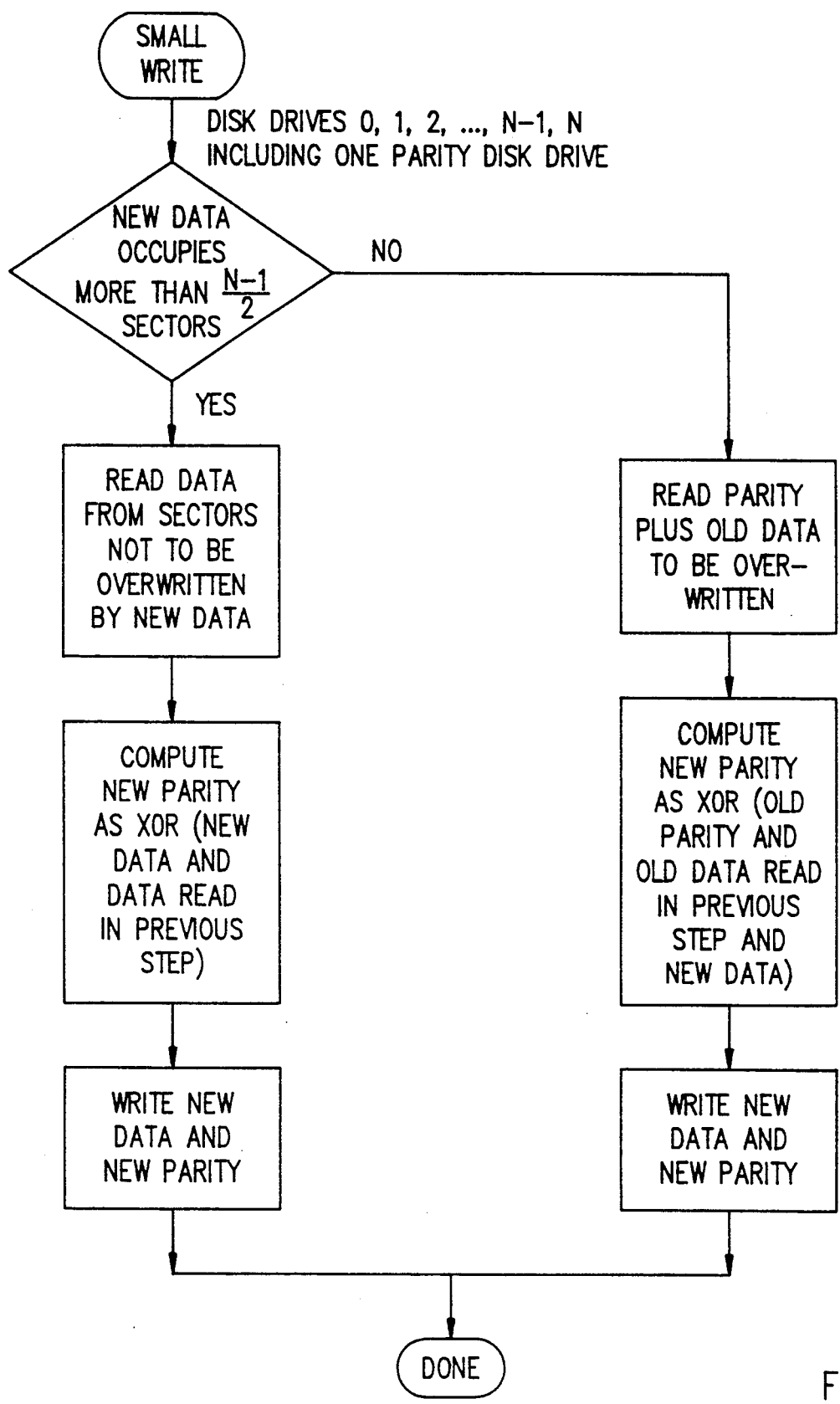
FIG. 5 is a flowchart for a small size write operation.

Controller 100 writes data with size smaller than a complete stripe (2 KB plus redundancy) in accordance with the flowchart in FIG. 5. In particular, a write of data less than 2 KB will not fill up all of the five sectors 120-124, so the parity sector information must be computed from both the new data being written plus the old data in the sectors not being overwritten. For example, if sector 120 is the parity sector and if new data is being written to sectors 121-123, then the old data in sector 124 will be needed in addition to the new data in order to compute the new parity information. Thus before the new parity information can be written to sector 120, controller 100 must perform a read of the data in sector 124 and then compute the exclusive OR of the new data plus the sector 124 data and write the result to sector 120 as the new parity information. See the lefthand portion of FIG. 5. In short, the computation is:

$$\text{New } 120 = \text{New } 121 \oplus \text{New } 122 \oplus \text{New } 123 \oplus \text{Old } 124 \tag{1}$$

Contrarily, if the new data being written will only occupy sector 121, then controller 100 reads the old data in sector 121 prior to the write of the new data and also reads the old parity in sector 120, and then controller 100 computes the new parity by exclusive OR of the old parity, the old data in sector 121, and the new data to go into sector 121. See the righthand portion of FIG. 5; the computation is:

$$\text{New } 120 = \text{Old } 120 \oplus \text{Old } 121 \oplus \text{New } 121 \tag{2}$$

This computation gives the same result as if the analog of equation (1) were used where all of the old data to be preserved were read and used in the exclusive OR; that is, if the computation were:

$$\text{New } 120 = \text{New } 121 \oplus \text{Old } 122 \oplus \text{Old } 123 \oplus \text{Old } 124 \tag{1'}$$

The sameness of the results in equations (2) and (1') follows from the definition of the parity. But the use of equation (2) for the computation of the new parity implies that only two reads of old data are used, rather than the three reads of equation (1'). Also, the reads in equation (2) are on disk drives 110 and 111 which are also the disk drives that will be written; thus disk drives 112-114 are free to be separately read or written (in other tracks) simultaneously. In contrast, equation (1') will have reads of disk drives 112-114 and writes of disk drives 110-111; that is, all five disk drives are active. Equation (2) also has an analog which could be used in place of equation (1) for the case of writing new data to sectors 121-123, namely:

$$\text{New } 120 = \text{Old } 120 \oplus \text{Old } 121 \oplus \text{New } 121 \oplus \ldots \oplus \text{Old } 123 \oplus \text{New } 123 \tag{2'}$$

But the computation of equation (2') requires four reads and involves four of the five disk drives for both a read and a subsequent write; whereas, the computation of equation (1) only has one read but involves all five disk drives. Hence, controller 100 minimizes the number of reads for such small size writes by effectively picking the smaller number of disk drives to read or write.

In general, if an array includes N+1 disk drives with each stripe including 1 block (with a block being an integral number of sectors) of redundancy data on 1 disk drive and N blocks of data of 1 block on each of the other N disk drives, and if a write changes K of these N blocks, then for K greater than (N−1)/2 the write is not small and the N−K nonwritten blocks are read as in (1') but for K less than or equal to (N−1)/2 the number of blocks to be written is small enough to take advantage of using the old parity information and reading the old data as in (2) instead of all of the reads needed as in (1').

Data Guarding

When running as a drive array controller, controller 200 and DDA use sector interleaving or striping to increase the data bandwidth. Sector interleaving is basic to the redundancy algorithm. As each block of data is being written to the data drives in the array, microcode generates the byte by byte XOR across all bytes of the interleaved data sectors. The parity bytes are all combined into one parity sector and written onto the parity drive. The parity byte is generated by:

$$\text{parity}_{fourdrives} = \text{data3} \oplus \text{data2} \oplus \text{data1} \oplus \text{data0}$$

$$\text{parity}_{threedrives} = \text{data2} \oplus \text{data1} \oplus \text{data0}$$

$$\text{parity}_{twodrives} = \text{data1} \oplus \text{data0}$$

The parity sector is written onto the parity drive as soon as possible after the writes to the data drives. The performance overhead is simply the time required to generate the XOR of the data bytes, and the time to send the write data to the parity drive. In the case of a write of a number of sectors which does not divide evenly into the number of data drives, there is an additional overhead to read the other sectors in the same stripe, to perform a read modify write cycle to get the parity byte correct. This is not a major concern as the majority of disk operations are reads.

DDA can continue responding to system requests after a drive fails (providing the failure is not catastrophic enough to cause the entire system to fail, such as shorting power and ground). After DDA has determined that a drive has failed, it combines bytes from the remaining three data drives with the corresponding byte from the parity drive to regenerate the failed drive's data. These are:

$$\text{data0}_{fourdrives} = \text{data3} \oplus \text{data2} \oplus \text{data1} \oplus \text{parity}$$

$$\text{data0}_{threedrives} = \text{data2} \oplus \text{data1} \oplus \text{parity}$$

$$\text{data0}_{twodrives} = \text{data1} \oplus \text{parity}$$

$$\text{data1}_{fourdrives} = \text{data3} \oplus \text{data2} \oplus \text{data0} \oplus \text{parity}$$

$$\text{data1}_{threedrives} = \text{data2} \oplus \text{data0} \oplus \text{parity}$$

$$\text{data1}_{twodrives} = \text{data0} \oplus \text{parity}$$

$$\text{data2}_{fourdrives} = \text{data3} \oplus \text{data1} \oplus \text{data0} \oplus \text{parity}$$

$$\text{data2}_{threedrives} = \text{data1} \oplus \text{data0} \oplus \text{parity}$$

$$\text{data3}_{fourdrives} = \text{data2} \oplus \text{data1} \oplus \text{data0} \oplus \text{parity}$$

This is done by microcode and data accesses suffer a slight performance degradation after a drive has failed.

The reason that only 8 bits of data are required for complete redundancy is that we know which 8 bits are wrong. Most of the bits in a typical ECC design are used to find the location of the erroneous data bits. In this case there is a CRC or ECC field as part of every sector on the disk drive. The drive controller chip checks the CRC or ECC, and reports whenever there is erroneous data. Since each drive controller chip handles a different byte of the data, we can determine which byte is bad.

Data guarding suffers a fairly severe write performance degradation as partial stripe write must do a read modify write cycle to correctly update the parity data, and this will usually result in a lost revolution of the disk.

Mirroring

Mirroring is a data redundancy technique in which two complete sets of the data are kept. DDA supports this in hardware, or more appropriately in firmware. When a drive fails in mirrored mode, the data is simply recovered from the second copy on the second set of drives.

Mirroring has much better performance than data guarding, but it requires a higher overhead in disk drives.

Rebuilding

When the number of defective sectors has grown so large as to exhaust the capacity of one of the disk drives in an array, then that disk drive must be replaced in order to continue complete data guarding. Similarly, if a disk drive fails for some other reason such as mechanical failures including head crashes, then the disk drive must be replaced for continued data guarding. A replacement disk drive must be loaded with the data from the failed disk drive, and controller 100 accomplishes this by use of the redundancy: each sector of data in the failed disk drive can be reconstructed using the corresponding data and parity sectors of the still-viable disk drive. In essence, controller 100 rebuilds the data of the failed disk drive into the replacement disk drive by reconstructing the data bit by bit from the remaining data and parity. Of course, this also applies in the same manner when a parity disk drive fails.

After installation of a replacement disk drive, controller 100 uses its defect physical location table to unmap all of the remapped sectors which were originally remapped due to defective sectors on the replaced disk drive; this should release spare sectors for remapping of future developing defects, especially if the disk drive with the greatest number of defects had been replaced. Of course, replacement of a disk drive requires controller 100 to reconstruct the data lost by use of the redundancy/parity of the other disk drives, and controller 100 must also systematically rebuild the data lost on the new disk drive. Controller 100 maintains two independent representations of all drive defects. The first defect list is used to maintain the sector remapping structure when reconstructing redundancy information. This list is called the logical defect list and is stored in the remap data structure. The second list, called the physical defect list, is used to preserve known defect information on a physical disk basis. It allows defects to be maintained across logical configurations and is stored in a special reserved area which is always known even without a logical drive configuration. Controller 100 uses both the physical defect list and the logical defect (remap) list for this unmapping.

Figure 6:
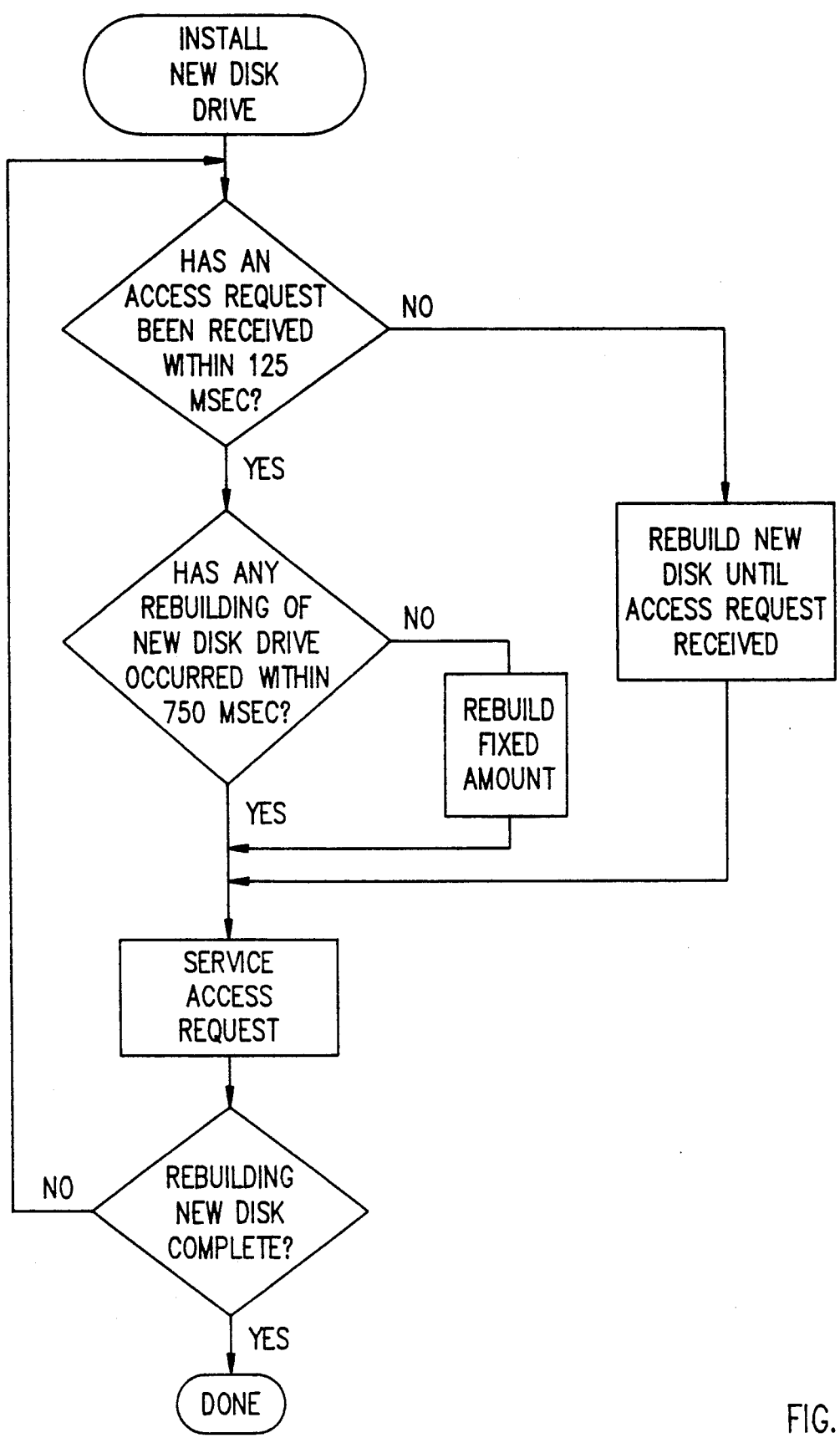
FIG. 6 is a flowchart for rebuilding lost data.

Controller 100 rebuilds the data lost on a replacement disk drive according to the method indicated by the flow chart in FIG. 6; this allows continued access to the disk drives and rebuilding in background unless access density precludes timely rebuilding. As shown by the righthand branch in FIG. 6, controller 100 effectively waits to begin rebuilding until no access to the disk drives has been requested for an interval of 125 milliseconds; controller 100 interprets such a no request interval as the start of a request hiatus. At the end of the 125 millisecond interval controller 100 begins rebuilding until it receives an access request. Of course, controller 100 rebuilds stripes sequentially to use minimal read/write head movement. Note that if rebuilding were to be interleaved with access request servicing, then the repetitious read/write head seeking tracks between the rebuilding regions and the accessed regions result in disk thrashing and decreased throughput; thus the 125 millisecond wait is an indication of a request hiatus. However, as shown in the lefthand branch of FIG. 6, controller 100 guarantees the rebuilding of the data lost onto the new disk within a reasonable time by the provision that if no 125 millisecond hiatus has occurred for 750 milliseconds, then controller 100 inserts a fixed amount of rebuilding (e.g. all sectors on one track) despite pending requests for access.

The parameters of the rebuilding may be adjusted for the type of use anticipated; that is, the 125 millisecond wait may be lengthened or shortened, the 750 millisecond interval may be adjusted, and the fixed amount of inserted rebuilding may be varied.

Dual Defect Lists

Note that, as the foregoing description specifies, TWO independent representations of drive defects are preferably maintained. The first defect list is used to maintain the sector remapping structure when reconstructing redundancy information. This list is called the logical defect list and is stored in the remap data structure. The second list, called the physical defect list is used to preserve known defect information on a physical disk basis. It allows defects to be maintained across logical configurations and is stored in a special reserved area which is always known even without a logical drive configuration.

Periodic Activation of Drives

If a drive fails in service, the user wants to know about it. However, unless the host system happens to request an access which requires access to the failed drive, it may not detect the failure status. Even if the monitor software on the host system periodically queries the drive controller (through the normal high-level interface), such a drive failure will not necessarily be detected.

The DDA has a variable for tracking requests to the drives, and if no requests are enqueued for a period of n seconds (where n may be a programmable parameter and typically equals 1), then DDA sends a command (such as a recount command) to the drives to check their viability. Thus, physical failure of a drive will be reliably detected by the controller within a certain maximum time period. So if the monitor utility periodically polls the controller every m seconds, failures will almost always be detected within m+n seconds. In the event that the controller has partitioned the physical disks into two or more groups with each group appearing as a disk drive or a disk drive array to the host, then a tracking variable will be established for each group.

Drive Data Restoration

When DDA detects a drive failure, it first determines whether it is due to a localized media defect (a so-called grown defect), or whether the entire drive has failed. In the case of a grown defect, the bad block or blocks are remapped to another portion of the disk as discussed below.

When DDA determines that a drive has failed completely, it marks the drive as bad and never attempts to access it again. This information is stored on all the other disks, and so it is maintained across power up cycles and resets. If one of the data redundancy modes is in effect on the logical disk with the failed drive, DDA will continue to operate recovering the data as described above.

DDA has no way of informing the user that a drive has failed, and so host software must poll DDA on occasion to determine this and report it to the user in an appropriate fashion. This is covered in more detail in the following.

On power up, DDA determines which drives have failed, which drives have failed previously and now seem OK, and whether a drive has been replaced. DDA can differentiate between new drives and previously bad drives, by looking at the DDA sector (see above); new drives are assumed not to have a DDA sector. To reuse a drive which has previously failed, the diagnostics must be used to erase the drive's DDA sector.

After the failed drive has been replaced, DDA will rebuild the failed drive's data on the new drive with the algorithms outlined above. This can occur in either a foreground or background mode depending on whether the user needs to use the system in a hurry. The appendix firmware implements this rebuilding analogous to the first preferred embodiment's rebuilding as illustrated in FIG. 6.

Bad Block Remapping

DDA always presents perfect defect free disks to the host. The drives are supposed to come from their manufacturer defect free, but DDA allows for a slight relaxation of this and for grown defects which express themselves after manufacturing test.

Bad block mapping only works for logical drives with redundancy, because when DDA moves the bad block, it needs to be able to reconstruct the data. Bad block remapping is performed on stripe boundaries; if any block in a stripe is bad, the entire stripe is remapped.

Remapping occurs dynamically analogous to the procedure described in connection with the first preferred embodiment. When DDA determines that a block is bad, it performs the following procedure:

1. Allocate space for the stripe in the alternate block reserved section of the disk (see above).
2. Recover the data in the stripe containing the bad block.
3. Write the recovered data to the newly allocated stripe.
4. Update the remap tables in memory with the remap information and an indication of which drive or drives failed.
5. Write the remap tables to each disk in the logical drive.
6. Retry the operation which originally failed and uncovered the bad block.

In normal operation, on every disk access DDA searches the remap tables to determine if the requested access will intersect one or more of the bad blocks on the disk. If so, the access is split into multiple accesses in which the accesses to remapped blocks are remapped to their alternate sectors. This will incur a performance degradation on remapped blocks because of the extra seeks required. The remap table search will not cause any noticeable performance degradation.

The number of bad blocks which can be handled is configurable through the EISA configurator (see above).

Non-redundant Remapping Options

Alternatively, DDA could remap blocks on non-redundant modes when the drive reports a correctable error. That is, blocks which contain defects but with the CRC or ECC providing sufficient information to overcome the defects (i.e., soft errors) may be remapped. Soft errors are transparent to controller 100, but their locations can be made available.

Second Embodiment

FIG. 3 shows a layout on a card for second preferred embodiment controller 200 for a redundant array of disk drives (DDA), and FIG. 4 schematically shows controller 200 incorporated in a system with an EISA bus and ten IDE (ATA) disk drives. Controller 200 may be termed a DDA adapter and consists of five major functional blocks: (1) Local Processor, (2) EISA Bus Interface including BMIC, (3) AHA register emulation, (4) IDE Drive Interface, and (5) an optional Cache.

Local Processor

The local processor is denoted by reference numeral 208 and is an Intel 80960KA (a 32-bit RISC microcontroller) running at 16 MHz and has local 512K of ROM 209 and 256K SRAM 215. ROM 209 holds the microcode for the base functionality, and a monitor allows microcode to be loaded into local RAM 215 and then executed. Appendix A contains a listing of the firmware. Static RAM 215 is implemented in eight 32K ×8 SRAM modules. These modules are connected as two interleaved banks of 32K×32. The interleave makes it possible for the 80960 to access the SRAM in 3-1-1-1 clocks, which results in one wait state for the first access of a burst and zero wait states for subsequent accesses. The 80960 directly supports four interrupts. These will be used for:
BMIC interrupt.
AHA-1540 register interrupt.
A logical OR of the ten drive interrupts.
A timer tick interrupt.

EISA Interface (BMIC Chip)

The EISA bus interface is handled mostly by an Intel 82355 BMIC bus master interface chip denoted by reference numeral 211. BMIC handles local processor 208 accesses to system memory through peek and poke registers. It also has a two channel DMA controller which performs EISA bursts at full bus bandwidth.

The DMA controller in BMIC does not provide addressing for the transfer. BMIC in controller 200 talks to a DMA controller which increments the addresses for the static RAM accesses. During BMIC transfers the DMA controller takes complete control of the system bus of 80960, and 80960 is put into hold for the duration of the transfer.

BMIC only has 128K addressability, so there is a DMA page register bit to allow transfers from all of the static RAM. The DMA controller has an approximate maximum bandwidth of 28 Megabytes/sec which is below the EISA maximum but sufficient for controller 200.

AHA Emulation

AHA-1540 emulation is provided by dual porting the static RAM. All the AHA registers except the data register are mapped to specific locations in the static RAM. The majority of the AHA register semantics are handled in microcode. There are however some exceptions:
Writing to any AHA register generates an interrupt.
Reading the AHA status register generates an interrupt.
The AHA status register bits CDF and DF are implemented in hardware and forced onto the EISA data bus on reads from that register.

IDE Interface

FIG. 3 also shows IDE disk drive connectors 201–205, bus connector 210 for a 32-bit EISA bus (157 lines), daughter card connector 212 which would connect to an optional cache daughter card, and IDE drive interface chips labelled "IDE 1" through "IDE 5" and located adjacent the drive connectors 201–205. The IDE disk drives may be models such as the Conner CP3204.

Bibliography

The following references contain further information about elements of controller 200 and are hereby incorporated by reference:
Intel 80960KB Programmers Reference Manual
Intel 80960KB Hardware Reference Manual
Intel 80960KA Data Sheet
Intel 82355 Bus Master Interface Chip Data Sheet
Committee Draft ATA drive interface proposal
EISA Specification Version 3.10
Conner CP3204 Product Manual
Adaptec AHA-1540B/1542B User's Manual.

Features

Controller 200/DDA adapter has the following features:
Support for DOS, OS/2, Lan Manager, Novell, and UNIX.
Modular design consists of a base drive controller card plus an optional daughter card which provides for a disk cache.
Controls multiple parallel arrays of 2,3,4, or 5 IDE drives each giving a corresponding increase in disk transfer rate.
In a parallel array one of the drives can be used for parity data giving complete redundancy given a single drive failure.
After a failed drive in a redundant array has been replaced, its data can be rebuilt.
Array supports sector interleave.
After a drive has failed the array will collect data on the fly, and continue operation with a slight performance degradation.
Supports synced and non-synced spindle standard off the shelf IDE drives.
Optionally controls the same number of independent drives with parallel, overlapped seeks and data transfers on up to ten drives at one time.
Supports firmware mirroring of drives.

Supports EISA bus master protocols including burst transfers.
Optional one to thirty-two megabyte disk cache on daughterboard.
Patchable microcode
Compatible with the Adaptec SCSI bus master register sets so that the Adaptec drivers will operate the card.
Support for multiple controllers.
Support for coresidence with IDE, ESDI, and SCSI host adapters.

Cables

Included with the DDA adapter itself are two types of cables, the "super cable" assembly and the "sync cable". The super cable is the set of five data cables which connect the disk drives to the adapter board. The sync cable is used to communicate between the drives themselves, so that they may synchronize their rotational speed and position.

Modes of Operation

The DDA adapter operates in one of two modes. There is a native interface which is always active and is used by the utility software for testing and configuration purposes. This interface is also used to support the BIOS interface and native device drivers. In this mode, the option ROM BIOS on the adapter board provides BIOS interrupt 13 h compatibility for traditional MS-DOS applications. The other operating mode, chosen to provide broad compatibility with industry-standard operating system software, is the Adaptec AHA emulation mode. In this mode, the DDA adapter emulates the Adaptec AHA-154x series of SCSI disk adapter boards. Both operating modes are implemented in the firmware supplied with the DDA adapter.

EISA Configuration Utility

An EISA utility allows the user to fully configure the DDA adapter. There are not physical jumpers on the DDA adapter board itself.

Firmware

There are two distinct areas of firmware on the DDA adapter. First, there is the Option ROM BIOS, which is contained in the DIP EPROM near the bus connector. This contains code which is executed by the host CPU on power-up. The second area is contained in the four burst mode EPROMs on the other end of the DDA adapter board. These contain the working code for the 80960KA CPU. This code provides the operating modes, reads and writes the disk drives, manages the RAM cache and sets up the bus master mode DMA over the EISA bus. All of the EPROMs are socketed and may be removed and replaced.

Firmware upgrades may thus take three forms. First, the Option ROM BIOS EPROM may be exchanged with one containing updated object code. Second, the four burst mode EPROMs may be exchanged. Third, there is a hot patch mechanism which allows minor code changes to be applied via a self-booting diskette. This patch technique stores new 80960 object code on the disk drives themselves, and the existing firmware reads this into RAM at power-up time and links it with itself. There is a limited amount of RAM on the adapter board, so that this technique is limited to minor upgrades.

The DDA firmware is divided into functional groups and each group further divided into successively smaller subgroups until each firmware function is sufficiently small in both scope and code size. References to these firmware functions are made exclusively through function pointers rather than direct calls. Using this technique, and firmware function may be entirely replaced without disrupting the main body of the firmware. Where a typical firmware initialization would consist of a single general initialization, DDA's firmware initializes in two distinct phases; first the public function pointers, known as patch pointers, are established, and then general initialization itself is fully patchable. (Each functional group is responsible for implementing its own patch and initialization phases). A typical patch phase would look similar to the following.

```
emulPatch()
{
    emulISR = patch(DefISR);
    emulDecode = patch(DefDecode);
    emulReadAhead = patch(DefReadAhead);
    emulInit = patch(DefInit);
}
```

In this example, the Def* symbols represent function entry points found in the DDA ROM and the emul* symbols represent patch pointers. The patch( ) function returns a pointer to a function, either the pointer passed to it or a RAM-based replacement function. Code which desires to use any of the emul* functions in this example would call the function(s) through the patch pointers and would not know whether the actual service routine is running from ROM or from RAM.

Downloading firmware may contain the following items: code (.text objects), constant data (data in the .text segment), initialized data (.data objects), and uninitialized data (.bss objects). Objects in the .bss section will be initially zero-valued. Patch routines (downloaded firmware) may not call ROM routines directly, but must do so through patch pointers. If such a pointer does not exist, one can be created and placed in the .text or .data segments. Patch routines cannot know the addresses of objects in other patch routines. For this reason, a generic array of integers is reserved in the ROM data segment. This area can be used to allow several patch routines to share data.

At the beginning of the patch initialization phase, a firmware data structure is loaded from disk. This data structure is known as the patch record and is described below:

| Field | Size |
|---|---|
| DDA ROM target version | 4 bytes |
| patch version number | 4 bytes |
| patch CRC | 4 bytes |
| total length | 4 bytes |
| patch block 1 | variable |
| patch block 2 | variable |
| patch block 3 | variable |
| . . . | variable |

The DDA ROM target version must match the actual ROM version. This field exists so that DDA can automatically invalidate the patch record when its firmware ROMs are upgraded.

The patch version number is a 32-bit integer providing a unique identifier for the patch record. This field is made available to host software after DDA initialization.

The patch CRC is used by the firmware to verify the correctness of the patch record.

The patch length is used to calculate the actual patch CRC.

Firmware Overview

The DDA firmware consists of approximately 40,000 lines of C and 80960KA assembly and uses an interrupt-driven, non-tasking model. The firmware consists of several functional types: interrupt service routines (ISRs), request decoders, global resource managers, resume functions, and device drivers. Interrupt service routines (ISRs) are functions that are responsible for handling the occurrence of a hardware event (interrupt). Request decoders are functions that convert generic I/O requests into device driver requests and allocate global resources for those device requests. Global resource managers are modules that manage the allocation and deallocation of global resources. Resume functions are functions that are called upon completion of a device request by a device driver. These functions are responsible for the control flow and error reporting. Device drivers are modules that manage hardware devices as global resources. Upon receipt of an I/O request from the host, the firmware initially processes the request at user (non-interrupt) privilege level. Once the request is decomposed into manageable pieces and enqueued on either the disk driver's queue (reads) or the transfer driver's queue (writes and cache hit reads), the first hardware command is launched. The hardware operation ultimately generates an interrupt to the processor. All other request processing generally occurs in interrupt service routines.

Figure 7:
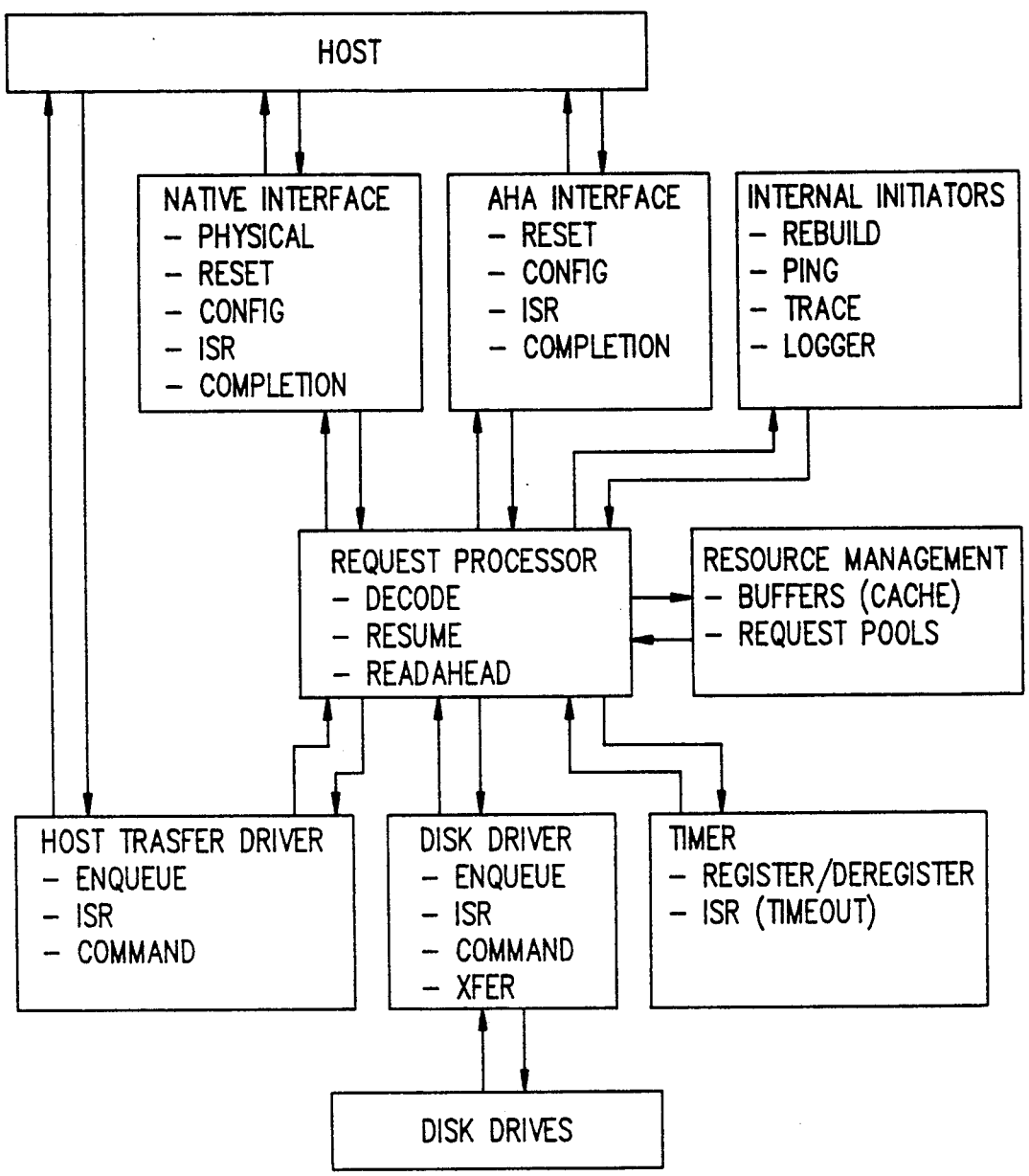
FIGS. 7-9 illustrate the layering and sequencing of commands.

The DDA firmware is composed of three conceptual layers: the host interface layer, the request processor layer, and the device driver layer (see FIG. 7). The first conceptual layer, the host interface, is made up of the native interface, the AHA interface, and a set of internal initiators. The host interface layer is responsible for initiating all I/O activity in the controller and its three components can be active simultaneously. This coactivity allows the DDA firmware to perform such things as background event logging and rebuilding, but more interestingly, it allows DDA to emulate non-intelligent controllers while simultaneously supporting array monitoring facilities through its native interface. This design does introduce the complication that host software may believe there are two controllers in the system and try to install two device drivers, so DDA's emulation mode is defeatable and a command is provided in the native interface to allow native device drivers to check the emulation mode.

The second layer, the request processor, consists of a set of request decoders, resume functions, and global resource management functions. The request decoders are responsible for decomposing I/O requests into manageable pieces, allocating global resources such as disk buffers and request structures, and submitting requests to the disk and transfer drivers. All request decomposition occurs at user level using a single thread of execution. Because of this, all functions responsible for request decomposition are allowed to be non-reentrant. This greatly simplifies the firmware that manages allocation of global resources. In contrast, the resume functions all run at interrupt privilege. Because of this, resume functions cannot be interrupted by hardware events of the same type associated with the resume function. All global resource management functions, both allocation and deallocation, are non-reentrant. The DDA firmware uses a policy where all global resources are allocated at user privilege by single threaded code and all global resources are deallocated at maximum privilege level. The purpose of making all global resource management functions non-reentrant is to minimize the number of critical regions in the firmware. Critical region implementation is very slow on the DDA hardware platform. Since deallocation functions are non-reentrant, all code calling these functions must insure that they are at maximum privilege level. This is again done for performance reasons. Under normal flow of control, callers of deallocation functions are naturally at the correct privilege level.

The third layer, the device layer, consists of three device drivers: the transfer driver, the disk driver, and the timer. Device drivers typically consist of an enqueue routine, a command processor, and an ISR. These drivers make up the heart of the DDA firmware, as they perform all of the actual data transfer and manipulation that the disk subsystem is tasked with performing. The device driver enqueue routines are fully reentrant, though the command processors and ISRs are not.

Figure 8:
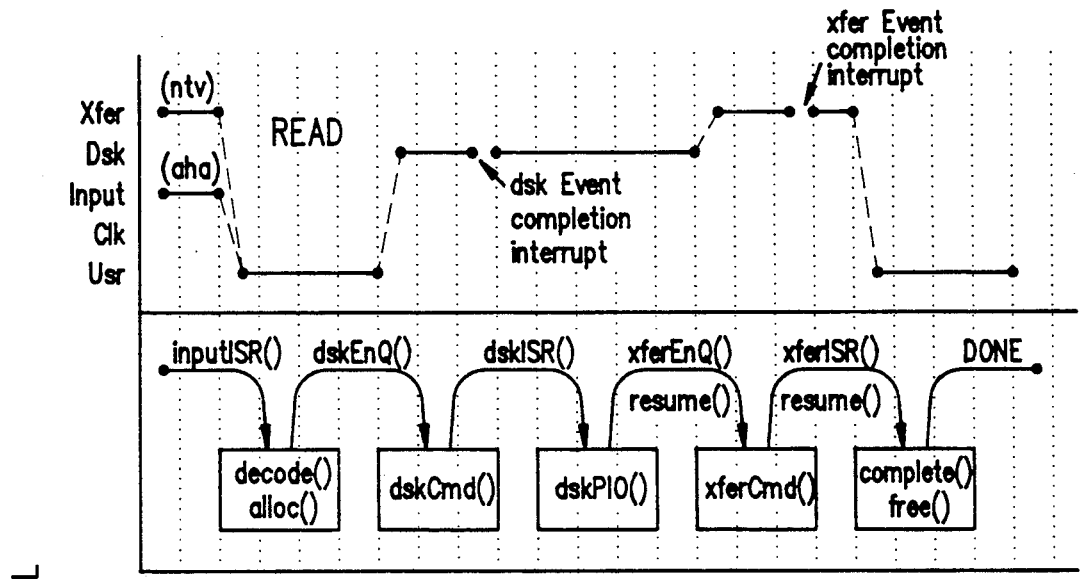
Figure 9:
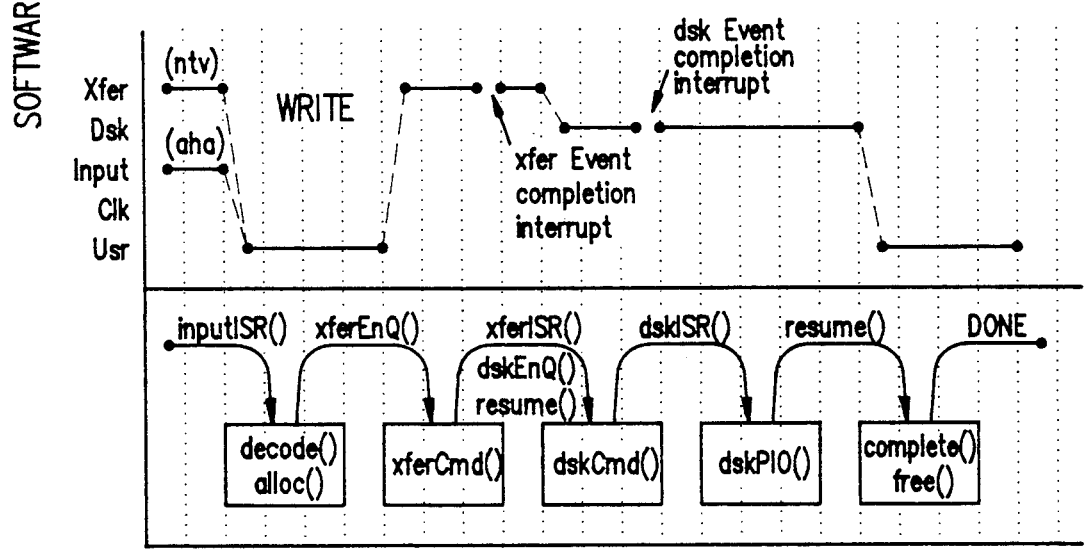

FIGS. 8 and 9 illustrate the sequence of operations in a read and write, respectively, in terms of operation privilege level. In particular, the lefthand edge of FIG. 8 indicates either a Native or an AHA request from the host as an interrupt service routine (inputISR) generated in the Native Interface or AHA Interface layer and with Xfer or Input privilege level. Execution in the Request Processor/Resource Management layer (with Usr privilege level) of the decode and allocation functions (decode and alloc) allocates buffer memory plus generates disk requests and transfer requests. The disk requests are enqueued (dskEnq) and when an enqueued disk request reaches the head of the queue, the Disk Drive layer issues a disk read command (dskCmd) with privilege level Dsk to the disk drives. When the disk drives complete the read by putting the read data in the allocated buffer memory, it issues an interrupt which is serviced (dskISR) with Dsk privilege level. This runs the disk programmed I/O function (dskPIO) still with Dsk privilege level. Then the transfer requests for buffer to host transfer are enqueued (xfer Enq). When an enqueued transfer request reaches the head of the queue, the transfer command (sferCmd) issues in the Host Transfer Driver layer and the data transfers from buffer memory to the host. Upon completion of the data transfer, the event completion interrupt is serviced (xferISR) to run the completion and free the allocated resources functions (complete and free). Note that the transfer to the host has the highest privilege level, whereas the decoding and resource allocation has the lowest privilege level. This privilege hierarchy helps avoid deadlocks. The write sequence in FIG. 9 is analogous.

Specific Data Structures

Processor 208 (the 80960) creates a structure in response to the request from the host which uses the six entries in the mailbox for the first six fields:

tyepdef struct _ntvRequest

-continued

```
{
    uchar   comand; /* command byte */
    uchar   drive; /* drive number */
    uchar   sectorCount; /* transfer count */
    uchar   handle; /* host request ID */
    union secnum sn; /* starting sector number */
    union hostaddr ha; /* host address */
    struct _ntvRequest * volatile next;
    ulong   finalSector;
    volatile ushort forkCount;
    volatile ushort joinCount;
    uchar   status;
    uchar   remaining;
    uchar   index;
    uchar   tCount;
    ulong   tSector;
} ntvRequest;
```

The other fields of the structure include a pointer to the next host request structure, counters for request multi-threading analogous to that described in connection with FIGS. 10 and 11, and error tracing and reporting aids. Further, processor 208 will generate corresponding structures for submission of requests to the IDE disk drives as follows:

```
typedef struct _ideRequest
{
    uchar command; /* ide logical commands */
    uchar drive;
    uchar sectorCount; /* max request size is 255 sectors */
    uchar status;
    ulong sectorNumber; /* logical sector number */
    ushort *buffer;
    void *requestPtr; /* pointer to originating request struct */
    struct _bmicRequest *bmicReq; /*pointer for completion
    routines */
    void (*returnFun)(); /*function to call when the operation */
        /* is complete. This function gets called */
        /* with one argument which is the pointer */
        /* to this structure. */
    struct _ideRequest *next; /* linked list pointer for queues */
    struct _ideRequest *previous;/* linked list pointer for queues */
    uint decodePhase; /* used by decoder to handle resets */
    uint retries; /* retry count for this request */
    ushort justifyBM; /* bitmap of failed drives for REMAPPING */
    uchar type; /* ORIGINAL, FRAGMENT,
    COMBINATION ... */
    uchar combineEligible;/* TRUE/FALSE eligible for
    COMBINATION */
    #ifdef TIMESTAMP /* Time in milliseconds when request got */
    long timeStamp; /* to this routine */
    #endif
} ideRequest;
```

Also, processor 208 generates structures for transfers to and from the host's primary memory through BMIC as follows:

```
typedef struct _bmicRequest
{
    uchar command; /* use #defines above */
    char xferPriority; /* priority of transfer; values of 0 to 3 */
        /* are allowed; 0 is highest priority. */
    char disableXfer; /* disable actual transfer if asserted */
    char *radAddr; /* address of DDA side buffer */
    uint hostAddr; /* address of host side buffer */
    uint length; /* length of transfer in bytes */
    struct _bmicRequest *next; /*       */
    void *requestPtr; /* pointer to originating request struct */
    struct _ideRequest *ideReq; /* pointer used by completion
    routines
    */
    void (*returnFun)(); /* The function to call when the operation
    */
        /* is complete. This function gets called */
        /* with one argument which is a pointer */
        /* to this structure. */
    uint decodePhase; /* used by decoder to handle resets */
} bmicRequest;
```

Figure 10:
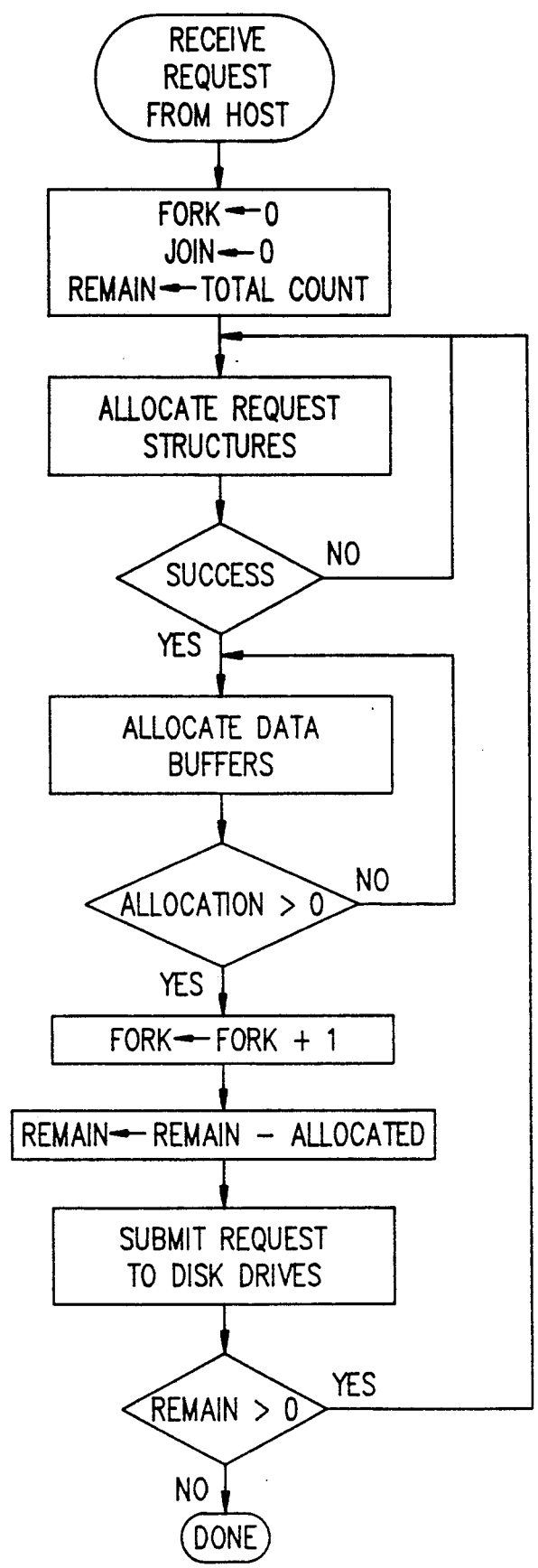
FIGS. 10-11 are flowcharts showing indeterminate number fork/join process threads by the first preferred embodiment.
Figure 11:
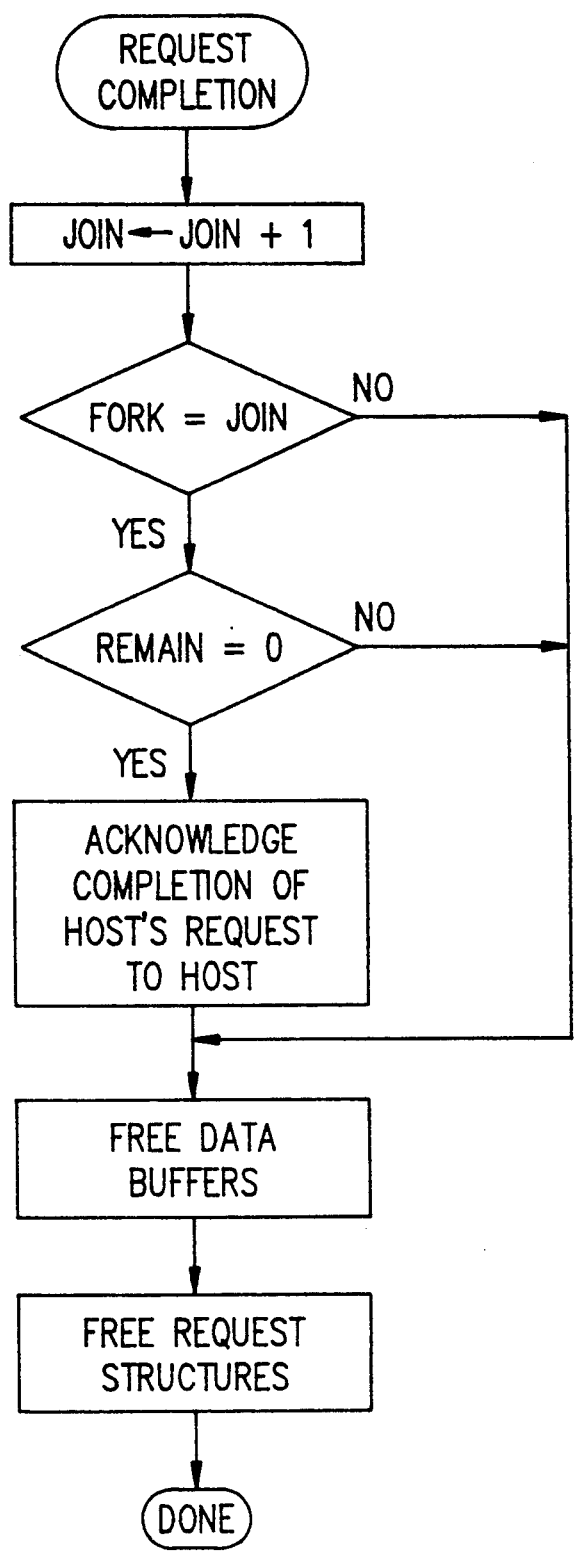

As example, a write request from the host with controller 200 in native mode proceeds as indicated by the following simplified code which proceeds roughly as shown in FIGS. 10-11:

```
void ntvcompleteRequest(ntvRequest *ntvReq)
{
    BMIC_INDEX(BMIC_SEMAPHORE_1)
    BMIC_SDATA(1);
    BMIC_INDEX(BMIC_LIR_AUTOINC | BMIC_MBOX_
    13);
    BMIC_SDATA(ntvReq->status);
    BMIC_SDATA(ntvReq->remaining);
    BMIC_SDATA(ntvReq->handle);
    BMIC_INTERRUPTHOST(NTV_LOGICAL_DOORBELL);
    ntvReq->command = NTV_NOCOMMAND;
}
void ntvIdeResumeWrite(ideRequest *ideReq)
{
    ntvRequest *ntvReq = ideReq->requestPtr;
    if (ideReq->decodePhase != ntvPhase)
    {
        disableInts();
        FreeSectorBuffer(ideReq->buffer, ideReq->sectorCount);
        FreeIdeReqBuffer(ideReq);
        enableInts();
        return
    }
    if (ideReq->status) /* an error occurred when attempt write*/
    {
        int cnt = ntvReq->finalSector - ideReq->sectorNumber;
        if (ntvReq->remaining < cnt) ntvReq->remaining = cnt;
        ntvReq->status = ideReq->status;
    }
    disableInts(); /* start join operation */
    if ((++(ntvReq->joinCount) == ntvReq->forkCount) &&
    (ntvReq->sectorCount == 0))
    {
        ntvcompleteRequest(ntvReq);
    }
    if (ideReq->status)
        FlushSectorBuffer(ideReq->buffer, ideReq->sectorCount);
    FreeSectorbuffer(ideReq->buffer, ideReq->sectorCount);
    FreeIdeReqBuffer(ideReq);
    enableInts();
}
void ntvBmicResumeWrite(bmicRequest *bmicReq)
{
    register ideRequest *ideReq = bmicReq->ideReq;
    if (ideReq->decodePhase != ntvPhase)
    {
        FreeSectorBuffer(ideReq->buffer, ideReq->sectorCount);
        FreeIdeReqBuffer(ideReq);
        FreeBmicReqBuffer(bmicReq);
        return;
    }
    doIde(ideReq);
    FreeBmicReqBuffer(bmicReq);
}
void ntvDecode(void)
{
    ntvRequest *ntvReq;
    bmicRequest *bmicReq;
    ideRequest *ideReq;
    unsigned int thisPhase;
    unsigned int count;
    unsigned short *buffer;
    if (ntvState & 0x00000080) /* any to decode? */
    {
        thisPhase = ntvPhase;
        ntvReq = ntvRequests + (ntvState & 0x0000007F);
        switch (ntvReq->command)
        {
            case NTV_WRITE :
```

```
        count = GetWriteBuffer((int)ntvReq->drive,
          (int)ntvReq->sn.sectorNumber,
          (int)ntvReq->sectorCount,
          &buffer);
        if (count == 0) break;
        bmicReq = (bmicRequest *)GetBmicReqBuffer();
        if (bmicReq == NULL)
        {
          disableInts();
          FlushSectorBuffer(buffer, count);
          FreeSectorBuffer(buffer, count);
          enableInts();
          break;
        }
        ideReq = GetIdeReqBuffer();
        if (ideReq == NULL)
        {
          disableInts();
          FlushSectorBuffer(buffer, count);
          FreeSectorBuffer(buffer, count);
          FreeBmicReqBuffer(bmicReq);
          enableInts();
          break;
        }
        bmicReq->command = BMIC_READFROMHOST;
        bmicReq->radAddr = (char *)buffer;
        bmicReq->hostAddr = ntvReq->ha.hostAddress;
        bmicReq->length = count * BUFFERSIZEBYTES;
        bmicReq->requestPtr = ntvReq;
        bmicReq->ideReq = ideReq;
        bmicReq->decodePhase = thisPhase;
        bmicReq->nest = NULL;
        ideReq->drive = ntvReq->drive;
        ideReq->sectorCount = count;
        ideReq->sectorNumber = ntvReq->sn.sectorNumber;
        ideReq->buffer = buffer;
        ideReq->requestPtr = ntvReq;
        ideReq->decodePhase = thisPhase;
        bmicReq->returnFun = ntvBmicResumeWrite;
        ideReq->returnFun = ntvIdeResumeWrite;
        ideReq->command = WRITE;
        ntvReq->forkCount += 1;
        ntvReq->sectorCount -= count;
        ntvReq->sn.sectorNumber += count;
        ntvReq->ha.hostAddress += count * BUFFERSIZE-
          BYTES;
        if (nteReq->sectorCount == 0) ntvAdvanceState(ntvReq);
        bmicBurst(bmicReq);
        break;
      }
    }
  }
  void main(void)
  {
    /* power up initialization */
    for (;;)
    {
      if (ntvState) ntvDecode();
      /* unrelated further */
    }
  }
```

The main function calls the ntvDecode function if the ntvSTate is nonzero which means that a request from the host is pending. The ntvRequest structure initially has the values for number of sectors and addresses in the host's primary memory of the data to be written as requested by the host. The portion of the ntvDecode function pertinent for a write assigns the number of sectors to be written in the first submission to the disk drives to the count variable by use of the GetWriteBuffer function; typically insufficient resources such as buffers will be available to cover the entire request from the host at once, so a portion of the request will be forked off and submitted and the remainder of the request will wait for further resource availability. That is, the count variable will be typically be less than the total number of sectors to be written pursuant to the request of the host. The ntvDecode function then initializes members of the bmicRequest and ideRequest structures using the count variable for how much to read from the host and the ntvRequest structure member values for addresses, and then adjusts the member values in ntvRequest to compensate for the portion to be written; that is, the ntvDecode function increments the forkCount of ntvRequest to reflect a portion request is being submitted to the disk drives, decrements the sectorCount by the value of the count variable to keep track of the number of sectors still to be submitted, and increments the sectorNumber and hostAddress by the value of count and the value of count multiplied by sector size to keep track of the next portion's starting point in the host's primary memory, respectively. The return functions ntvBmicResumeWrite and ntvIdeResumeWrite come from the bmicRequest and ideRequest structures, respectively; the doIde function in the ntvBmicResumeWrite function makes the submission to the disk drives, and the ntvIdeResumeWrite function increments the joinCount member of ntvRequest upon completion of the disk drive write. The first function, ntvCompleteRequest, is called from the ntvIdeResumeWrite function if the total write has been completed (forkCount equals joinCount, so nothing pending, and sectorCount equals zero so nothing left to write) and sets BMIC interface 211 to interrupt the host to indicate completion.

Additional Data Structures

The following code shows more actual data structures used in the presently preferred embodiment. However, those skilled in the art will of course recognize that this implementation can be very widely modified and varied.

```
/*
** types.h -- DDA and NINDY data type definitions.
*/
typedef unsigned char uchar;
typedef unsigned short ushort;
typedef unsigned int uint;
typedef unsigned long ulong;
typedef void (*pfunc) (void);
typedef struct {
  short reservedCylinders; /* rsvd tracks per physical drive */
  short heads; /* number of heads in the logical drive */
  short sectors; /* sectors per track */
  short cylinders; /* */
} geometry;
/* iac structure */
typedef struct {
  unsigned short field2;
  unsigned char field1;
  unsigned char message_type;
  unsigned int field3;
  unsigned int field4;
  unsigned int field5;
} iac_struct;
/*
** extracted from NINDY definitions
*/
struct file { /* file header structure */
  unsigned short file_type; /* file type */
  unsigned short num_secs; /* number of sections */
  long time_date; /* time and date stamp */
  long symtbl_ptr; /* symbol table ptr */
  long num_syms; /* num entries in symb tabl */
  unsigned short opt_hdr; /* size of optional header */
  unsigned short flags; /* flags */
};
struct sect { /* section header structure */
  char sec_name[8]; /* section name */
  long p_addr; /* physical address */
```

```
long v_addr; /* virtual address */
long sec_size; /* size of sections */
long data_ptr; /* pointer to data */
long reloc_ptr; /* relocation pointer */
long line_num_ptr; /* line number pointer */
unsigned short num_reloc; /* number of reloc entries */
unsigned short num_line; /* number line num entries */
long flags; /* flags */
unsigned long sec_align; /* alignment for sect bndry */
};
struct aout { /* a.out header structure */
unsigned short magic_nmbr; /* magic number */
unsigned short version; /* version */
long text_size; /* size of .text section */
long data_size; /* size of .data section */
long bss_size; /* size of .bss section */
long start_addr; /* starting address */
long text_begin; /* start of text section */
long data_begin; /* start of data section */
};
#define FHDRSIZE sizeof(struct file) /* size of file header */
#define SHDRSIZE sizeof(struct sect) /* size of section header */
#define AOUTSIZE sizeof(struct aout) /* size of optional header */
/* The size of the above structures NOT INCLUDING any
 * padding added by the compiler for alignment of entries within
 * arrays. */
#define FHDR_UNPADDED_SIZE (3*sizeof(long) + 4*sizeof (short))
#define SHDR_UNPADDED_SIZE (8*sizeof(long) + 2*sizeof(short) + 8*sizeof(char))
#define AOUT_UNPADDED_SIZE (6*sizeof(long) + 2*sizeof(short))
/* file header union */
union _filebuf {
unsigned char buff[FHDRSIZE];
struct file filehead;
};
/* section header union */
union _sectbuf {
unsigned char buff[SHDRSIZE];
struct sect secthead;
};
/* a.out header union */
union _aoutbuf {
unsigned char buff[AOUTSIZE];
struct aout aouthead;
};
struct fault_data {
unsigned reserved;
unsigned override[3];
unsigned fdata[3];
unsigned override_data;
 unsigned pc;
unsigned ac;
unsigned int fsubtype:8,
freserved:8,
ftype: 8,
fflags:8;
unsigned int *faddress;
};
typedef struct
{
  long sector;
  ushort offset;
  ushort justifyBM;
} remapEntry;
/*
** The following is the cache block data structure. index
** is a signed short. We can have no more than 32768 buffers.
** This is not a problem since >32768 buffers would consume a
** massive amount of memory. We will have to define a buffer to
** be a cache block to support >7 megs of cache memory.
*/
typedef struct _sectorbuf
{
  struct _sectorbuf * volatile nextfree; /* next in free list */
  struct _sectorbuf * volatile nexthash; /* next in hash table*/
  int sectoraddress; /* sector address *** */
  short index; /* logical number of sectorbuf */
  char flush; /* is this buffer free? */
  char free; /* need to flush buffer? */
} sectorbuf;
typedef struct _patchHdr
{
  void *romAddr; /* ROM routine this is designed to replace */
  char *loadAddr; /* location in DDA memory where loaded */
  struct _patchHdr *next; /* pointer to next patch function */
};
```

Resource Limitations

In addition to fragmenting requests for remapping and combining sequential requests, controller 100 may also decompose a request when insufficient resources, such as data buffers, are currently available to satisfy the request; this permits portions of the request to be satisfied as the resources become available as illustrated in FIG. 10. In particular, if a read request from the host requires reading 160 consecutive sectors at a time that data buffers sufficient for only 20 sectors are available, then controller 100, following the procedure of FIG. 10, initializes a fork counter to 0, a join counter to 0, and a remain counter to 160. Next, controller 100 allocates request structures according to the available data buffers for 20 sectors and the remaining unavailable 140 sectors. Then controller 100 allocates data buffers for the 20 sectors and forks off the request for the 20 sector read and submits this to the disk drives leaving the 140 sector read pending until further data buffers become available and another request for a portion can be forked off. Note that for efficiency considerations, CPU may avoid allocations based on small amounts of available data buffer and wait until larger amounts of data buffer become available. The net result of the procedure of FIG. 10 is a decomposition of the original host request by forking a series of smaller requests to the disk drives when data buffers become available; this forking does not have a predetermined number of smaller requests and does not require any software critical regions. The fork counter keeps track of the number of smaller requests submitted, and the remain counter keeps track of the remaining number of sectors not yet covered by a submitted request.

The individual disk drives report the completions of the smaller requests and controller 100 invokes the procedure shown in FIG. 11. Indeed, each request completion increments the join counter, and if the join counter equals the fork counter and if the remain counter is zero, then the entire host request has been completed and the host is notified. Otherwise, each request completion just releases its data buffers and request structure. The description of the second preferred embodiment includes a more explicit description, including code, for an analog of the procedure of FIG. 11.

Performance-Enhancement Optimizations

As shown in FIGS. 3-4, there are connectors for up to ten IDE drives to be attached to the DDA card. DDA disk drives may be configured through the EISA configuration utility to form "composite" drives consisting of several physical drives in a drive array. These composite drives may be one of three types of arrays in which data is striped across the individual drives. These are the standard array form, the mirrored array, and the guarded array, previously described in connection with the first preferred embodiment. On each cable in the super cable assembly, there are two connectors, the inner connector and the outer connector at the end of the cable. The disk drives attached to the inner connectors form one band of drives and the ones connected to the outer connectors form another. There are at most five disk drives in one bank. The composite drives are then subject to one rule: a composite drive must consist of disk drives in a single bank. Mirroring changes the rule slightly. Each array in the mirrored pair must consist of disk drives in a single bank.

DDA performs many optimizations for disk I/O performance enhancement. These include:

Multiple I/O Threads

DDA supports multiple outstanding I/Os on each logical drive, with operations on separate logical drives occurring concurrently.

Disk Cache

The buffer manager implements a rudimentary store-thru cache. This cache is fully associative and has a variable block size. Due to the small size of the current cache, lookups are very fast. There is a background process which attempts to control fragmentation of the cache. The cache can be turned off with the EISA configuration utility.

Readahead

DDA keeps track of the addresses of the last n reads (where n is a programmable parameter). If a new read request comes in adjacent to any of the last n, then lookahead reads are buffered accordingly. The particular lookahead read strategy may be as simple as read an additional integral multiple of the requested read or more involved and depend upon the size of the read. For example, if a read request for sectors 10000-10005 follows four read requests after (n at least 4) a read request for sectors 9998-9999, then rather than just reading sectors 10000-10005, DDA will read sectors 10000-10017 (three times the requested size) in anticipation of an imminent read request for sectors 10006-10017. Preferably n is set comparable to or greater than the maximum number of independent activities which may be underway. Thus if one thread is doing a sequential read the controller will perform readahead for optimization, but otherwise the controller will not normally do readahead.

Scheduling

DDA currently performs no head scheduling. The request queues are strictly FIFO except for the read promotions discussed above.

Posted Writes

If enabled, DDA returns a successful completion of a write as soon as it has filled a buffer with the write data from the host. This write is then queued onto the IDE drivers request queue, and the write occurs sometime in the future. This is basically an optimization for operating systems which do not support multi-threaded I/O.

Read and Write Combining

Multiple reads to contiguous disk blocks are combined into one disk read, with the data being scattered/gathered to/from multiple buffers. This greatly reduces the disk latency and provides the benefits of scatter/gather operations without the associated protocol overhead. It also helps defray the performance degradation caused when the cache gets fragmented.

Read Promotion

Read requests in the IDE request queue are promoted past write requests unless the read is for a block that the write is going to write to. Reads are not promoted past any other type of request.

Seek Swallowing

Seeks in the IDE request queue are not performed if another request comes in behind them. This is safe because every operation has an implied seek. A sequence of N seeks will only execute the last one.

Firmware Patching

The DDA hardware provides 512 KB of ROM and 256 KB of RAM. The DDA firmware consists of approximately 256 KB of executable code and initialized data. Due to the relative imbalance of ROM and executable code size to RAM size, DDA implements an unusual approach to provide field downloadable firmware. The DDA firmware is divided into functional groups and each group further divided into successively smaller subgroups until each firmware function is sufficiently small in both scope and code size. References to these firmware functions is made exclusively through function pointers rather than direct calls. Using this technique, any firmware function may be entirely replaced without disrupting the main body of the firmware. Where a typical firmware initialization would consist of a single general initialization, DDA's firmware initializes in two distinct phases; first the public function pointers, known as patch pointers, are established, and then general initialization is performed. Using this technique, general initialization itself is fully patchable. Each functional group is responsible for implementing its own patch and initialization phases. A typical patch phase would look similar to the following:

```
emulPatch( )
{
    emulISR       =    patch(DefISR);
    emulDecode    =    patch(DefDecode);
    emulReadAhead =    patch(DefReadAhead);
    emulInit      =    patch(DefInit);
}
```

In this example, the Def* symbols represent function entry points found in the DDA ROM and the emul* symbols represent patch pointers. The patch function returns a pointer to a function, either the pointer passed to it or a RAM-based replacement function. Code which desires to use any of the emul* functions in this example would call the function(s) through the patch pointers and would not know whether the actual service routine is running from ROM or from RAM.

Firmware patch routines may contain the following items: code (.text objects), constant data (data in the .text segment), initialized data (.data objects), and uninitialized data (.bss objects). Objects in the .bss section will be initially zero-valued, and constant data may actually be changed at run-time. Patch routines may not call ROM routines directly, but must do so through patch pointers. If such a pointer does not exist, one can be created and placed in the .text or .data segments. Patch routines cannot know the addresses of objects in other patch routines. For this reason, a generic array of integers is reserved in the ROM data segment. This area can be used to allow several patch routines to share data.

At the beginning of the patch initialization phase, a firmware data structure is loaded from disk. This data structure is known as the patch record and is described below:

```
| DDA ROM target version | 4 bytes  |
| patch version number   | 4 bytes  |
| patch CRC              | 4 bytes  |
| total length           | 4 bytes  |
| patch block 1          | variable |
| patch block 2          | variable |
| patch block 3          | variable |
| ...                    | variable |
```

The DDA ROM target version must match the actual ROM version. This field exists so that DDA can automatically invalidate the patch record when its firmware ROMs are upgraded. The patch version number is a 32 bit integer providing a unique identifier for the patch record. This field is made available to host software after DDA initialization. The patch CRC is used by the firmware to verify the correctness of the patch record, and the patch length is used to calculate the actual patch CRC.

A patch block contains a everything necessary to replace a single ROM entry point. The structure of a patch block is defined as follows:

```
| romAddr      | 4 bytes  |
| loadAddr     | 4 bytes  |
| nextPatch    | 4 bytes  |
| codeSize     | 4 bytes  |
| code         | variable |
| fixup length | 4 bytes  |
| fixup list   | variable |
```

The romAddr field contains the address of the ROM routine the code body is designed to replace. The loadAddr field is reserved for use by the DDA firmware. The nextPatch field points to the next patch block, or contains zero if the patch block is the last one. The codeSize field contains the size of the code area in bytes. The code area contains the actual code and data that the patch block provides, and the fixup length and list provide the fixup information for the dynamic linker. The fixup list is an array of 32 bit integers containing the relative addresses within the code area that need address fixups. Only certain types of 960 intruction encoding may be used in a patch block, though all code generated by the firmware cross-compiler is supported.

When DDA powers up, it searchs the attached drives for a valid patch record. When it finds a valid record, it loads into low memory, chains all the patch blocks together, and zeros out the loadAddr fields of all the patch blocks. When the patch function is called, the patch block chain is traversed. If a replacement function is found, it is copied into high memory, its fixup addresses are resolved, and its new address is stored in loadAddr. If another call to patch references the same replacement function, the loadAddr field will be non-zero and its value will simply be returned. This insures that, at most, only one copy of any replacement function is made. This is required because of the possibility of local data being associated with the replacement function.

DDA Fragmentation Mechanism

Defect Management, Request Fragmentation, and Queue Management

FIG. 2 shows ideal platters for disk drives 110-114. In contrast, the physical disk drives may include platters with defective sectors, both defects arising from manufacture and defects "growing" after manufacturers testing and shipping, such as read/write head alignment drift. To compensate for manufacturing defects, the controller on each disk drive includes a lookup table for mapping defective sectors to spare sectors reserved for this purpose. That is, each disk drive appears to have its sectors logically identified by sequence (or by geometry) and this may correspond to the physical layout of the sectors provided there are no defective sectors; alternatively, there may be a simple geometrical mapping of logical to physical locations to accommodate disk drive standards such as 17 sectors per track. However, if a manufacturing defect appears in a sector, then this sector is remapped to a spare sector and the disk drive controller uses its lookup table of defects to treat logical access to this defective sector as physical access to such spare sector. Note that the error correction mechanism (e.g., CRC or ECC) for a sector will detect soft errors which may arise from a defect growing after manufacture, and the disk drive's controller will determine the correct sector data using the appropriate error correction algorithm and thus overcome such a defect. Such error correction and such remapping of defective sectors is transparent to the user (i.e., controller 100) of the disk drive, although soft errors may be indicated. Conversely, if a hard error arises, as from a growing defect, then the disk drive's controller cannot recover the data and indicates an error to controller 100 for an attempted read or write.

Controller 100 modifies the simple remapping of bad sectors just described with the following remapping. If, for example, sector 121 develops a defect resulting in a hard error, then controller 100 computes the correct data for sector 121 using sectors 120 and 122-124 as previously described and then writes all five sectors' data to a new stripe of sectors 130-134; that is, each sector in the stripe is remapped to a spare sector on the same disk to form a new stripe. Controller 100 records both the remapping of logical to physical locations and the identity of the disk which developed the detected defect. Controller 100 then proceeds to service the original read/write request which uncovered the defect.

Description of Terms

In the following descriptions of fragment operations, snapshots of the request queue for each stage in the process will be provided. Each entry in the queue will be described by four fields plus a possible comment. Although a queue entry contains much more than four relevant fields, this representation is sufficient for our purposes. The first field is the request type. Request types will be described later. The second field is the command type. Command types will also be described later. The third field is the starting sector number. The sectors which compose the available space on a composite disk are addressed through a zero-based absolute sector number. A starting sector number of zero corresponds to the first available sector on a composite drive. The last field is the sector count. Each request which addresses composite disk data specifies the amount of data, in sectors, in this field.

Request Type

The first field of the request is the request type. The following is a description of the different request types that appear in this text. During the course of request processing, the DDA firmware may change a request's type.

ORIGINAL: A request that has been submitted to the disk driver by an outside source. This does not necessarily have to be the host; the DDA firmware submits requests to the disk driver for a variety of reasons.

FRAGMENT: A request that performs only a portion of the work necessary to complete an ORIGINAL request. A FRAGMENT is usually atomic.

FRAG-ORIG: When an ORIGINAL request is fragmented, its type is changed to FRAG-ORIG.

COMBINATION: A request consisting of multiple ORIGINAL requests that may be completable atomically. Sequential reads and writes may be combined to improve performance. When this occurs, a COMBINATION request is created and the ORIGINAL requests are converted into COMB-ORIG requests.

COMB-ORIG: When a COMBINATION request is created, the ORIGINAL requests which will be satisfied by the COMBINATION request are converted into COMB-ORIG requests.

FRAG-COMB: When a COMBINATION request cannot be satisfied atomically, it is fragmented and its type is changed to FRAG-COMB.

Command Type

The second field of the request is the command type. The following is a description of the different internal command types that appear in this text. It is not an exhaustive list of the internal commands supported in the DDA firmware. There are two classes of commands, atomic and META. An atomic command is one which can be completed in one step. META commands are commands which must be fragmented into atomic commands and are not executed themselves. META commands are not subject to remapping since they will be "cracked" into atomic commands which will be remapped if necessary. Note that atomic commands that are subject to remapping can still be fragmented as a result of the remap process. Therefore, "atomic" does not mean "non-fragmentable." Some commands are always atomic, others are always META, and still others are sometimes atomic and sometimes META.

READ: A logical disk read operation. This request is atomic, it can be generated by the host and is subject to remapping.

WRITE: A logical disk write operation. In the case of a guarded composite drive, the command is implemented as a META command when necessary. Otherwise, it is atomic. This request can be generated by the host and is subject to remapping.

WRITEVERF: A logical disk write plus verify operation. This request performs a verify after write to help insure data integrity and is commonly submitted by host software. This request is implemented as a META command, since IDE drives do not generally provide WRITE plus VERIFY operations.

VERIFY: A logical disk verify operation. Essentially the same as a read, but the data is not actually transferred. It is used to test the integrity of disk sectors. This request is atomic, it can be generated by the host and is subject to remapping.

VERIFY-NR: Another logical disk verify operation. It differs from the verify operation in that the physical disks are instructed to disable retries. It is used to help isolate errors. This request is atomic, it cannot be generated by the host and it is subject to remapping.

RESET: A logical disk reset operation. This request may be submitted by the host in the event of an error and is implemented as a META command.

RAWRESET: An atomic internal command used by the disk driver to help perform a disk reset.

SETMULT: An atomic internal command used by the disk driver to help perform a disk reset.

SETPARMS: An atomic internal command used by the disk driver to help perform a disk reset.

SETBUFF: An atomic internal command used by the disk driver to help perform a disk reset.

MAPTHIS: This command performs a manual remap operation. This request is only generated by the host and is implemented as a META command.

RMW-READ: An atomic internal command used by the disk driver to implement guarded writes. It is similar to a normal read operation except that it associated with guarded write commands. This request cannot be generated by the host but is subject to remapping.

RMW-WRITE: An atomic internal command used by the disk driver to implement guarded writes. It is similar to a normal write operation except that it associated with guarded write commands and must know how to generate parity drive data using data previously generated by a RMW-READ command. This request cannot be generated by the host but is subject to remapping.

MAP-READ: An atomic internal command used by the disk driver to implement sector remapping. It is similar to a normal read operation except that it is not subject to remapping and it must be able to recover lost sectors. This request cannot be generated by the host.

MAP-WRITE: An atomic internal command used by the disk driver to implement sector remapping. It is similar to a normal write operation except that it is not subject to remapping and the request is always stripe aligned. This request cannot be generated by the host.

READ-ALL: An atomic internal command used by the disk driver to retrieve controller information. This command is not subject to remapping.

READ-SAME: An atomic internal command used by the disk driver to retrieve controller information. This command is not subject to remapping.

WRITE-SAME: An atomic internal command used by the disk driver to store controller information. This command is not subject to remapping.

WRITE-RMAP: An atomic internal command used by the disk driver to implement the final phase of a remap or unmap operation. It stores the remap table information on the disk. This command is not subject to remapping.

WRITE-DFL: An atomic internal command used by the disk driver to store physical disk defect lists. This request cannot be generated by the host and is not subject to remapping.

WRITE-STAT: An atomic internal command used by the disk driver to store composite drive status information. This command is not subject to remapping.

Fundamental Operations

The following is a list of operations that the DDA disk driver performs using the fragmentation mechanism. It is not an exhaustive list, though it encompasses all of the basic uses of fragmentation. An example of a real request that uses many of these operations can be provided but it would be very long-winded.

Error Isolation

When an unrecoverable error occurs on a multi-sector operation, DDA uses the fragmentation mechanism to isolate the bad sector(s). In the following example, the composite drive is a two drive array and the bad sector is sector 2.

| | Initial Request | | | |
|---|---|---|---|---|
| Req Type | Command | Sec # | Cnt | Comments |
| ORIGINAL | READ | 0 | 8 | Head |

The host has issued a read request. The DDA firmware attempts the read but receives an error from one of the drives. The DDA firmware attempts to isolate the failure using a VERIFY-NR command.

| | After Fragmentation | | | |
|---|---|---|---|---|
| Req Type | Command | Sec # | Cnt | Comments |
| FRAGMENT | VERIFY-NR | 0 | 8 | Head |
| FRAG-ORIG | READ | 0 | 8 | |

The verify operation reports that sector 2 fails. Since a remap is not possible, we will reset the drives and retry the verify. If we were able to remap, we would dequeue the verify, push the remap operation which will be described later, and the push the reset operations.

| | After Verify Failure | | | |
|---|---|---|---|---|
| Req Type | Command | Sec # | Cnt | Comments |
| FRAGMENT | RAWRESET | — | — | Part of Reset - Head |
| FRAGMENT | SETPARMS | — | — | Part of Reset |
| FRAGMENT | SETBUFF | — | — | Part of Reset |
| FRAGMENT | SETMULT | — | — | Part of Reset |
| FRAGMENT | VERIFY-NR | 0 | 8 | |
| FRAG-ORIG | READ | 0 | 8 | |

DDA then executes the four requests which implement a drive reset. The queue looks the same as it did after the initial fragmentation, but a retry counter, not shown, prevents us from entering an endless loop.

| | After Reset | | | |
|---|---|---|---|---|
| Req Type | Command | Sec # | Cnt | Comments |
| FRAGMENT | VERIFY-NR | 0 | 8 | Head |
| FRAG-ORIG | READ | 0 | 8 | |

The verify operation again reports that sector 2 fails. DDA calls the completion function of the ORIGINAL read and reports the error. The queue is now empty.

Sector Remapping

Sector remapping involves two operations: recovering data and transferring it to a newly allocated location (dynamic sector remapping), and converting all subsequent references to the remapped location (runtime remapping).

Dynamic Sector Remapping

In the following example, we have a multi-sector read request that references a sector that has gone bad. The composite drive is a two-plus-parity guarded array and the bad sector is sector 2. This example is identical to the example in the Error Isolation section except that DDA can recover the lost data since the composite drive contains redundancy.

| | Initial Request | | | |
|---|---|---|---|---|
| Req Type | Command | Sec # | Cnt | Comments |
| ORIGINAL | READ | 0 | 8 | Head |

The host has issued a read request. The DDA firmware attempts the read but receives an error one of the drives. The DDA firmware attempts to isolate the failure using a VERIFY-NR command.

| | After Fragmentation | | | |
|---|---|---|---|---|
| Req Type | Command | Sec # | Cnt | Comments |
| FRAGMENT | VERIFY-NR | 0 | 8 | Head |
| FRAG-ORIG | READ | 0 | 8 | |

The verify operation reports that sector 2 fails. DDA decides to remap the stripe containing sector 2 to a reserved area at sector 10000.

| | After Isolation of Read Error | | | |
|---|---|---|---|---|
| Req Type | Command | Sec # | Cnt | Comments |
| FRAGMENT | RAWRESET | — | — | Part of Reset - Head |
| FRAGMENT | SETPARMS | — | — | Part of Reset |
| FRAGMENT | SETBUFF | — | — | Part of Reset |
| FRAGMENT | SETMULT | — | — | Part of Reset |
| FRAGMENT | MAP-READ | 2 | 2 | |
| FRAGMENT | MAP-WRITE | 10000 | 2 | |
| FRAGMENT | WRITE-RMAP | — | — | Write Remap Table |
| FRAGMENT | WRITE-DFL | — | — | Write Defect Lists |
| FRAG-ORIG | READ | 0 | 8 | |

DDA then executes the four requests which implement a drive reset.

| | After Isolation of Read Error | | | |
|---|---|---|---|---|
| Req Type | Command | Sec # | Cnt | Comments |
| FRAGMENT | MAP-READ | 2 | 2 | Head |
| FRAGMENT | MAP-WRITE | 10000 | 2 | |
| FRAGMENT | WRITE-RMAP | — | — | Write Remap Table |
| FRAGMENT | WRITE-DFL | — | — | Write Defect Lists |
| FRAG-ORIG | READ | 0 | 8 | |

The firmware launches the MAP-READ command knowing that sector 2 is bad and must be recovered. The rebuilt data is placed in private buffers that the MAP-WRITE command will use to write the recovered data to the remap location.

| | After Recovery of Lost Data | | | |
|---|---|---|---|---|
| Req Type | Command | Sec # | Cnt | Comments |
| FRAGMENT | MAP-WRITE | 10000 | 2 | Head |

-continued

| | After Recovery of Lost Data | | | |
|---|---|---|---|---|
| Req Type | Command | Sec # | Cnt | Comments |
| FRAGMENT | WRITE-RMAP | — | — | Write Remap Table |
| FRAGMENT | WRITE-DFL | — | — | Write Defect Lists |
| FRAG-ORIG | READ | 0 | 8 | |

The firmware launches the MAP-WRITE command to write the recovered data to the remap location.

| | After Write of Recovered Data to Remap Area | | | |
|---|---|---|---|---|
| Req Type | Command | Sec # | Cnt | Comments |
| FRAGMENT | WRITE-RMAP | — | — | Head |
| FRAGMENT | WRITE-DFL | — | — | Write Defect Lists |
| FRAG-ORIG | READ | 0 | 8 | |

The firmware now writes the new remap table onto a reserved area of the disks to complete the logical remap operation.

| | After Write of Remap Table | | | |
|---|---|---|---|---|
| Req Type | Command | Sec # | Cnt | Comments |
| FRAGMENT | WRITE-DFL | — | — | Head |
| FRAG-ORIG | READ | 0 | 8 | |

The firmware now updates the physical defect lists of all physical drives containing defective sectors. In this example, only one drive contained an error. If more than one drive contained an error, the WRITE-DFL command itself would be fragmented so that each WRITE-DFL command would update only one physical drive. See the "Write Physical Defects" section for further details.

| | After Write of Physical Defect Lists | | | |
|---|---|---|---|---|
| Req Type | Command | Sec # | Cnt | Comments |
| FRAG-ORIG | READ | 0 | 8 | Head |

Now that the remap is complete, the queue will be restored to its original state and we will start over. This will allow the read to complete using the Runtime Remapping method described below.

| | After Remap Complete | | | |
|---|---|---|---|---|
| Req Type | Command | Sec # | Cnt | Comments |
| ORIGINAL | READ | 0 | 8 | Head |

Manual Sector Remapping

In the following example, the host has requested that a sector remap be performed. Typically, this is done because a verify request reported an error. Without considering how the data is recovered, we will follow the manual remap process. The composite drive is a two drive non-redundant array and the sector to be remapped is sector 2.

| | Initial Request | | | |
|---|---|---|---|---|
| Req Type | Command | Sec # | Cnt | Comments |
| ORIGINAL | MAPTHIS | 2 | 1 | Head |

DDA decides to remap the stripe containing sectors 2 and 3 to a reserved area at sector 10000. Although not shown here, DDA remembers that the first drive in the data stripe is responsible for the remap since that is what the host specified. This is important to the defect list management and to the data recovery routines. Data on sector 3 must be recovered since is not involved in the original host request.

| | After Fragmentation | | | |
|---|---|---|---|---|
| Req Type | Command | Sec # | Cnt | Comments |
| FRAGMENT | MAP-READ | 2 | 2 | Head |
| FRAGMENT | MAP-WRITE | 10000 | 2 | |
| FRAGMENT | WRITE-RMAP | — | — | Write Remap Table |
| FRAGMENT | WRITE-DFL | — | — | Drive 1 Defect List |
| FRAG-ORIG | MAPTHIS | 2 | 1 | |

The firmware launches the MAP-READ command knowing that sector 1 is bad and does not have to be recovered. It will recover sector 1 if at all possible, however. The rebuilt data is placed in private buffers that the MAP-WRITE command will use to write the recovered data to the remap location.

| | After Recovery of Data | | | |
|---|---|---|---|---|
| Req Type | Command | Sec # | Cnt | Comments |
| FRAGMENT | MAP-WRITE | 10000 | 2 | Head |
| FRAGMENT | WRITE-RMAP | — | — | Write Remap Table |
| FRAGMENT | WRITE-DFL | — | — | Drive 1 Defect List |
| FRAG-ORIG | MAPTHIS | 2 | 1 | |

The firmware launches the MAP-WRITE command to write the recovered data to the remap location.

| | After Write of Recovered Data to Remap Area | | | |
|---|---|---|---|---|
| Req Type | Command | Sec # | Cnt | Comments |
| FRAGMENT | WRITE-RMAP | — | — | Head |
| FRAGMENT | WRITE-DFL | — | — | Drive 1 Defect List |
| FRAG-ORIG | MAPTHIS | 2 | 1 | |

The firmware now writes the new remap table onto a reserved area of the disks to complete the logical remap operation.

| | After Write of Remap Table | | | |
|---|---|---|---|---|
| Req Type | Command | Sec # | Cnt | Comments |
| FRAGMENT | WRITE-DFL | — | — | Head |
| FRAG-ORIG | MAPTHIS | 2 | 1 | |

The firmware now updates the physical defect list on drive 1 and calls the completion function for the MAP-THIS command. The queue is now empty.

Runtime Remapping

In the following example, we have a multi-sector read request that references a remap location. The composite drive is a two-plus-parity guarded array and the remapped sectors are sectors 2 through 3 which are remapped to sectors 10000 through 10001. This example describes the situation which would exist after the remapping describe above.

| Initial Request | | | | |
|---|---|---|---|---|
| Req Type | Command | Sec # | Cnt | Comments |
| ORIGINAL | READ | 0 | 8 | Head |

The host has issued a read request. The DDA firmware recognizes the remapped area and fragments the request.

| After First Fragmentation | | | | |
|---|---|---|---|---|
| Req Type | Command | Sec # | Cnt | Comments |
| FRAGMENT | READ | 0 | 2 | Head |
| FRAGMENT | READ | 2 | 6 | Remainder |
| FRAG-ORIG | READ | 0 | 8 | |

The DDA firmware performs the first read request since it is now contiguous.

| After Read of First Contiguous Block | | | | |
|---|---|---|---|---|
| Req Type | Command | Sec # | Cnt | Comments |
| FRAGMENT | READ | 2 | 6 | Head |
| FRAG-ORIG | READ | 0 | 8 | |

The DDA firmware again recognizes the remapped area and fragments the request again.

| After Second Fragmentation | | | | |
|---|---|---|---|---|
| Req Type | Command | Sec # | Cnt | Comments |
| FRAGMENT | READ | 10000 | 2 | Head |
| FRAGMENT | READ | 4 | 4 | Remainder |
| FRAG-ORIG | READ | 0 | 8 | |

The DDA firmware performs the read request on the remapped area since it is now contiguous.

| After Read of Second Contiguous Block | | | | |
|---|---|---|---|---|
| Req Type | Command | Sec # | Cnt | Comments |
| FRAGMENT | READ | 4 | 4 | Head |
| FRAG-ORIG | READ | 0 | 8 | |

The DDA firmware performs the read request on the remaining area since it is also contiguous.

| After Read of Last Contiguous Block | | | | |
|---|---|---|---|---|
| Req Type | Command | Sec # | Cnt | Comments |
| FRAG-ORIG | READ | 0 | 8 | Head |

The DDA firmware recognizes the FRAG-ORIG type at the head of the queue which signifies the completion of the ORIGINAL host request. It calls the completion function associated with the ORIGINAL request.

Write Physical Defects

When a remap occurs, DDA updates the physical defect lists of those drives whose errors caused the remap to happen. Since multiple drive errors are unlikely but could occur, DDA reserves just enough memory to process one drive at a time and uses the fragmentation process to support multiple drive errors. In the following example, three drives, drives 1, 2, and 3, contained errors which led to the remap. Since the WRITE-DFL can only exist as a fragment, that is all that is shown in this example.

| After Write of Remap Table | | | | |
|---|---|---|---|---|
| Req Type | Command | Sec # | Cnt | Comments |
| FRAGMENT | WRITE-DFL | — | — | Drives 1, 2 and 3 |
| FRAG-ORIG | READ | 0 | 8 | |
| ORIGINAL | READ | 0 | 8 | Failing Command |

We recognize that multiple drives must be updated by this request, so we fragment it.

| After Fragmentation 1 | | | | |
|---|---|---|---|---|
| Req Type | Command | Sec # | Cnt | Comments |
| FRAGMENT | WRITE-DFL | — | — | Drive 1 |
| FRAGMENT | WRITE-DFL | — | — | Drives 2 and 3 |
| FRAG-ORIG | READ | 0 | 8 | |
| ORIGINAL | READ | 0 | 8 | Failing Command |

We write the defect list to drive 1 since only one drive is specified by the first request.

| After Write 1 | | | | |
|---|---|---|---|---|
| Req Type | Command | Sec # | Cnt | Comments |
| FRAGMENT | WRITE-DFL | — | — | Drives 2 and 3 |
| FRAG-ORIG | READ | 0 | 8 | |
| ORIGINAL | READ | 0 | 8 | Failing Command |

We recognize that multiple drives must be updated by this request, so we fragment it.

| After Fragmentation 2 | | | | |
|---|---|---|---|---|
| Req Type | Command | Sec # | Cnt | Comments |
| FRAGMENT | WRITE-DFL | — | — | Drive 2 |
| FRAGMENT | WRITE-DFL | — | — | Drive 3 |
| FRAG-ORIG | READ | 0 | 8 | |
| ORIGINAL | READ | 0 | 8 | Failing Command |

We write the defect list to drive 2 since only one drive is specified by the first request.

| After Write 2 | | | | |
|---|---|---|---|---|
| Req Type | Command | Sec # | Cnt | Comments |
| FRAGMENT | WRITE-DFL | — | — | Drive 3 |
| FRAG-ORIG | READ | 0 | 8 | |
| ORIGINAL | READ | 0 | 8 | Failing Command |

We write the defect list to drive 3 since only one drive is specified by the first request.

| After Write 3 | | | | |
|---|---|---|---|---|
| Req Type | Command | Sec # | Cnt | Comments |
| FRAG-ORIG | READ | 0 | 8 | Head |

| After Write 3 | | | | |
|---|---|---|---|---|
| Req Type | Command | Sec # | Cnt | Comments |
| ORIGINAL | READ | 0 | 8 | Failing Command |

We have completed the WRITE-DFL operation.

Read/Write Combining

When multiple sequential read or write requests exist on the drive queue, DDA will combine those requests into single, large requests to enhance performance. This is especially effective for small writes on guarded arrays. If an error occurs, the requests are decombined and run as ORIGINALs to simplify error handling. In the following example, multiple, sequential disk reads are enqueued. The composite drive type is unimportant, but the maximum transfer size of the composite disk is 128.

| Initial Queue State | | | | |
|---|---|---|---|---|
| Req Type | Command | Sec # | Cnt | Comments |
| ORIGINAL | READ | 0 | 4 | Head |
| ORIGINAL | READ | 4 | 4 | |
| ORIGINAL | READ | 8 | 4 | |
| ORIGINAL | READ | 12 | 128 | |

DDA recognizes that the first four requests on the queue are sequential reads. It combines the first three, but not the fourth request since the transfer size would become greater than the maximum allowable size.

| After Combination of Requests | | | | |
|---|---|---|---|---|
| Req Type | Command | Sec # | Cnt | Comments |
| COMBINATION | READ | 0 | 12 | Head |
| COMB-ORIG | READ | 0 | 4 | |
| COMB-ORIG | READ | 4 | 4 | |
| COMB-ORIG | READ | 8 | 4 | |
| ORIGINAL | READ | 12 | 128 | Size too Large |

DDA performs the combination read successfully. It scans the queue and calls the completion function for every request satisfied by the combined read.

| After Completion of Combined Read | | | | |
|---|---|---|---|---|
| Req Type | Command | Sec # | Cnt | Comments |
| ORIGINAL | READ | 12 | 128 | Head |

Guarded Write Processing

Writes to guarded composite drives are complicated by the fact that parity sectors must be generated for each data stripe. When write encompass full data stripes, the parity sectors for those stripes can be generated directly. In other cases, a Read-Modify-Write (RMW) operation must be performed. RMW operations are performed through fragmentation. Therefore, the WRITE command itself is conditionally a META command. In the following example, several writes are enqueued on a two-plus-parity guarded composite drive. The maximum transfer size of the drive is 128.

| Initial Queue State | | | | |
|---|---|---|---|---|
| Req Type | Command | Sec # | Cnt | Comments |
| ORIGINAL | WRITE | 0 | 2 | Head |
| ORIGINAL | WRITE | 4 | 1 | |
| ORIGINAL | WRITE | 8 | 3 | |
| ORIGINAL | WRITE | 11 | 5 | |
| ORIGINAL | WRITE | 21 | 2 | |
| ORIGINAL | WRITE | 23 | 4 | |

The first request cannot be combined but is stripe aligned. DDA fragments it into a single RMW-WRITE operation to simplify error handling.

| After Fragment 1 | | | | |
|---|---|---|---|---|
| Req Type | Command | Sec # | Cnt | Comments |
| FRAGMENT | RMW-WRITE | 0 | 2 | Head |
| FRAG-ORIG | WRITE | 0 | 2 | Was ORIGINAL |
| ORIGINAL | WRITE | 4 | 1 | |
| ORIGINAL | WRITE | 8 | 3 | |
| ORIGINAL | WRITE | 11 | 5 | |
| ORIGINAL | WRITE | 21 | 2 | |
| ORIGINAL | WRITE | 23 | 4 | |

DDA the executes the RMW-WRITE operation and calls the WRITE completion function.

| After Write 1 | | | | |
|---|---|---|---|---|
| Req Type | Command | Sec # | Cnt | Comments |
| ORIGINAL | WRITE | 4 | 1 | Head |
| ORIGINAL | WRITE | 8 | 3 | |
| ORIGINAL | WRITE | 11 | 5 | |
| ORIGINAL | WRITE | 21 | 2 | |
| ORIGINAL | WRITE | 23 | 4 | |

The next request cannot be combined and is not stripe aligned. DDA fragments it into read and write phase. The write phase is capable of generating the parity data on demand. The read phase must start and end on a stripe boundary and must entirely contain the data to be written.

| After Fragment 2 | | | | |
|---|---|---|---|---|
| Req Type | Command | Sec # | Cnt | Comments |
| FRAGMENT | RMW-READ | 4 | 2 | Head |
| FRAGMENT | RMW-WRITE | 4 | 1 | |
| FRAG-ORIG | WRITE | 4 | 1 | Was ORIGINAL |
| ORIGINAL | WRITE | 8 | 3 | |
| ORIGINAL | WRITE | 11 | 5 | |
| ORIGINAL | WRITE | 21 | 2 | |
| ORIGINAL | WRITE | 23 | 4 | |

DDA executes the RMW-READ operation.

| After Read 2 | | | | |
|---|---|---|---|---|
| Req Type | Command | Sec # | Cnt | Comments |
| FRAGMENT | RMW-WRITE | 4 | 1 | Head |
| FRAG-ORIG | WRITE | 4 | 1 | Was ORIGINAL |
| ORIGINAL | WRITE | 8 | 3 | |
| ORIGINAL | WRITE | 11 | 5 | |
| ORIGINAL | WRITE | 21 | 2 | |
| ORIGINAL | WRITE | 23 | 4 | |

DDA the executes the RMW-WRITE operation and calls the WRITE completion function.

After Write 2

| Req Type | Command | Sec # | Cnt | Comments |
|---|---|---|---|---|
| ORIGINAL | WRITE | 8 | 3 | Head |
| ORIGINAL | WRITE | 11 | 5 | |
| ORIGINAL | WRITE | 21 | 2 | |
| ORIGINAL | WRITE | 23 | 4 | |

DDA Combines the next two writes.

After Combine 3

| Req Type | Command | Sec # | Cnt | Comments |
|---|---|---|---|---|
| COMBINATION | WRITE | 8 | 8 | Head |
| COMB-ORIG | WRITE | 8 | 3 | |
| COMB-ORIG | WRITE | 11 | 5 | |
| ORIGINAL | WRITE | 21 | 2 | |
| ORIGINAL | WRITE | 23 | 4 | |

The combined write is stripe-aligned so it is fragmented into a RMW-WRITE operation.

After Fragment 3

| Req Type | Command | Sec # | Cnt | Comments |
|---|---|---|---|---|
| FRAGMENT | RMW-WRITE | 8 | 8 | Head |
| FRAG-COMB | WRITE | 8 | 8 | Was COMBINATION |
| COMB-ORIG | WRITE | 8 | 3 | |
| COMB-ORIG | WRITE | 11 | 5 | |
| ORIGINAL | WRITE | 21 | 2 | |
| ORIGINAL | WRITE | 23 | 4 | |

DDA the executes the RMW-WRITE operation, recognizes the completion of a COMBINATION, and calls the completion functions that are satisfied by the combined write.

After Write 3

| Req Type | Command | Sec # | Cnt | Comments |
|---|---|---|---|---|
| ORIGINAL | WRITE | 21 | 2 | Head |
| ORIGINAL | WRITE | 23 | 4 | |

DDA Combines the next two writes.

After Combine 4

| Req Type | Command | Sec # | Cnt | Comments |
|---|---|---|---|---|
| COMBINATION | WRITE | 21 | 6 | Head |
| COMB-ORIG | WRITE | 21 | 2 | |
| COMB-ORIG | WRITE | 23 | 4 | |

The combined write is not stripe-aligned so it is fragmented into read and write phases. The read phase must start and end on a stripe boundary and must entirely contain the data to be written.

After Fragment 4

| Req Type | Command | Sec # | Cnt | Comments |
|---|---|---|---|---|
| FRAGMENT | RMW-READ | 20 | 8 | Head |
| FRAGMENT | RMW-WRITE | 21 | 6 | |
| FRAG-COMB | WRITE | 21 | 6 | |
| COMB-ORIG | WRITE | 21 | 2 | |
| COMB-ORIG | WRITE | 23 | 4 | |

DDA executes the RMW-READ operation.

After Read 4

| Req Type | Command | Sec # | Cnt | Comments |
|---|---|---|---|---|
| FRAGMENT | RMW-WRITE | 21 | 6 | Head |
| FRAG-COMB | WRITE | 21 | 6 | |
| COMB-ORIG | WRITE | 21 | 2 | |
| COMB-ORIG | WRITE | 23 | 4 | |

DDA then executes the RMW-WRITE operation, recognizes the completion of a COMBINATION, and calls the completion functions that are satisfied by the combined write. The queue is now empty.

Write+Verify Operation

Host software frequently desires to perform a verify operation after each write operation to insure that the data written is readable. This request appears as a special WRITEVERF command on the DDA drive queue. Since IDE drives do not support verify-after-write operations, DDA uses the fragmentation operation to perform the WRITEVERF command. Therefore, WRITEVERF is always a META command and takes advantage of the fact that WRITE and VERIFY are already implemented to provide this function in essentially no additional code.

Initial Queue State

| Req Type | Command | Sec # | Cnt | Comments |
|---|---|---|---|---|
| ORIGINAL | WRITEVERF | 0 | 4 | Head |

DDA fragments the WRITEVERF command into WRITE and VERIFY commands.

After Fragmentation

| Req Type | Command | Sec # | Cnt | Comments |
|---|---|---|---|---|
| FRAGMENT | WRITE | 0 | 4 | Head |
| FRAGMENT | VERIFY | 0 | 4 | |
| FRAG-ORIG | WRITEVERF | 0 | 4 | |

DDA performs the WRITE.

After Write

| Req Type | Command | Sec # | Cnt | Comments |
|---|---|---|---|---|
| FRAGMENT | VERIFY | 0 | 4 | Head |
| FRAG-ORIG | WRITEVERF | 0 | 4 | |

DDA performs the VERIFY and calls the completion function. The queue is now empty.

Host Reset Processing

Host software frequently sends a reset command to the controller to set the controller into a known state either on power-up or following a drive error. Resets involve a number of consecutive operations. Therefore, the RESET command is implemented as a META command. DDA does not generate RESET commands internally. The following is an example of a RESET command.

| | Initial Queue State | | | |
|---|---|---|---|---|
| Req Type | Command | Sec # | Cnt | Comments |
| ORIGINAL | RESET | — | — | Head |

DDA fragments the RESET command into the required pieces.

| | After Fragmentation | | | |
|---|---|---|---|---|
| Req Type | Command | Sec # | Cnt | Comments |
| FRAGMENT | RAWRESET | — | — | Head |
| FRAGMENT | SETPARMS | — | — | |
| FRAGMENT | SETBUFF | — | — | |
| FRAGMENT | SETMULT | — | — | |
| FRAG-ORIG | RESET | — | — | |

Each fragment on the queue at this point is atomic. The commands on the queue are the minimum required by the DDA firmware to reset the physical drives as set them into the correct state.

Drive Status Update

In a redundant composite drive, physical drives can fail without causing the composite drive to become unusable. When this occurs, physical drive status must be tracked by DDA. In the event of a total drive failure, DDA continues to allow data requests on the drive until a write involving a failed disk is requested. At this point, DDA must mark the disk as permanently unusable before performing the write since the data on the failed disk will become invalid. DDA stores this information on the remaining physical disk which make up the composite drive.

In the following example, the first drive of a two-plus-parity guarded array has failed. The firmware continues to operate until a write operation involving drive 1 appears at the head of the queue.

| | Initial Queue State | | | |
|---|---|---|---|---|
| Req Type | Command | Sec # | Cnt | Comments |
| ORIGINAL | WRITE | 0 | 4 | Head |

DDA fragments the WRITE command into a WRITE and a WRITE-STAT command.

| | After Fragmentation | | | |
|---|---|---|---|---|
| Req Type | Command | Sec # | Cnt | Comments |
| FRAGMENT | WRITE-STAT | 0 | 4 | Head |
| FRAGMENT | WRITE | 0 | 4 | Copy of ORIGINAL |
| FRAG-ORIG | WRITE | 0 | 4 | |

DDA performs the WRITE-STAT command to invalidate drive 1. Notice that the actual host WRITE cannot occur until after the successful completion of the WRITE-STAT command. This insures that an ill-timed power failure cannot corrupt the state of the host's data.

| | After Status is Updated | | | |
|---|---|---|---|---|
| Req Type | Command | Sec # | Cnt | Comments |
| FRAGMENT | WRITE | 0 | 4 | Head |

| | After Status is Updated | | | |
|---|---|---|---|---|
| Req Type | Command | Sec # | Cnt | Comments |
| FRAG-ORIG | WRITE | 0 | 4 | |

DDA performs the WRITE that was originally requested by executing the FRAGMENT at the head of the queue. It then calls the completion function for the ORIGINAL write. The queue is now empty.

On every array access, controller 100 searches its remap tables to determine whether the requested access will include one or more of the remapped stripes. If a remapped stripe occurs in a requested access, then the requested access is split into multiple accesses in which the accesses to relocated sectors are remapped to their new locations. For example, a read or write requesting access to the stripe of sectors 120-124 plus the stripes of the sectors immediately preceding and following each of sectors 120-124 on the same track on each of the platters would be split from a simple operation accessing three successive stripes to one accessing the remapped sectors 120-124 (e.g., sectors 140-144) plus one accessing the original immediately preceding and following sectors. Thus the read/write heads would seek two different tracks during the operation. The following example more explicitly shows the queue in controller 100 during a multisector read that includes a sector with a grown defect; the first portion of the example shows the dynamic remapping.

Presume that the host requests a read of 20 sectors beginning at sector $0^2$ with array setup for redundancy; thus five stripes of data are to be read. Also, presume that sector 9 has developed a hard error defect. Thus the initial request in the queue looks like (in simplified version for clarity):
[2](For simplicity, logical sector numberings will be used in this example.)

| Request Type | Command | Sector No. | Sector count |
|---|---|---|---|
| Original | Read | 0 | 20 |

The first column shows that the Read from the host was an Original request in the sense that it derived from an outside source. The second column illustrates the command from controller 100 to the disk drives 110-114. The third column states the starting sector number (as seen by the host), and the fourth column indicates the number of contiguous sectors to be read. Now bad sector 9 cannot be read by its disk drive (disk drive 111), so controller 100 receives an error message from this disk drive. Controller 100 then attempts to isolate the error by sending a Verify-NR command to the disk drives 110-114 which is a logical disk drive verify operation to test integrity of sectors; the queue with this Verify-NR command now at the head of the queue appears as:

| Request Type | Command | Sector No. | Sector count |
|---|---|---|---|
| Fragment | Verify-NR | 0 | 20 |
| Frag-Orig | Read | 0 | 20 |

The Verify-NR command is called a Fragment type request in that the original request has been fragmented in order to isolate the error; the change of type from Original to Frag-Orig for the host's Read request reflects this fragmentation. The Verify-NR operation reports to controller 100 that sector 9 has failed. Controller 100 then selects a reserved stripe, say sectors 50,000 through 50,003 plus the corresponding unnumbered parity sector, for remapping the stripe with failed sector 9; that is, the stripe formed by sectors 8 through 11 plus parity sector. Controller 100 then inserts the commands for the remapping into queue which then appears as:

| Request Type | Command | Sector No. | Sector count |
|---|---|---|---|
| Fragment | Rawreset | — | — |
| Fragment | Setparms | — | — |
| Fragment | Setbuff | — | — |
| Fragment | Setmult | — | — |
| Fragment | Map-Read | 8 | 4 |
| Fragment | Map-Write | 50000 | 4 |
| Fragment | Wrt-Rmp | — | — |
| Fragment | Wrt-DFL | — | — |
| Frag-Orig | Read | 0 | 20 |

The first four commands inserted into the queue provide a reset of the disk drives; and after the disk drives execute these commands the queue looks like:

| Request Type | Command | Sector No. | Sector count |
|---|---|---|---|
| Fragment | Map-Read | 8 | 4 |
| Fragment | Map-Write | 50000 | 4 |
| Fragment | Wrt-Rmp | — | — |
| Fragment | Wrt-DFL | — | — |
| Frag-Orig | Read | 0 | 20 |

Controller 100 knows that sector 9 has failed and the Map-Read command for the stripe containing sector 9 and uses the parity sector to rebuild the data lost in sector 9 and stores the entire stripe of data in buffers. Thus the queue is now:

| Request Type | Command | Sector No. | Sector count |
|---|---|---|---|
| Fragment | Map-Write | 50000 | 4 |
| Fragment | Wrt-Rmp | — | — |
| Fragment | Wrt-DFL | — | — |
| Frag-Orig | Read | 0 | 20 |

Controller 100 now launches the Map-Write command to write the rebuilt data in the buffers to the stripe starting at sector 50,000, so the queue becomes

| Request Type | Command | Sector No. | Sector count |
|---|---|---|---|
| Fragment | Wrt-Rmp | — | — |
| Fragment | Wrt-DFL | — | — |
| Frag-Orig | Read | 0 | 20 |

Controller 100 uses Writ-Rmp to write the new remap table onto a reserved area of the disk drives to complete the logical remap operation. Thus the queue is:

| Request Type | Command | Sector No. | Sector count |
|---|---|---|---|
| Fragment | Wrt-DFL | — | — |
| Frag-Orig | Read | 0 | 20 |

The Wrt-DFL command causes controller 100 to update its physical defect lists of all physical drives containing defective sectors. In this example, only one disk drive contained an error; if more than one drive contained an error, then the Wrt-DFL command itself would be fragmented so that each Wrt-DFL command would update only one physical disk drive error. Now the queue contains a single command:

| Request Type | Command | Sector No. | Sector count |
|---|---|---|---|
| Frag-Orig | Read | 0 | 20 |

Thus the remapping is complete and now the queue will have been restored to its original state and the host's Read request will be recast as an Original request. The execution of the Read request will now use runtime remapping because controller 100 will see that one of the stripes to be read has been remapped. In particular, controller 100 will again fragment the host's Read request and insert commands into the queue as follows:

| Request Type | Command | Sector No. | Sector count |
|---|---|---|---|
| Fragment | Read | 0 | 8 |
| Fragment | Read | 8 | 12 |
| Frag-Orig | Read | 0 | 20 |

The first Read of sectors 0 through 7 can proceed because the stripes are contiguous, and the queue becomes:

| Request Type | Command | Sector No. | Sector count |
|---|---|---|---|
| Fragment | Read | 8 | 12 |
| Frag-Orig | Read | 0 | 20 |

The remapped stripe causes a further fragmentation:

| Request Type | Command | Sector No. | Sector count |
|---|---|---|---|
| Fragment | Read | 50000 | 4 |
| Fragment | Read | 12 | 8 |
| Frag-Orig | Read | 0 | 20 |

The disk drives execute the Read of the remapped stripe to leave the queue as:

| Request Type | Command | Sector No. | Sector count |
|---|---|---|---|
| Fragment | Read | 12 | 8 |
| Frag-Orig | Read | 0 | 20 |

The Read again executes because the stripes are now contiguous. Thus the queue is:

| Request Type | Command | Sector No. | Sector count |
|---|---|---|---|
| Frag-Orig | Read | 0 | 20 |

Controller 100 recognizes the Frag-Orig at the head of the queue signifies completion of the original Read request from the host and calls the completion function associated with the original Read request.

Controller 100 can also associate multiple operations with a single request from the host in order to decompose a complex request to simple, fully restartable requests sequences for error handling.

Controller 100 will combine multiple sequential read or write requests in the controller 100 queue in order to access increase efficiency by having larger blocks read or written. For example, if the maximum transfer size of controller 100 is 128 sectors (64 KB) due to the size of its buffers, and if the following requests are pending in the request queue:

| Request Type | Command | Sector No. | Sector count |
|---|---|---|---|
| Original | Read | 0 | 11 |
| Original | Read | 11 | 17 |
| Original | Read | 28 | 2 |
| Original | Read | 30 | 110 |
| Original | Read | 140 | 10 |

Controller 100 recognizes the five requests as sequential, but cannot combine them all because this would exceed the transfer size. Thus controller 100 combines the first three requests and the queue appears as:

| Request Type | Command | Sector No. | Sector count |
|---|---|---|---|
| Combination | Read | 0 | 30 |
| Comb-Orig | Read | 0 | 11 |
| Comb-Orig | Read | 11 | 17 |
| Comb-Orig | Read | 28 | 2 |
| Original | Read | 30 | 110 |
| Original | Read | 140 | 10 |

Controller 100 successfully performs the combination Read, scans the queue, and calls the completion function for every request satisfied by the combination Read. Then controller 100 continues with the queue looking like

| Request Type | Command | Sector No. | Sector count |
|---|---|---|---|
| Original | Read | 30 | 110 |
| Original | Read | 140 | 10 |

Controller 100 combines these two reads as before and reads them together.

Scatter/Scatter

The system of the presently preferred embodiment provides "scatter/scatter" accesses, in which both the physical locations of data in host memory and the physical locations of data on the disks can be discontiguous. That is, the host can send a single request to launch such a scatter/scatter transfer. Arguments to such a transfer request would include: a pointer to a list of transfer counts and addresses in host memory containing the data to be transferred; the length of that list; and the starting logical address on the disk for transfer.

Note that the host need not know the configuration that the data array will have on the disk.

Skipped blocks i a scatter-scatter request are specified by a data address value of −1. Thus, when a block must be skipped, the controller enqueues a "nop" (no-operation) request. Note that the presently preferred embodiment enqueues these nop requests, if needed, even if the data transferred is in contiguous addresses on the host memory side.

Any disk operation, in the presently preferred embodiment, is limited to a set maximum number of blocks of logical disk address space (currently 256). Thus, no scatter/scatter request can cover more than 254 skipped blocks.

The scatter-handling operations just described are implemented, in the presently preferred embodiment, using the controller's native mode described below.

Figure 12:
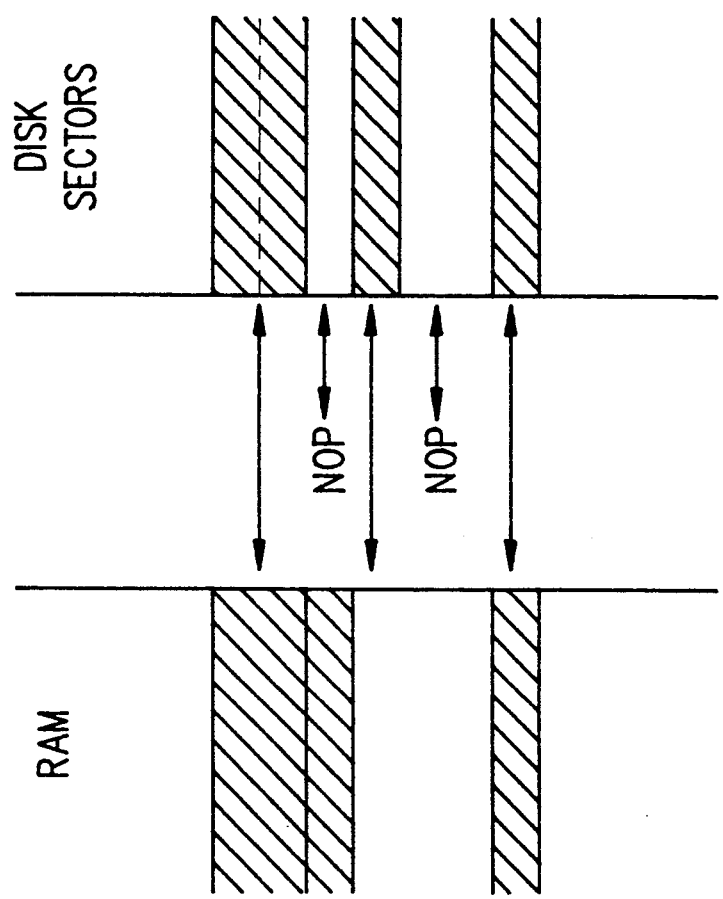
FIGS. 12-13 illustrate scatter/scatter.

Controller 100, via bus master 108, may also write the data obtained from such combined requests to physically scattered portions of the host RAM. That is, a scatter/scatter as suggested in FIG. 12 with the host requesting reads into three separated portions of its RAM and for data on three stripes with noncontiguous sectors but with sectors on a single track in each disk drive. The read requests are combined by controller 100 because the sectors can all be read in a single revolution of the disk drives' platters, and the transfer back to the RAM can be accomplished by bus master 108. Note that the usual scatter/gather consists of gathering scattered portions of host RAM to contiguous sectors on disk, or gathers scattered sectors on disk to contiguous portions of host RAM.

Figure 13:
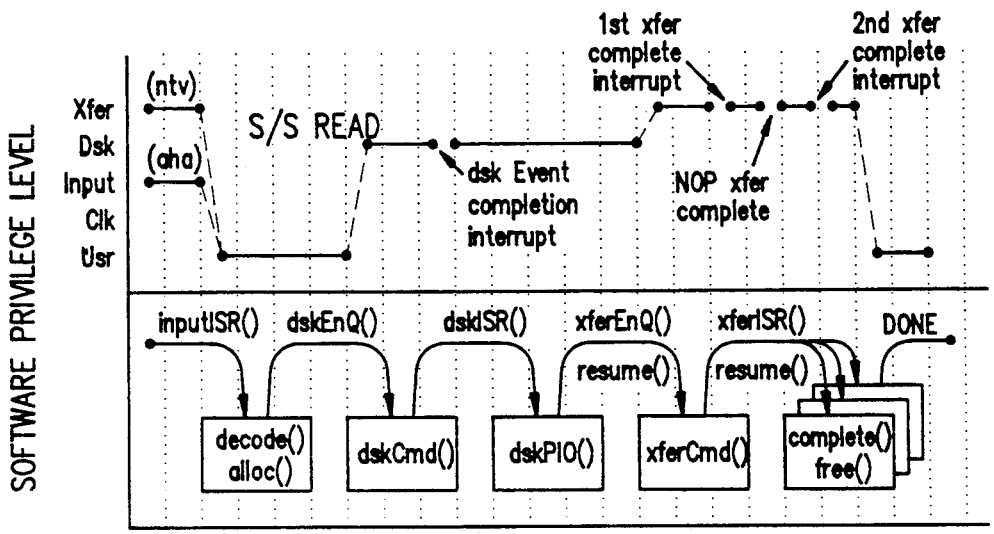
Figure 13:
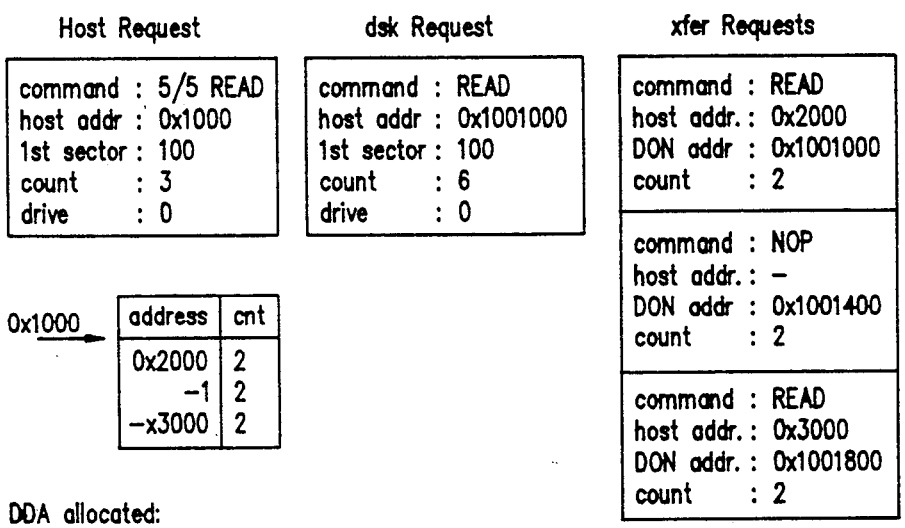

FIG. 13 illustrates a simple scatter/scatter read in a format analogous to that of FIG. 8. In particular, the example in FIG. 13 starts with a request from the host to read from disk 0 the data in logical sectors 100-101 (1 KB) and put it into 1 K of host memory beginning at address 2000 (in hexadecimal) plus the data in logical sectors 104-105 (1 KB) into 1 K of host memory locations beginning at address 3000. The request has the format of an address (1000) for a pointer which points to a list of the addresses 2000 and 3000 together with the count of sectors for each; the list also indicates the skipping of sectors 102-103 by the address −1 and count of 2 as the second list entry. Controller 100 decodes this request and allocates six read buffers (one for each of sectors 100-105) plus a disk request (dskRequest) and three transfer requests (xferRequest); note that a fork counter is set to three and a join counter to zero to keep track of the completions of the three transfer requests. The disk request has a READ command (disk to buffer) for the read of six contiguous sectors beginning at sector 100 into 3 K of contiguous controller 100 buffer memory starting at address 1001000 (hexadecimal). Thus this is a single read which includes the desired data in sectors 100-101 and 104-105 plus the not needed data in sectors 102-103. The data from sectors 100-101 goes into buffer memory at addresses 1001000-10013FF, the data from sectors 102-103 goes into buffer memory at addresses 1001400-10017FF, and the data from sectors 104-105 goes into buffer memory at addresses 1001800-1001BFF. There is one of the three transfer request for each of these three address ranges. The transfer requests for the desired data each has a READ command (buffer to host) with the target host memory starting address, the buffer starting address, and the size count (in terms of sectors); that is, the first transfer request has beginning target address 2000 and buffer starting address 1001000, and the third transfer request has beginning target address 300 and buffer starting address 1001800. The transfer request for the unneeded data has a NOP (no operation) command instead of the READ command and has no target host memory address, but does have the starting buffer address 1001400. As each of the transfer requests completes, the corresponding buffer memory becomes free and available for use by other processes and the join count increments.

Note that controller 100 extends the scattered read from the logical disk into a single large read of contiguous sectors into buffers and then suppresses the unwanted data without changing the request structures by simply inserting a NOP command in place of the READ command for the buffer to host transfer.

Guarded Optimization

Writes in guarded configuration are actually read-modify-write (RMW) operations. Note that RMW operations are an example of the use of "fence pointers" as above. As noted, when doing a small write in guarded configuration, the DDA accesses either of two complementary sets of drives, depending on which is coming up sooner.

Rebuilding

In rebuilding data, a problem is that there is likely to be a large seek time going over to the rebuild data area. Thus, it is desirable to avoid thrashing going to and from the rebuild data area.

The DDA has two relevant tunable parameters (see FIG. 6):

1) Amount of idle time before we initiate a rebuild;
2) maximum number of requests which may be processed before a rebuild operation is forced to occur.

The advantage of this is that rebuild is guaranteed to complete within some determined time.

Rebuild operations too are implemented using the above queue-management architectures. Fence markers can be used to protect a minimum-length rebuild operation from interruption by new requests.

Relevance to Error-handling and Recovery

When recovering from an error, a failed drive must be reset. Fragmentation queue-handling is used for this too: a reset operation request is pushed onto the stack.

It may happen that an error occurs during recovery from an error. The advantage of fragmentation into atomic operations is that the DDA can cope with this without having to create nested error handling routines (which are a nuisance).

Hardware Architecture

Following is additional detail on the actual hardware implementation and register assignments used.

80960KA Side Global Memory I/O Map

Following is the present assignment of this map:

| Address | Function | Notes |
|---|---|---|
| 0 × 00000000-0 × 000FFFFF | ROM | not all populated |
| 0 × 01000000-0 × 0100FFFF | SRAM | Normal Addressing |
| 0 × 01040000-0 × 0104FFFF | SRAM | Permuted High |
| 0 × 01080000-0 × 0108FFFF | SRAM | Permuted Low |
| 0 × 03000000-0 × 03FFFFFF | Drives | Special mapping (see below) |
| 0 × 04000000-0 × 04FFFFFF | Local I/O | See below |
| 0 × 08000000-0 × 08FFFFFF | DRAM | Normal Addressing |
| 0 × 09000000-0 × 09FFFFFF | DRAM | Permuted High |
| 0 × 0A000000-0 × 0AFFFFFF | DRAM | Permuted Low |
| 0 × FF000000-0 × FFFFFFFF | Intel Reserved | IACs, etc. |

The address spaces are incompletely decoded, and a register or memory location may be aliased to many other places.

ROM Map

Static RAM Map

The DDA contains 256K bytes of static RAM. It is made out of eight 32KX8 SRAMs which are interleaved to achieve one wait state bursts on the 80960 LBUS and on the BMICs TDAT bus.

Dynamic RAM Map

The dynamic RAM map reserves three 16 Mbyte regions for the optional cache which behave like the static RAM regions described above.

Dual Port RAM Map

The register emulation works by dual porting the first 32 bytes of the static RAM mentioned above, although all 32 bytes are not defined, the undefined bytes in this region are reserved and will get trashed by the hardware.

AHA-1542 Mode

| EISA Address [1 ... 0] | RAM Address Read | RAM Address Write |
|---|---|---|
| 0 × 0 | 0 × 0100002 | 0 × 01000004 |
| 0 × 1 | 0 × 0100006 | 0 × 01000008 |
| 0 × 2 | 0 × 010000A | 0 × 0100000C |
| 0 × 3 | 0 × 010000E | 0 × 01000010 |

After a write of 0×80, 0×40, or 0×20 to EISA address [1 ... 2]==0 (i.e. DDA address (0×01000004), EISA reads from EISA address [1 ... 2]==2 (nominally DDA address 0×010000A) will come from DDA address 0×0100001C until RE2 is strobed low. This allows AHA resets to automatically clear the interrupt status.

IDE Drive Map

The mapping of the IDE drive task files has been optimized so that the 80960 can perform load and store multiples in which all the drives can be accessed in a single instruction which results in a burst access on the 80960's LBUS. This burst access will allow the hardware to interleave the accesses to the IDE drives and get a 1 clock access on the second two drives compared to a three clock access for the first two drives. The drives are accessed two drives per word on typical operations. All drives are also aliased to another location in which all their registers overlap. This is write only and is used to send the same command to up to five drives in one access.

The memory map for the drives is contained in a 256 byte region which is depicted in the following table.

| | Drive 3 | Drive 2 | Drive 1 | Drive 0 | Drive 4 | All Drives |
|---|---|---|---|---|---|---|
| A3–A0 A7–A4 | 0b0110 | 0b0100 | 0b0010 | 0b0000 | 0b1010 | 0b11 × 0 |
| 0b0000 | Data | Data | Data | Data | Data | Data |
| 0b0001 | Error | Error | Error | Error | Error | Error |
| 0b0010 | Sec Cnt | Sec Cnt | Sec Cnt | Sec Cnt | Sec Cnt | Sec Cnt |
| 0b0011 | Sec Num | Sec Num | Sec Num | Sec Num | Sec Num | Sec Num |
| 0b0100 | Cyl Low | Cyl Low | Cyl Low | Cyl Low | Cyl Low | Cyl Low |
| 0b0101 | Cyl High | Cyl High | Cyl High | Cyl High | Cyl High | Cyl High |
| 0b0110 | Drive Status | Drive Status | Drive Status | Drive Status | Drive Status | Drive Status |
| 0b0111 | | | | | | |
| 0b1110 | Alt Stat | Alt Stat | Alt Stat | Alt Stat | Alt Stat | Alt Stat |
| 0b1111 | Drv | Drv | Drv | Drv | Drv | Drv |

-continued

| Drive 3 | Drive 2 | Drive 1 | Drive 0 | Drive 4 | All Drives |
|---------|---------|---------|---------|---------|------------|
| Addr | Addr | Addr | Addr | Addr | Addr |

Drives 0 and 2 are attached to the low 16 bits of the data bus, drives 1, 3, and 4 are connected to the high 16 bits of the data bus. When writing to all drives, the write data must be duplicated on the high and low halves of the data bus by software.

There are two drives on each cable. Drives 0 through 4 are accessed on cables 1 through 5 correspondingly, and drives 5 through 9 are also accessed on cables 1 through 5 correspondingly. The upper five drives are addressed at 0×0900 plus the addresses in the above table.

BMIC Map

The BMIC occupies a block of 16 bytes in the address space.

| Address | Register | Size | Function |
|---------|----------|------|----------|
| 0 × 04000000 | LDR | 8 bits | Local Data Register |
| 0 × 04000004 | LIR | 8 bits | Local Index Register |
| 0 × 04000008 | LSR | 8 bits | Local Status/Control Register |
| 0 × 0400000C | | 8 bits | Intel Reserved |

The BMIC uses an indexed I/O scheme. For individual register index locations see the Intel documentation.

8254 Map

| Address | Register | Size | Function |
|---------|----------|------|----------|
| 0 × 04000101 | | 8 bits | |
| 0 × 04000105 | | 8 bits | |
| 0 × 04000109 | | 8 bits | |
| 0 × 0400010D | | 8 bits | |

DDA local I/O Ports

The DDA local I/O ports are located at:

| Address | Register | Size | Function |
|---------|----------|------|----------|
| 0 × 04000202 | INT-STAT | 8 bits | Interrupt Status Register |
| 0 × 04000202,3 | IDE-RESET | 16 bits | IDE Drive reset control |
| 0 × 04000300 | INTF-CNTL | 8 bits | Interface Control Register |
| 0 × 04000301 | INTF-STAT | 8 bits | Interface Status Register |

INTF-CNTL Interface Control Register

The assignments of this register are as follows:

| 7 | 6-5 | 4 | 3 | 2 | 1 | 0 |
|---|-----|---|---|---|---|---|
| ROM0 | INTL10 | AHA | DMA17U | NDRESET | ROM1 | (not currently used) |

ROM Enables the expansion card ROM BIOS and chooses its address.

| 00 | ROM disabled |
| 01 | ROM enabled at 0 × c800 |
| 10 | ROM enabled at 0 × cc00 |
| 11 | ROM enabled at 0 × d800 |

INTL Determines the cards EISA interrupt level.

| 00 | Interrupt 15 |
| 01 | Interrupt 14 |
| 10 | Interrupt 12 |
| 11 | Interrupt 11 |

AHA Indicates which type of interface DDA is currently emulating.

| 1 | WD 1003 task file register set |
| 0 | AHA-1542 register set |

DMA17 Address bit 17 for DMA transfers.
NDRESET IDE Drive's RESET line.

INTF-STAT-Interface Status Register

Assignments in this register are as follows:

| 7-4 | 3 | 2 | 1-0 |
|-----|---|---|-----|
| RegAddr | DF | CDF | DGHT-PRES |

Reg Addr Indicates the last register read or written by the host see section 7.5 on page 16 for the exact mapping.
DF Indicates the state of the AHA DF flag.
CDF Indicates the state of the AHA CDF flag.
DHGT-PRES (two bits) Indicates the type and presence of a daughtercard.

INT-STAT-Interrupt Status Register

| 7 | 6 | 5 | 4 | 3 | 2 | 1 | 0 |
|---|---|---|---|---|---|---|---|
| TEOP_ | DEOP_ | DGHT_INT | H5INT | H4INT | H3INT | H2INT | H1INT |

TEOP_Indicates that the last burst terminated but was interrupted by a register cycle
DEOP_Indicates that a task file PIO transfer has completed.
DGHT_INT Indicates that the daughter card needs servicing.
H5INT Indicates a drive interrupt from either master on drive connector 5.
H4INT Indicates a drive interrupt from either master on drive connector 4.
H3INT Indicates a drive interrupt from either master on drive connector 3.
H2INT Indicates a drive interrupt from either master on drive connector 2.
H1INT Indicates a drive interrupt from either master on drive connector 1.

IDE-RESET—IDE Reset Control Register

| F | E | D | C | B | A | 9 | 8 | 7 | 6 |
|---|---|---|---|---|---|---|---|---|---|
| CLRINT1 | SETMINT | NO_REG | CCDF | SDF | DRQA1 | DRQA0 | DRQen | RE2 | RE1 |

CLRINT1 Clears the interrupt gate.
SETMINT Sets the EISA interrupt described by INTL
CCDF Clears the AHA CDF flag in the status register in AHA mode. Also used to clear the busy status in the status register in WD1003 mode.

| 0 | Clear it |
|---|---|
| 1 | Don't clear it |

SDF Sets the AHA CDF flag in the status register in AHA mode.

| 0 | Don't set it |
|---|---|
| 1 | Set it |

NO_REG Stops emulation register cycles from clearing the DMA counter (Commonly referred to as the NO_REG state.)
DRQA Indicates which of the four supported lines is asserted

| 0 | DRQ0 |
|---|---|
| 1 | DRQ6 |
| 2 | DRQ5 |
| 3 | DRQ7 |

DRQen Enables the deassertion of the DRQ lines
RE2, RE1, RE0 This gates (logical "1") or allows ("0") the DEOP_signal to set busy.

EISA Side I/O Map

The EISA side I/O map consists of two regions which are implemented in two pieces of hardware:
  The slot specific shared I/O registers in the BMIC at addresses 0×XC80-0×C9F.
  The Adaptec AHA-154x register set which is emulated by dual porting the SRAM.

Interrupts

The interrupts in descending priority are:
BMIC,
Register Emulation,
IDE drives, and
System clock.

AHA Mode: AHA-1540 Register Set Emulation

The AHA-1540 register set consists of three eight bit registers. The base address of these registers can be set at addresses:
  0×0334 which is the default
  0×0330
  0×0234
  0×0230
  0×0134
  0×0130

The register set is:

| Address | Read | Write |
|---|---|---|
| Base | Status Register | Control Register |
| Base + 1 | Data In Register | Command Register |
| Base + 2 | Interrupt Flags Register | Reserved |

A write to any of the AHA-1540 registers will generate an interrupt to processor 208.

Status Register

| 7 | 6 | 5 | 4 | 3 | 2 | 1 | 0 |
|---|---|---|---|---|---|---|---|
| STST | DIAGF | INIT | IDLE | CDF | DF | 0 | INVDCMD |

STST self test in progress.
DIAGF Diagnostics failed.
INIT Mailbox initialization required.
IDLE Host adapter idle.
CDF Command/Data out port full—The host uses CDF to synchronize command and data transfers to the host adapter. An adapter command byte or an outbound parameter can be placed in the command-/data out port when the port is empty, indicated by the CDF bit being zero. When a byte is placed in the command/data out port, the CDF bit is set to one and remains one until the host adapter has read the byte. When the CDF bit returns to zero, the next command or parameter byte can be placed in the port.
DF Data in port full—The host uses DF to synchronize transfers of data from the host adapter to the host. When the DF bit is set to one, the host adapter has placed a byte in the data in port for the host to remove. When the host performs a read from the data in port address, the DF bit is cleared to zero and not set to one again until a new data byte has been placed in the data in port.
INVDCMD Invalid host adapter command.

Control Register

| 7 | 6 | 5 | 4 | 3 | 2 | 1 | 0 |
|---|---|---|---|---|---|---|---|
| HRST | SRST | IRST | SCRST | | | | |

HRST Hard reset.
SRST Soft reset.
IRST Interrupt reset.
SCRST SCSI bus reset.

Interrupt Flags Register

| 7 | 6 | 5 | 4 | 3 | 2 | 1 | 0 |
|---|---|---|---|---|---|---|---|
| Any | 0 | 0 | 0 | SCRD | HACC | MBOA | MBIF |

Any Any interrupt—a logical OR of the rest of the register.
SCRD SCSI reset detected.
HACC Host adapter command complete.
MBOA Mailbox out available.

MBIF mailbox in full.

Software Interface

Following is additional information regarding the specific software implementation choices of the presently preferred embodiment. Voluminous source code for the actual specific implementation is included in application Ser. No. 07/809,452, filed Dec. 17, 1991, entitled "Disk Controller with Dynamic Sector Remapping", which has common ownership and common effective filing date with the present application, and which is hereby incorporated by reference.

Native Mode

There are three types of native commands: physical, logical and extended. Physical commands are commands that are addressed to physical drives. These bypass the logical drive engine inside DDA. Logical commands are addressed to logical drives and therefore go through DDA's logical drive engine. It is intended that only diagnostics and specialized utilities use the physical command interface and that all standard drive I/O go through logical mode. Extended commands are the last type of native commands. These consist of operations that must be performed by the controller that are not directly associated with drive I/O.

Native mode uses the BMIC mailbox registers, the BMIC semaphore registers, and the BMIC doorbell registers. The BMIC mailbox registers occupy 16 contiguous bytes in the EISA slot-specific I/O address range. The host processor (386/486) may access these registers 8, 16, or 32 bits at a time. On startup, the host software must determine the slot number containing DDA in order to know the upper nibble of the I/O address.

The BMIC mailbox is partitioned into two areas: the inbound area occupying the first 12 bytes and the outbound area occupying the last 4 bytes. BMIC semaphore 0 is used to claim rights to modify the inbound area and BMIC semaphore 1 is used to claim rights to modify the outbound area. All native mode commands use the inbound area to submit requests to DDA. DDA only allocates BMIC semaphore 1 and only releases BMIC semaphore 0. The host should only allocate BMIC semaphore 0 and only release BMIC semaphore 1. DDA will hold BMIC semaphore 0 on logical commands only when it receives a request which collides with a request already in process. Host software is obligated to avoid this situation. DDA also holds BMIC semaphore 0 on physical and extended requests since they use the inbound area for both input and output.

The doorbell mechanism of the BMIC is used to distinguish between different types of native commands. To issue a native command, the host processor uses BMIC semaphore 0 to gain ownership of the BMIC mailbox area. A BMIC semaphore is defined to be unallocated if a value of 0 is read from the flag bit. Once the host processor gains ownership of the mailbox, it writes a data structure into the BMIC mailbox and write to the BMIC local doorbell. For logical commands, the host should write a value of $0 \times 10$ to the local doorbell register. For physical commands a value of $0 \times 20$ is used and for extended commands a value of $0 \times 40$ is used. When the host receives the completion interrupt, the EISA doorbell register will indicate which command completed using the values above.

Finally, there are actually three more types of native commands: the hard reset/configuration command (doorbell value $0 \times 80$), the soft reset command (doorbell value $0 \times 80$), and foreign commands (doorbell values $0 \times 01$, $0 \times 02$, and $0 \times 04$). The reset commands are processed in the native decoder and are given their own doorbell bits. The reason for this is that software that issues the DDA hard reset command (notably the EISA CMOS initialization program) has no looping capability so it cannot play by the semaphore rules. To issue a DDA reset command, the host processor writes the reset data into the inbound area, then writes a value of $0 \times 80$ (hard) or $0 \times 80$ (soft) to the local doorbell register.

BMIC interface

The doorbell definitions are:

| | |
|---|---|
| NTV-FOREIGN1-DOORBELL | $0 \times 01$ |
| NTV-FOREIGN2-DOORBELL | $0 \times 02$ |
| NTV-FOREIGN3-DOORBELL | $0 \times 04$ |
| NTV-SRESET-DOORBELL | $0 \times 08$ |
| NTV-LOGICAL-DOORBELL | $0 \times 10$ |
| NTV-PHYSICAL-DOORBELL | $0 \times 20$ |
| NTV-EXTENDED-DOORBELL | $0 \times 40$ |
| NTV-HRESET-DOORBELL | $0 \times 80$ |

Physical Mode

The system of the presently preferred embodiment (the Dell Drive Array, or "DDA") presents to a host operating system disk drive abstractions called Composite Disk Drives. Composite Disk Drives support logical requests that range from "read" and "write" to "scatter read with holes". A Composite Disk Drive (CDD) is physically implemented using (besides the hardware and firmware in the controller) one or more physical disk drives. Thus with ten physical disk drives as illustrated in FIG. 4, two or more CDD could be formed with controller 200 controlling each of the CDDs. As an abstraction, the CDD hides many aspects of the physical drives from the host operating system. In particular, the abstraction hides, and hence prevents access to, the actual physical disk drive hardware interface.

For setup, maintenance, and diagnostic purposes, there is a need to get closer to the physical disk drive interface than is allowed through the CDD abstraction. For example, when a physical disk drive (PDD) is "new" and not yet part of a CDD, a means is needed to test the PDD and to write configuration information onto the PDD. Even when a PDD is a part of a CDD, there is a need to test the PDD and perhaps write new configuration information onto the PDD. In addition to these straightforward needs, it turns out that there is a need to access the PDD interface in order to perform drive vendor specific functions. Since these functions are vendor specific and since vendors and these functions change over time, there is strong motivation to accommodate access to these functions without changing DDA firmware.

To meet these needs, DDA has a Physical Mode Programming Interface. This interface is not normally disclosed to DDA owners or users but is used by Dell's DDADIAG program and by the DDA specific portion of the EISA Configuration program.

Synchronization of Physical Mode (PM) Commands with Logical (CDD) Commands

Physical Mode commands may be issued by the host at any time, including periods where the host is also issuing logical CDD commands. PM commands must be able to run without disturbing (other than the obvious requirement to be running only one command per drive at a time) the operation of the CDD. When a PM command is received, PM checks to see if the physical drive specified is part of a CDD. If it is not, the command is run without regard to CDD interference. If the physical disk drive specified is part of a CDD, PM synchronizes the command with the CDD driver by submitting a PHYSICAL logical request to the CDD driver. When the PHYSICAL request reaches the head of the CDD request queue, the CDD driver "executes" it. Execution of the PHYSICAL command consists primarily and simply of calling the request's Return Function, which in this case, happens to be the core PM request driver. In other words, PM gets the CDD driver to run the PM command. Synchronization is obviously ensured.

In addition to the simple single command PM/CDD synchronization above, there is a multi-command synchronization mechanism that is part of and used with the primitive PM command set. When the host wants to run only PM commands on a disk drive for a period of greater than one command or wants to use the other primitive commands, the host will issue the BEGIN_PHYS_MODE_ONLY command. When the host is ready to allow CDD commands to resume, it issues the END_PHYS_MODE_ONLY command.

When PM receives the BEGIN_PHYS_MODE_ONLY command, as with other commands, it checks to see if the physical drive specified is part of a CDD. As with other commands, if the drive specified is not part of a CDD, the command is run directly. It the drive specified is part of a CDD, PM gets the CDD driver to run the command as a PHYSICAL command return function. BPMO increments a phys_mode_only counter associated with the physical drive. It also increments a phys_mode_only counter associated with the CDD. Synchronization is attained by having the CDD driver refuse to run any commands when its phys_mode_only counter is non-zero.

Since the CDD driver will refuse to run any commands when in phys_mode_only mode, a refinement needs to be mentioned here. When PM runs a command, it does so by handling it to the CDD driver only if 1) the specified drive is part of a CDD and 2) the associated CDD is not in phys_mode_only mode.

When PM receives the END_PHYS_MODE_ONLY command, it performs the same CDD checks as with other commands. In normal operation, the associated CDD, if any, will be in phys_mode_only mode and so the EPMO command will be run directly by PM. The EPMO command decrements the phys_mode_only counter associated with the specified physical drive and decrements the phys_mode_only counter associated with the associated CDD, if any. If the EPMO command causes a CDD's phys_mode_only counter to go to zero, the CDD is obviously no longer in phys_mode_only mode. At this point, the CDD driver may have logical CDD commands queued that it has refused to run. To ensure a timely restart of the CDD, PM must issue an innocuous command to the CDD driver but only after it is no longer in phys_mode_only mode. PM does this by issuing a PHYSICAL command to the CDD driver with an innocuous return function. The technical term for this action is "Thump", as in PM "thumps" the CDD driver.

Rudimentary PM Command Set

PM's rudimentary command set consists of a number of AT task file "like" commands that are still abstract like logical CDD commands in that they do not provide for direct access to the physical disk drive interface but are closer to the physical disk drive interface nevertheless. These commands are: READ, READ with no retries, READLONG, READLONG with no retries, IDENTIFY, READBUF, WRITE, WRITE with no retries, WRITELONG, WRITELONG with no retries, FORMAT, WRITEBUF, SETBUF, SEEK, RECAL, VERIFY, VERIFY with no retries, INIT, DIAG, READMULT, WRITEMULT, SETMULT, and RESET.

Primitive PM Command Set

PM's six primitive commands are provided through a rudimentary "EXTENDED" command, although that is an arbitrary implementation detail. The BPMO and EPMO primitive commands have already been discussed. The remaining four primitive commands provide the host almost direct contact with the physical disk drive hardware interface. The ISSUE_CMD command writes host specified values to the physical disk drive's task file registers. The RETURN_STATUS command reads the physical disk drive's task file registers and returns the values to the host. The READ_DATA command reads the indicated amount of data from the disk drive's data register and returns the data to the host. The WRITE_DATA command writes the host provided data to the disk drive's data register.

With these four primitive commands, the host can perform almost all standard task file commands, and can perform any of the vendor unique commands that we are currently aware of. Standard commands that cannot be performed include READLONG and WRITELONG. In addition, access is not provided to the alternate status register, the drive address register or to the device control register and drive interrupts are not reflected to the host. These limitations could be overcome by adding primitive commands and should not be thought of as limiting the scope of this disclosure.

The PM commands are currently used to 1) enable spindle sync on the CONNER 3204F 200Meg drives and 2) to download firmware to the Maxtor LXT series drives.

Physical Commands

For physical commands, the inbound area is used for both input and output. This is done because physical commands provide more than 4 bytes of output information. Mailbox performance is not an issue for physical commands since command processing is relatively slow and synchronous inside the IDE driver anyway. The native command interface simply retains ownership of the inbound area for the duration of physical command processing and relinquishes ownership only after generating the host interrupt. Physical command input looks like:

| Host Address | Mailbox | Parameter |
|---|---|---|
| ?C90 | 10 | command byte input |
| ?C91 | 11 | drive number |
| ?C92 | 12 | transfer count |
| ?C93 | 13 | unused |
| ?C94–?C95 | 14–15 | starting cylinder |
| ?C96 | 16 | starting head |
| ?C97 | 17 | starting sector |
| ?C98–?C9B | 18–1b | linear host address |

Physical command output looks like:

| Host Address | Mailbox | Parameter |
|---|---|---|
| ?C90 | 10 | error |
| ?C91 | 11 | drive number |
| ?C92 | 12 | transfer count |
| ?C93 | 13 | status |
| ?C94–?C95 | 14–15 | starting cylinder |
| ?C96 | 16 | starting head |
| ?C97 | 17 | starting sector |
| ?C98–?C9B | 18–1b | linear host address |

Physical commands are basically the same as task file commands. The command bytes are the same as those of task file commands and the return fields reflect the register values of the physical drive on completion of the command.

Physical Command Bytes

| Command | Value | Definition |
|---|---|---|
| AT-RECAL | 0 × 10 | recalibrate command |
| AT-READ | 0 × 20 | read sector |
| AT-READL | 0 × 22 | read sector long |
| AT-READNR | 0 × 21 | read sector no retries |
| AT-READLNR | 0 × 23 | read sector long no retries |
| AT-WRITE | 0 × 30 | write sector |
| AT-WRITEL | 0 × 32 | write sector long |
| AT-WRITENR | 0 × 31 | write sector no retries |
| AT-WRITELNR | 0 × 33 | write sector long no retries |
| AT-VERIFY | 0 × 40 | read verify |
| AT-VERIFYNR | 0 × 41 | read verify no retries |
| AT-FORMAT | 0 × 50 | format track |
| AT-SEEK | 0 × 70 | seek |
| AT-DIAG | 0 × 90 | perform diagnostics |
| AT-INIT | 0 × 91 | initialize drive parameters |
| AT-READBUF | 0 × E4 | read sector buffer |
| AT-WRITEBUF | 0 × E8 | write sector buffer |
| AT-IDENTIFY | 0 × EC | identify drive |
| AT-SETBUF | 0 × EF | set buffer mode |
| AT-READM | 0 × C4 | read multiple |
| AT-WRITEM | 0 × C5 | write multiple |
| AT-SETMULT | 0 × C6 | set multiple code |

Physical Status Bytes

| Bit Name | Value | Definition |
|---|---|---|
| AT-STATUS-BUSY | 0 × 80 | drive is busy |
| AT-STATUS-DRDY | 0 × 40 | drive is ready |
| AT-STATUS-DWF | 0 × 20 | write fault |
| AT-STATUS-DSC | 0 × 10 | seek complete |
| AT-STATUS-DRQ | 0 × 08 | data request |
| AT-STATUS-CORR | 0 × 04 | correctable error |
| AT-STATUS-IDX | 0 × 02 | index pulse |
| AT-STATUS-ERR | 0 × 01 | uncorrectable error |

Physical Error Bytes

| Bit Name | Value | Definition |
|---|---|---|
| AT-ERROR-BBK | 0 × 80 | bad block found |
| AT-ERROR-UNC | 0 × 40 | uncorrectable error |
| AT-ERROR-IDNF | 0 × 10 | sector ID not found |
| AT-ERROR-TO | 0 × 08 | time out |
| AT-ERROR-ABRT | 0 × 04 | command aborted |
| AT-ERROR-TK0 | 0 × 02 | track 0 not found |
| AT-ERROR-AMNF | 0 × 01 | address mark not found |

Logical Commands

For logical commands, both the inbound and outbound areas are used. This allows DDA to complete one request while the host is submitting another. In addition, DDA has a simple mechanism for allowing multiple logical commands to be processed, although logical commands must be submitted one at a time.

Logical command input looks like:

| Host Address | Mailbox | Parameter |
|---|---|---|
| ?C90 | 10 | command byte input |
| ?C91 | 11 | drive number |
| ?C92 | 12 | transfer count |
| ?C93 | 13 | optional host request id |
| ?C94–?C97 | 14–17 | starting sector specification |
| ?C98–?C9B | 18–1b | host address specification |

Logical command output looks like:

| Host Address | Mailbox | Parameter |
|---|---|---|
| ?C9C | 1c | status |
| ?C9D | 1d | transfer count |
| ?C9E | 1e | host request id return |
| ?C9F | 1f | unused |

Starting Sector Specification

Ordinarily, the starting sector is a zero-based absolute sector number. As an alternative, a BIOS INT-13 compatible input form is provided. In this form the 32-bit number is encoded as:

| Host Address | Mailbox | Parameter |
|---|---|---|
| ?C94–?C95 | 14–15 | 8086 register CX |
| ?C96–?C97 | 16–17 | 8086 register DX | where host registers CX and DX are as they are received by BIOS INT-13. In order to use this alternate encoding, DDA must know the geometry used on the BIOS side through the native extended command NTV-SETPARM. This should be done at BIOS initialization for each logical disk. Bits 0–5 of the logical command byte are reserved for the actual logical command. Setting bit 6 of the command byte indicates to use the alternate starting sector specification.

Host Address Specification

Ordinarily, the host address is a 32-bit linear address. This is compatible with 32-bit software and 8086 real mode after segment: offset linearization. As an alternative, DDA will linearize the address for the host assuming the address is in real mode segment:offset form. In this form the 32-bit number is encoded as:

| Host Address | Mailbox | Parameter |
|---|---|---|
| ?C98-?C99 | 18-19 | 8086 register BX |
| ?C9A-?C9B | 1a-1b | 8086 register ES | where host registers BX and ES are as they are received by BIOS INT-13. In order to use this alternate encoding, the host must be in real mode. Bits 0-5 of the logical command byte are reserved for the actual logical command. Setting bit 7 of the command byte indicates to use the alternate host address specification.

Logical Command Handles

For host software which would like to submit multiple logical commands to DDA, a unique ID must be chosen for each outstanding request. The DDA extended native command NTV-GETLCSIZE may be used to determine the ID range. The host software chooses the ID, or handle, and passes it in using the fourth byte of the inbound area. When DDA is finished with the request, it will return the handle in the third byte of the outbound area. The host software is responsible for choosing handles which are not currently in use. In the event that a duplicate handle is given to DDA, DDA holds the inbound request and the inbound semaphore until the previous request completes. This insures data integrity inside DDA at the cost of making the native interface semi-synchronous. For host software that chooses not to use the feature or cannot take advantage of it, simply ignore the handle field and process one request at a time. DDA reserves the right to process input requests out of sequence, though data integrity is always insured. In other words, DDA may reorder reads, but never writes unless it would be safe to do so.

Miscellaneous Logical Commands

Several logical commands don't actually perform drive I/O. These are NTV-READBUF, NTV-WRITEBUF, NTV-READCRC, NTV-WRITECRC, and NTV-IDENTIFY.

NTV-READBUF, NTV-WRITEBUF, NTV-READCRC, and NTV-WRITECRC are used to check DMA functionality. For these commands all arguments are ignored. DDA simply sets aside a 512 byte buffer to perform the diagnostic transfers. NTV-READCRC/NTV-WRITECRC are the same as NTV-READBUF/NTV-WRITEBUF, except the first 508 bytes are crc'ed and compared to the last 32 bits. This allows the DMA controller to be tested independently in each direction.

NTV-IDENTIFY ignores all but the drive field of the input arguments. It writes a single 512 byte buffer which contains the ntvIdentify structure associated with the composite drive.

Logical Command Byte

| Command | Value | Definition |
|---|---|---|
| NTV-RECAL | 0 × 00 | recalibrate command |
| NTV-READ | 0 × 01 | read sector(s) |
| NTV-WRITE | 0 × 02 | write sector(s) |
| NTV-VERIFY | 0 × 03 | verify sector(s) |
| NTV-SEEK | 0 × 04 | seek |
| NTV-GUARDED | 0 × 05 | verify guard on sector(s) |
| NTV-READAHEAD | 0 × 06 | read sector(s) but no xfer |
| NTV-READBUF | 0 × 07 | native readbuffer diag |
| NTV-WRITEBUF | 0 × 08 | native writebuffer diag |

-continued

| Command | Value | Definition |
|---|---|---|
| NTV-WRITEVER | 0 × 09 | write and verify sector(s) |
| NTV-IDENTIFY | 0 × 0A | logical unit info command |
| NTV-READCRC | 0 × 0B | native readbuffer w/ crc |
| NTV-WRITECRC | 0 × 0C | native writebuffer w/ crc |
| NTV-READLOG | 0 × 0D | read first/next errlog entry |

Logical Status Byte

| Bit Name | Value | Definition |
|---|---|---|
| BADBLOCK | 0 × 80 | bad block found |
| UNCORECT | 0 × 40 | uncorrectable fault |
| WRITEFLT | 0 × 20 | write fault |
| IDNFOUND | 0 × 10 | sector id not found |
| CORRECT | 0 × 08 | correctable fault |
| ABORT | 0 × 04 | received abort from drive |
| TRACK0NF | 0 × 02 | track 0 not found |
| LTIMEOUT | 0 × 01 | logical drive timed out somehow |
| OK | 0 × 00 | no error |

Logical Identify Command

The logical identify command returns a structure whose definition is:

```
typedef struct
{
    ulong   totalSectors; /* total num of avail sectors */
    ushort  heads; /* logical heads */
    ushort  sectors; /* logical sectors per track */
    ushort  cylinders; /* logical cylinders available */
    ushort  pheads; /* physical heads */
    ushort  psectors; /* physical sectors per track */
    ushort  pcylinders; /* physical cylinders total */
    ushort  rcylinders; /* physical cylinders reserved */
    uchar   maxTransfer; /* largest single xfer on lu */
    uchar   multiple; /* largest single xfer on drive */
    ushort  dataBM; /* data drive bitmap */
    ushort  parityBM; /* parity drive bitmap */
    uchar   configuredType; /* mirrored, guarded, etc */
    uchar   type; /* mirrored, guarded, etc */
    uchar   pupStatus; /* powerup status of the lun */
    uchar   compSkew; /* num sectors volume */
    ulong   patchAddr; /* abs sector of patch start */
    ulong   errLogAddr; /* abs sector of errlog start */
    ulong   errLogSectors; /* num sectors in errlog area */
    ulong   numErrEvents; /* number error events logged */
    ulong   numRemapped; /* number remapped stripes */
    ulong   driveErrors[10]; /* number errors per drive */
    ulong   firmwareRev; /* firmware revision number */
    ulong   patchRev; /* patch revision number */
    uchar   EmulMode; /* AHA or AT mode */
    uchar   MaxReadAhead; /* number of sectors readahead */
    uchar   PostWrites; /* post writes enabled? */
    uchar   CacheEnabled; /* cache enabled? */
    ulong   BmicBurstSize; /* largest DMA burst in bytes */
    uchar   sourceRev[32]; /* rcs revision of source code */
} ntvIdentify;
```

Extended Commands

Like physical commands, extended commands use the inbound area for both input and output. This is done because some extended commands provide more than 4 bytes of output information. Extended commands are used to communicate configuration information between the host a DDA and perform no disk I/O. The native command interface simply retains ownership of the inbound area for the duration of extended command processing and relinquishes ownership only after generating the host interrupt.

Extended commands consist of both GET and SET instructions. GET instructions provide the host with information. SET instructions provide DDA with information. Each extended command must be individually described.

The following are the extended command enumerations:

| Command | Value | Definition |
|---|---|---|
| NTV-DIAG | 0 × 01 | perform ctlr diagnostics |
| NTV-GETVERSION | 0 × 02 | get DDA version numbers |
| NTV-GETLCSIZE | 0 × 03 | get max logical cmd handle |
| NTV-GETPHYSCFG | 0 × 04 | get physical disk config |
| NTV-SETPARM | 0 × 05 | set parms of logical disk |
| NTV-GETNUMLU | 0 × 06 | get number of logical disks |
| NTV-GETLUCAP | 0 × 07 | get capacity of logical disk |
| NTV-SYNC | 0 × 08 | wait until DDA has finished |
| NTV-PUPSTAT | 0 × 09 | status of power up |
| NTV-DORESTORE | 0 × 0a | begin restore process |
| NTV-PROGRESS | 0 × 0b | give restore progress |
| NTV-DIAGREAD | 0 × 0c | manf IDE port read |
| NTV-DIAGWRITE | 0 × 0d | manf IDE port write |
| NTV-DATETIME | 0 × 0e | set date and time |
| NTV-GETHWCFG | 0 × 0f | get hardware configuration |

The format of the mailboxes for each extended command is described below.

NTV-GETVERSION

Gets DDA firmware revision numbers.

| Direction | Mailbox Address | Definition |
|---|---|---|
| input | ?C90 | command byte input |
| output | ?C90–?C91 | DDA firmware major number |
|  | ?C92–?C93 | DDA firmware minor number |
|  | ?C94–?C97 | DDA firmware patch revision |
|  | ?C98–?C9B | DDA firmware part no. |

NTV-GETLCSIZE

Gets number of logical command handles.

| Direction | Mailbox Address | Definition |
|---|---|---|
| input | ?C90 | command byte input |
| output | ?C90 | number of logical command handles |
|  | ?C91 | max size of native S/G list |
|  | ?C92–?C93 | suggested max command queue depth |

NTV-GETPHYSCFG

Gets physical drive configuration.

| Direction | Mailbox Address | Definition |
|---|---|---|
| input | ?C90 | command byte input |
| output | ?C90–C91 | Good drive bitmap |
|  | ?C92–?C93 | Bad drive bitmap |
|  | ?C94–?C95 | Unreadable drive bitmap |

NTV-GETNUMLU

Gets number of logical drives and the emulation mode.

| Direction | Mailbox Address | Definition |
|---|---|---|
| input | ?C90 | command byte input |
| output | ?C90 | number of logical drives |
|  | ?C91 | 0 = NONE 1 = AHA 2 = AT |

NTV-GETLUCAP

Gets capacity of logical drive.

| Direction | Mailbox Address | Definition |
|---|---|---|
| input | ?C90 | command byte input |
|  | ?C91 | logical disk number |
| output | ?C90–?C93 | total capacity |
|  | ?C94 | logical geometry - heads |
|  | ?C95 | logical geometry - sectors |
|  | ?C96–?C97 | logical geometry - cylinders |
|  | ?C98–?C99 | sectors per physical track |
|  | ?C9A | physical heads |
|  | ?C9B | current status |

The status bytes returned are:

| Status | Value | Definition |
|---|---|---|
| PUP-DEAD | 0 | controller died |
| PUP-OK | 1 | normal |
| PUP-NOTCONFIG | 2 | no configuration (virgin) |
| PUP-BADCONFIG | 3 | bad drive configuration |
| PUP-RECOVER | 4 | new drive - recovery possible |
| PUP-DF-CORR | 5 | drive failed - correctable |
| PUP-DF-UNCORR | 6 | drive failed - uncorrectable |
| PUP-NODRIVES | 7 | no drives attached |
| PUP-DRIVESADDED | 8 | more drives than expected |
| PUP-MAINTAIN | 9 | maintain mode |
| PUP-MANFMODE | 10 | manufacturing mode |
| PUP-NEW | 11 | new - needs remap generated |

NTV-PUPSTAT

Controller Status

| Direction | Mailbox Address | Definition |
|---|---|---|
| input | ?C90 | command byte input |
| output | ?C90 | current overall status |

The status bytes returned are the same as for NTV-GETLUCAP described above.

NTV-PROGRESS

Get restore progress.

| Direction | Mailbox Address | Definition |
|---|---|---|
| input | ?C90 | command byte input |
| output | ?C90–?C93 | total restored so far |
|  | ?C94–?C97 | total to restore |
|  | ?C98–?C99 | restorable composite drive bitmap |

NTV-GETHWCFG

Get hardware configuration.

| Direction | Mailbox Address | Definition |
|---|---|---|
| input | ?C90 | command byte input |
| output | ?C90 | interrupt level (11,12,14,15) |
|  | ?C91 | DMA channel (0,5,6,7) |
|  | ?C92 | option ROM position (0-3) |
|  | ?C93 | DDA major number (0-3) |

| Direction | Mailbox Address | Definition |
|---|---|---|
| | ?C94–?C95 | I/O Address |
| | ?C96 | 0 = none; 1 = AHA; 2 = AT |
| | ?C97 | 32-bit emulation control |
| | ?C98 | cache: 0 = off, 1 = on |
| | ?C99 | Write Strategy: 0 = sync, 1 = writethru, 2 = writeback |

NTV-DIAG

Tells DDA to run internal diagnostics and return result.

| Direction | Mailbox Address | Definition |
|---|---|---|
| input | ?C90 | command byte input |
| output | ?C90 | completion status |

NTV-SYNC

Tells DDA to finish all outstanding I/O.

| Direction | Mailbox Address | Definition |
|---|---|---|
| input | ?C90 | command byte input |

NTV-SETPARM

Set logical drive parameters.

| Direction | Mailbox Address | Definition |
|---|---|---|
| input | ?C90 | command byte input |
| | ?C91 | drive |
| | ?C92 | heads |
| | ?C93 | sectors |
| | ?C94–?C95 | cylinders (unused) |

NTV-DORESTORE

Tells DDA to begin the drive rebuild process.

| Direction | Mailbox Address | Definition |
|---|---|---|
| input | ?C90 | command byte input |
| | ?C91 | 0: background |
| | | 1: foreground |

NTV-DATETIME

Sets DDA clock to correct date and time.

| Direction | Mailbox Address | Definition |
|---|---|---|
| input | ?C90 | command byte input |
| | ?C94–?C97 | days since January 1, 1980 |
| | ?C98–?C9B | seconds since 12:00 AM |

Native SetParm Command

```
typedef struct
{
  uchar command;
  uchar drive;
  uchar heads;
  uchar spt;
  ushort cyls;
} ntvSetParm;
```

Supported SCSI Commands

| Command | Value | Definition |
|---|---|---|
| SC-FORMAT | 0 × 04 | |
| SC-INQUIRY | 0 × 12 | |
| SC-MODE-SELECT | 0 × 15 | |
| SC-MODE-SENSE | 0 × 1a | |
| SC-MEDIA-REM | 0 × 1e | |
| SC-READ | 0 × 08 | Read block(s) |
| SC-READ-BUFFER | 0 × 3c | |
| SC-READ-CAP | 0 × 25 | |
| SC-DEFECT-DATA | 0 × 37 | |
| SC-READ-EXT | 0 × 28 | |
| SC-REASSIGN-BLK | 0 × 07 | |
| SC-RELEASE | 0 × 17 | |
| SC-REQ-SENSE | 0 × 03 | |
| SC-RESERVE | 0 × 16 | |
| SC-REZERO-UNIT | 0 × 01 | |
| SC-SEEK | 0 × 0b | |
| SC-SEEK-EXT | 0 × 2b | |
| SC-SEND-DIAG | 0 × 1d | |
| SC-START-STOP | 0 × 1b | |
| SC-TEST-UNIT | 0 × 00 | |
| SC-VERIFY | 0 × 2f | |
| SC-WRITE | 0 × 0a | |
| SC-WRITE-BUFFER | 0 × 3b | |
| SC-WRITE-EXT | 0 × 2a | |
| SC-WRITE-VERIFY | 0 × 2e | |

Error Logging

DDA has the capability of logging errors to the disk. There is a native mode interface to retrieve error log information (see section above for details). The actual information logged may be varied. Alternatives include:
For each drive error the following information is kept:
  Time and date
  Type of event
  Drives reported status and error registers
  Physical block and drive
Errors are logged for the following events:
  Drive failures
  Block remaps
Errors could potentially be logged for the following events:
  Patches applied
  Disk recover operations
  Disk retries
  Drive corrected errors
A further optional capability would allow the host can write to the error log.

DDA maintains separate logical and physical defect lists, as indicated by the firmware listed below.

Configuration Options

DDA can support any configuration of drives which can be cabled, providing the following rules are met:
  An array logical drive can consist of at most five data drives.
  A redundant logical drive can consist of at most four data drives and one parity drive.
  A mirrored logical drive can consist of at most five data drives and five parity drives.

DDA supports many options, which are chosen using the EISA configuration utility described below.

The most important option is Adaptec 1540 emulation mode (AHA mode). However, emulation can be disabled, in which case only native mode is active.

Adaptec 1540 Emulation Mode (mode AHA)

Options for this mode are:

I/O address: [330h,334h,230h,234h,130h,134h]
Interrupt Level: [11h,12h,14h,15h]
    For a DDA configured as the primary (bootable) disk controller, the interrupt level should be set to 11h.
DMA channel: DMA request channel [0,5,6,7]
AutoRequest Sense: [YES,NO]
scsiID:
boardID:
specialOptions:
fwRevByte0:
fwRevByte1:
AHA mode can address up to 7 composite drives.

Native Mode

Options for this mode are:
Interrupt Level: [11h,12h,14h,15h]
    For a DDA configured as the primary (bootable) disk controller, the interrupt level should be set to 14h.
Native mode can address all composite drives.

An additional native mode implements the currently architected SCSI command to remap a block.

Option ROM Address

The choices for this address are: C800h—CC0h—D800h—OFF. For DDA to be bootable, the Option ROM must be enabled.

Other options:
There are also several other options:
Posted-writes: Choice: [ON,OFF]; Default: OFF.

When posted writes are enabled, DDA acknowledges a successful write after finishing the DMA transfer. After signaling completion, the actual write is immediately queued for writing. DDA cannot guarantee actual completion of a write or recover from a write error—thus introducing some risk when enabling this feature. Enabling posted writes can, however, significantly improve performance, especially for guarded composite drives.
Cache: Choice: [ON,OFF]; Default: ON.

DDA implements a cache in its sector buffer pool. For a variety of reasons, the DDA cache is not useful in some environments and may be disabled to improve performance. Performance is improved under many DOS-based benchmarks and therefore the default is ON.
DMA burst size: Choice: [256,131072]; Default: 131070.

This option allows users to artificially limit the maximum EISA bus bandwidth that DDA will use. It is not clear that this option will be necessary; but for compatibility with unknown communications hardware, DDA's DMA capability may need to be artificially limited.
Maximum read-ahead size: Choice: [0,255]; Default: 16.

This specifies the maximum number of sectors DDA will read beyond a given read request when possible. This option is only enabled when the cache is enabled.
Concurrent native mode requests: Choice: [16, 32, 64, 128]; Default: 16 w/emulation, 64 w/out emulation.

This specifies the total number concurrent requests that can be submitted to DDA through the native mode interface. For BIOS purposes this number may be small, but in the event native mode drivers are developed for a multi-tasking environment, this number should be set large. Each request consumes 48 bytes of DDA memory.

Further Modifications and Variations

The preferred embodiments may be modified in many ways while retaining one or more of the claimed innovative features, and the corresponding advantages. It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course, the specific components used are merely illustrative. For example, a different CPU chip, or multiple chips, or multiple CPUs can be used instead in alternative embodiments.

For another example, it is contemplated that in future product generations controller 100 would also provide a sorting of the queue of requests from the host for access to the array and if two or more requests involve close proximity sectors (which may imply close track locations on the disk drive platters), then controller 100 combines such requests into a single request for contiguous sector access but with data transfers only on the appropriate sectors. That is, this effectively caches the intervening sectors and immediately subsequent requests from the host frequently involve the data on these initially omitted sectors. Such combination of requests increases data transfer speed by reading/writing the data with limited read/write head seeks. Note that the operating system for the host may put pending requests into an elevator queue and automatically combine requests with close logical locations.

It is also contemplated that, in future drive array controllers, head scheduling algorithms can be added for further optimization of request quenes.

It should also be noted that some, but not all, of the innovative teachings disclosed in the present application can be advantageously applied to more conventional disk controllers, or at least to controllers which do not control a composite disk drive. Others of the inventions may be applicable only to a redundant disk array, and not to other types of disk array or composite disk drive. Others of the inventions may be less advantageously applicable to a single disk array than to a composite disk drive, and/or may be most advantageously applicable only to a redundant disk array, but less advantageously applicable to other types of disk array or composite disk drive.

For example, the dual defect lists described above would merely reduce to a single defect list if adapted to a single-drive controller. Thus, the teachings disclosed above on this topic appear to be inapplicable to single-disk controllers.

For another example, the teachings disclosed above regarding dynamic read minimization is applicable to redundant disk arrays, but not to other types of array.

For another example, the teachings disclosed above regarding request fragmentation would be much less advantageous in an environment which did not use composite drives.

For another example, the teachings disclosed above regarding scatter/scatter transfer operations are perfectly applicable to single-disk controllers as well as to composite drives.

For another example, the teachings disclosed above regarding the physical mode of the controller would not be applicable to most single-disk applications, but could be advantageous (though less so than to disk arrays) in some single-disk configurations. For example, these teachings might be useful in a system in which the user data block startes at an offset address after a reserved system block, or in a system in which the disk is partitioned among multiple user data areas, or in a system where the disk controller is emulating a non-native disk interface, or for pass-through to a non-disk device (e.g. a tape drive).

For another example, the teachings disclosed above regarding the improved readahead strategy are perfectly well applicable to a single-disk controller.

For another example, the teachings disclosed above regarding periodic activation of physical drives provides an improved channel for error status to propagate upward, and may be useful in other multilevel disk interface architectures (e.g. if another layer were added to the interface). Alternatively, these teachings can even be generalized to apply to multilayer architectures for interfacing to non-disk physical devices of other types.

A further contemplated alternative, which was removed from the firmware of the presently preferred embodiment, is permuted addressing. In this alternative embodiment, the SRAM (and/or DRAM) is aliased into three different address spaces: Normal addressing—which works as expected; Permuted High addressing—which sends the low sixteen bits of a word to the address accessed, and the high 16 bits of the word to the address accessed with address bit 9 inverted; and Permuted Low addressing—which sends the high sixteen bits of a word to the address accessed, and the low 16 bits of the word to the address accessed with address bit 9 inverted, and address bits 2 and 3 incremented. That is, processor 208 can read 16 bits from each of two drives at once and get the result into one 32 bit register. This word consists however of data from two different sectors. Permuted addressing is provided so that in a single store the processor can write two halfwords into two different buffers which are separated by 512 bytes, or the length of a sector. There is no halfword swapper on the data bus, and so address bit 1 does not change on permuted accesses. To get this to work, one of the drives has to be read as a single device to get the track buffer pointers displaced in the two drives.

As will be recognized by those skilled in the art, the innovative concepts described in the present application can be modified and varied over a tremendous range of applications, and accordingly the scope of patented subject matter is not limited by any of the specific exemplary teachings given.

What is claimed is:
1. A method of operating one or more disk drives through a programmable disk drive controller which is interfaced through a bus to a host computer, comprising the steps of:
   (a) occasionally issuing access requests from said host computer to said disk drive controller;
   (b) maintaining a queue, in said disk drive controller, for said access requests;
   (c) analyzing any newly received access requests, in said disk drive controller, to ascertain whether said access request is atomic; and, if said access request is not atomic, then fragmenting said access request into smaller access requests, until no resulting access request is not atomic;
   (d) enqueuing atomic access requests into said queue, together with execution-control markers which indicate groups of atomic operations which must be executed in strict sequence;
   (e) executing atomic access requests from said queue in an order which, except as constrained by said execution-control markers, is dynamically optimized in accordance with the instantaneous rotational phase of said disk drives.

2. The method of claim 1, wherein elements of said queue can include fence markers, and said controller, when processing said queue, accepts said fence markers as processing flow control commands.

3. The method of claim 1, wherein said controller processes said queue iteratively until all elements of said queue are atomic.

4. A method of operating one or more disk drives through a programmable disk drive controller which is interfaced through a bus to a host computer, comprising the steps of:
   (a) occasionally issuing access requests from said host computer to said disk drive controller;
   (b) maintaining a queue, in said disk drive controller, for said access requests;
   (c) analyzing any newly received access requests, in said disk drive controller, to ascertain whether said access request is atomic; and, if said access request is not atomic, then fragmenting said access request into smaller access requests, until no resulting access request is not atomic;
   (d) enqueuing atomic access requests into said queue, together with execution-control markers which indicate groups of atomic operations which must be executed in strict sequence;
   (e) executing atomic access requests from said queue in an order which, except as constrained by said execution-control markers, is dynamically optimized in accordance with the instantaneous rotational phase of said disk drives;
   (f) when said controller detects an error condition during execution of an access request, then inserting one or more error handling requests into said queue, and servicing said error handling requests before servicing any further access requests;
   (g) returning said redesignated access request to its original designation.

5. A method of redundant memory access request execution, comprising the steps of:
   (a) providing a queue for access requests to a memory;
   (b) redesignating an access request when said access request detects a defect in said memory;
   (c) inserting error handling requests in said queue prior to said redesignated access request;
   (d) executing said error handling requests; and
   (e) returning said redesignated access request to its original designation.

6. A disk drive controller, comprising, on a common circuit board:
   a microprocessor;
   random-access memory which is read/write accessible by said microprocessor;
   a bus interface circuit, connected to said microprocessor and to a system bus connector;

multiple connections for cabling to multiple separate disk drives;

wherein said microprocessor comprises:

means for maintaining a queue, in said disk drive controller, for access requests received;

means for analyzing any newly received access requests, in said disk drive controller, to ascertain whether said access request is atomic; and, if said access request is not atomic, then fragmenting said access request into smaller access requests, until no resulting access request is not atomic;

means for enqueuing atomic access requests into said queue, together with execution-control markers which indicate groups of atomic operations which must be executed in strict sequence;

means for executing atomic access requests from said queue in an order which, except as constrained by said execution-control markers, is dynamically optimized in accordance with the instantaneous rotational phase of said disk drives.

7. The controller of claim 6, wherein elements of said queue can include fence markers, and said controller, when processing said queue, accepts said fence markers as processing flow control commands.

8. The controller of claim 6, wherein said controller processes said queue iteratively until all elements of said queue are atomic.

9. The controller of claim 6, wherein each of said disk drives includes multiple rotating platters accessed by multiple respective movable read/write heads.

10. The controller of claim 6, wherein multiple ones of said disk drives include high-level integrated control electronics.

11. The controller of claim 6, wherein multiple ones of said disk drives include control electronics which implement a first remapping of defective sectors, and said first remapping is invisible to said controller.

12. The controller of claim 6, wherein multiple ones of said disk drives are IDE drives.

13. The controller of claim 6, wherein each of said disk drives includes multiple rotating platters accessed by multiple respective movable read/write heads, and wherein said movable heads of multiple ones of said disk drives move in synchrony to corresponding positions.

14. The controller of claim 6, wherein each of said disk drives includes multiple rotating platters accessed by multiple respective movable read/write heads, and wherein said movable heads of a first subset of ones of said disk drives move in synchrony to mutually corresponding positions, and said movable heads of a second subset of ones of said disk drives do not move in synchrony with heads of said drives of said first subset.

15. The controller of claim 6, wherein each of said drives includes multiple rotating platters accessed by multiple respective movable read/write heads, and wherein said controller is connected to access both first and second pluralities of said disk drives, and wherein said movable heads of a first subset of ones of said disk drives move in synchrony to mutually corresponding positions, and said movable heads of a second subset of ones of said disk drives do not move in synchrony with heads of said drives of said first subset, and said controller is connected to a system bus and presents an interface thereto whereby said drives of said first subset, but not said drives of said second subset, appear as a single composite disk drive.

16. The controller of claim 6, wherein each of said drives includes multiple rotating platters accessed by multiple respective movable read/write heads, and wherein said movable heads of a first subset of ones of said disk drives move in synchrony to mutually corresponding positions, and said movable heads of a second subset of ones of said disk drives do not move in synchrony with heads of said drives of said first subset.

17. The controller of claim 6, wherein said controller includes a microcontroller and a bus interface chip separate from said microcontroller.

18. The controller of claim 6, wherein said controller includes a bus-master interface chip.

19. The controller of claim 6, wherein said controller consists of multiple integrated circuits mounted on a single circuit board, and said controller includes multiple connections for cabling to ones of said drives.

20. The controller of claim 6, wherein said controller includes one or more connections which can each be connected to multiple ones of said drives in a daisy-chain configuration.

21. The controller of claim 6, wherein said controller includes analog signal interface connections for cabling to ones of said drives.

22. The controller of claim 6, wherein said disks each have integrated controllers which remap defective sectors invisibly to said disk drive controller.

23. The controller of claim 6, wherein said microprocessor is a microcontroller.

* * * * *